United States Patent [19]

Kawada et al.

[11] Patent Number: 4,910,107

[45] Date of Patent: Mar. 20, 1990

[54] OPTICAL RECORDING-REPRODUCING METHOD AND DEVICE BY USING THE SAME

[75] Inventors: Haruki Kawada; Hiroshi Matsuda, both of Atsugi; Takashi Nakagiri, Tokyo; Yoshinori Tomida, Atsugi; Kenji Saito, Tokyo; Toshiaki Kimura, Sagamihara; Toshihiko Miyazaki; Ken Eguchi, both of Atsugi; Yukuo Nishimura, Sagamihara; Kunihiro Sakai, Yamato, all of Japan

[73] Assignee: Canon Kabushiki Kaisha, Tokyo, Japan

[21] Appl. No.: 370,113

[22] Filed: Jun. 23, 1989

Related U.S. Application Data

[63] Continuation of Ser. No. 941,361, Dec. 15, 1986, abandoned.

[30] Foreign Application Priority Data

| Dec. 16, 1985 | [JP] | Japan | 60-282212 |
|---|---|---|---|
| Dec. 16, 1985 | [JP] | Japan | 60-282216 |
| Jan. 8, 1986 | [JP] | Japan | 60-676 |
| Jan. 8, 1986 | [JP] | Japan | 60-677 |
| Jan. 9, 1986 | [JP] | Japan | 61-1333 |
| Jan. 9, 1986 | [JP] | Japan | 61-1334 |
| Jan. 21, 1986 | [JP] | Japan | 61-8940 |
| Jan. 21, 1986 | [JP] | Japan | 61-8941 |
| Jan. 29, 1986 | [JP] | Japan | 61-15860 |
| Jan. 29, 1986 | [JP] | Japan | 61-15861 |

[51] Int. Cl.$^4$ .................... G03C 5/00; G03C 11/00
[52] U.S. Cl. .................... 430/21; 430/944; 430/945; 430/495; 430/494; 430/273; 430/286; 430/327; 430/926; 346/135.1; 346/76 L; 369/284; 369/285
[58] Field of Search ............ 430/944, 945, 495, 494, 430/21, 273, 286, 327, 926; 346/135.1, 76 L; 369/284, 285

[56] References Cited

U.S. PATENT DOCUMENTS

| 3,723,121 | 3/1973 | Hauser | 430/945 X |
|---|---|---|---|
| 3,772,028 | 11/1973 | Fico et al. | 430/495 |
| 4,215,208 | 7/1980 | Yee et al. | 526/285 |
| 4,439,514 | 3/1984 | Garito | 430/272 |
| 4,536,450 | 8/1985 | Garito | 428/411.1 |
| 4,562,141 | 12/1985 | Tieke | 430/281 |
| 4,678,736 | 7/1987 | Hanamura et al. | 430/945 X |

OTHER PUBLICATIONS

"Irradiate" in *The American Heritage Dictionary*, second College Edition, Houghton Mifflin Company, Boston, MA 02108, 1982, p. 678.

*Primary Examiner*—Paul R. Michl
*Assistant Examiner*—Cynthia Hamilton
*Attorney, Agent, or Firm*—Fitzpatrick, Cella, Harper & Scinto

[57] ABSTRACT

An optical recording-reproducing method comprising the step of irradiating a radiation for polymerization on an optical recording medium having a recording layer containing at least one selected from the group consisting of azulenium salt compounds, pyrylium dyes, diene compounds, croconic methine dyes and polymethine compounds (hereinafter called the group B) and a diacetylene derivative compound; the step of irradiating a radiation corresponding to a recording information to thereby change the color at the irradiated portion of the recording layer; and the step of reading the recorded information by irradiating a reading light with a shorter wavelength than said radiation on said recording layer. Also, an optical recording-reproducing device utilizes the above-mentioned method.

38 Claims, 2 Drawing Sheets

FIG. I

OPTICAL RECORDING-REPRODUCING METHOD AND DEVICE BY USING THE SAME

This application is a continuation of application Ser. No. 941,361 filed Dec. 15, 1986, now abandoned.

BACKGROUND OF THE INVENTION

1. Field of the Invention

This invention relates to an optical recording-reproducing method for an optical recording medium containing a monomolecular film of a diacetylene derivative compound or its built-up film, particularly to an optical recording-reproducing method employing an IR-ray laser of 800–900 nm as the optical writing means and a visible light of 500–750 nm as the optical recording-reading means and to a device by using the same.

2. Description of the Related Art

Recently, optical discs are to the fore of interest among office automations. Since optical discs are capable of recording and storing a large amount of documents and literature in one sheet, documents in an office can be pigeonholed or managed with good efficiency. Various recording media have been investigated for such an optical disc, and those utilizing organic materials are attracting attention because of low price and easiness in manufacture.

As such an organic material for recording medium, a diacetylene derivative compound has been known and a recording technique employing said compound for a laser recording medium by utilizing the thermal color change property of said compound is disclosed in Japanese Patent Laid-Open No. 14780/1981. However, in this specification, there is no description about what kind of laser has been employed or has to be used, but there is only a description that recording was performed by use of a laser.

The present inventors have investigated about laser recording of the diacetylene derivative compound by use of various kinds of laser and consequently confirmed that, while thermal color change recording may be feasible by use of a laser scale and high output laser such as argon laser, etc., no laser recording is practicable when a semiconductor laser of small model and relatively low output (wavelength: 800 to 850 nm) was used. However, a practical recording medium of an optical disc, etc. is desired to have a capability of optical writing with a semiconductor laser of small model and low output, and of reading with an emission diode or a laser of small model.

Further, the recording layer of this recording medium comprises the diacetylene derivative compound as described above, fine crystalline powder of which is dispersed in a binder, and hence the molecules of the diacetylene derivative compound are randomly oriented within the recording layer, whereby such inconveniences may be caused that light absorptivity or reflectivity may differ and the degree of the chemical reactions may vary depending on the position on the medium. Thus, it cannot necessarily be suitable for high density recording.

SUMMARY OF THE INVENTION

The present invention has been accomplished for solving the problems of the prior art as described above, and an object of the present invention is to provide an optical recording-reproducing (reading) method capable of optical writing with a small scale and light weight semiconductor laser and capable of reading by photo-irradiation with a small scale and light weight visible light emitter.

Another object of the present invention is to provide an optical recording-reproducing method which enables high speed recording at high density, high sensitivity and high resolution and also high speed, high precision reading.

Still another object of the present invention is to provide an optical recording-reproducing method which can give optically recorded images having excellent stability and high quality.

According to a first aspect of the present invention, there is provided an optical recording-reproducing method comprising:

the step of irradiating a radiation for polymerization on an optical recording medium having a recording layer containing at least one selected from the group consisting of azulenium salt compounds, pyrylium dyes, diene compounds, croconic methine dyes and polymethine compounds (hereinafter called the group B), and a diacetylene derivative compound;

the step of irradiating a radiation corresponding to a recording information to thereby change the color at the irradiated portion of the recording layer; and the step of reading the recorded information by irradiating a reading light with a shorter wavelength than said radiation on said recording layer.

According to a second aspect of the present invention, there is provided an optical recording-reproducing method comprising:

the step of irradiating a radiation corresponding to a recording information on an optical recording medium having a recording layer containing at least one selected from the group consisting of azulenium salt compounds, pyrylium dyes, diene compounds, croconic methine dyes and polymethine compounds and a polydiacetylene derivative compound to thereby change the color at the irradiated portion of the recording layer; and the step of reading the recording information by irradiating a reading light with a shorter wavelength than said radiation on said recording layer.

According to a third aspect of the present invention, there is provided an optical recording-reproducing device comprising:

a means for irradiating a radiation for polymerization on an optical recording medium having a recording layer containing at least one selected from the group consisting of azulenium salt compounds, pyrylium dyes, diene compounds, croconic methine dyes and polymethine compounds, and a diacetylene derivative compound, a means for irradiating a radiation corresponding to a recording information to thereby change the irradiated portion of the recording layer; and a means for reading the recorded information by irradiating a reading light with a shorter wavelength than said radiation on said recording layer.

According to a fourth aspect of the present invention, there is provided an optical recording-reproducing device comprising:

a means for irradiating a radiation corresponding to a recording information on an optical recording medium having a recording layer containing at least one selected from the group consisting of azulenium salt compounds, pyrylium dyes, diene compounds, croconic methine dyes and polymethine compounds, and a polydiacetylene derivative compound, to thereby change the color at the irradiated portion of the recording layer; and a means for reading the recorded information by irradiating a reading light with a shorter wavelength than said radiation on said recording layer.

According to a fifth aspect of the present invention, there is provided an optical recording-reproducing device, comprising a semiconductor laser as the writing means for irradiating a radiation corresponding to a recording information on an optical recording medium and an emission diode as the means for reproducing (reading) the recorded information from said optical recording medium.

DETAILED DESCRIPTION OF THE PREFERRED EMBODIMENTS

Figure 1:
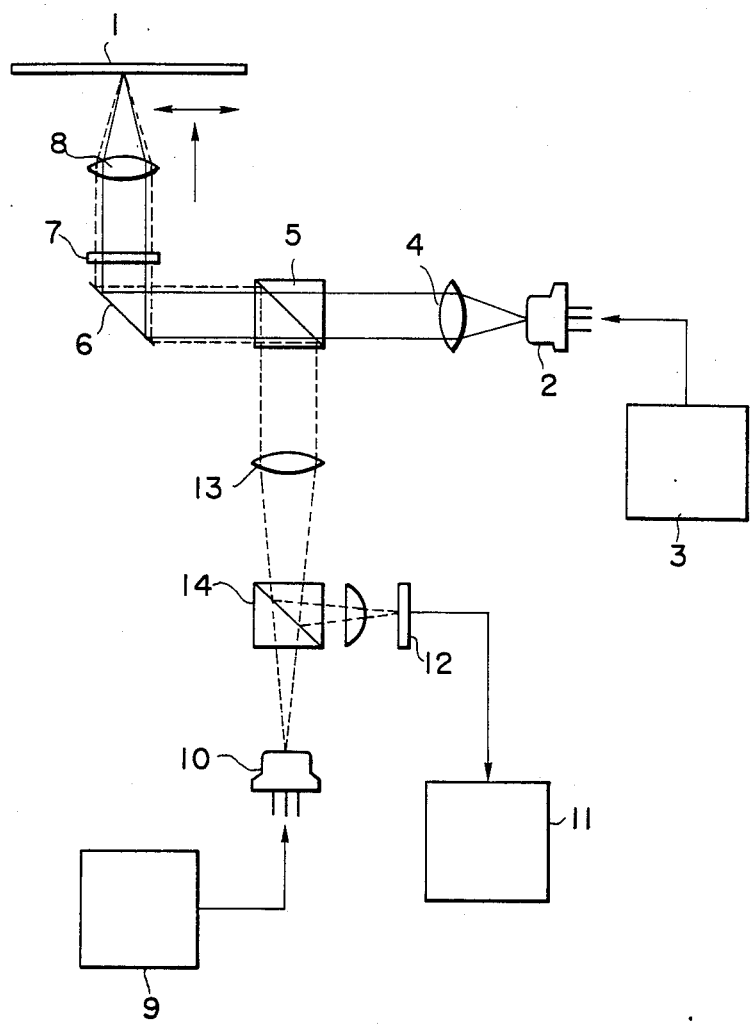
FIG. 1 is a schematic illustration showing one example of a recording device to be used for the optical recording-reproducing method of the present invention.

The optical recording-reproducing method of the present invention is a method comprising the steps of irradiating a radiation for polymerization on an optical recording medium having a recording layer containing at least one selected from the group consisting of azulenium salt compounds, pyrylium dyes, diene compounds, croconic methine dyes and polymethine compounds (hereinafter called the group B), and a diacetylene derivative compound, irradiating a radiation corresponding to a recording information to thereby change the color at the irradiated portion of the recording layer, and reading the recorded information by irradiating a reading light with a shorter wavelength than said radiation on said recording layer.

In the case of using an optical recording medium containing a polydiacetylene derivative compound, the method may start from the step of irradiating the radiation corresponding to a recording information.

The diacetylene derivative compound having a hydrophilic site and a hydrophobic site in combination to be used in the present invention (hereinafter called briefly DA compound) is a compound capable of 1,4-addition polymerization reaction btween the C≡C—C≡C functional groups in the adjacent molecules, and may typically include the compounds represented by the following formula:

$$R-C\equiv C-C\equiv C-R' \qquad (I)$$

(wherein R and R' each represent alkyl group, olefinic hydrocarbon group such as vinyl, vinylidene, ethynyl, etc., phenyl, fused polycyclic aromatic hydrocarbon group such as naphthyl, anthranyl, etc., chain polycyclic phenyl group such as biphenyly, terphenyl, etc., other non-polar group, carboxyl group and its metal salt or amine salt, sulfonic acid group and its metal salt or amine salt, sulfoamide group, amide group, amino group, imino group, hydroxy group, quaternary ammonium group, oxyamino group, diazonium group, guanidine group, hydrazine group, phosphoric acid group, silicic acid group, aluminic acid group, nitrile group, thioalcoholic group, other polar groups, etc.)

The polydiacetylene derivative compound is obtained by polymerization of the diacetylene derivative represented by the above formula and it is generally contained in the optical recording medium in the form of a DA compound during manufacture of optical recording medium,' and polymerized by irradiation of UV-ray prior to practicing recording and then provided for recording.

On the other hand, the azulenium salt compounds which have the frame represented by the following formula(II) (hereinafter called briefly AZ compounds) are compounds having absorption spectral peak in the wavelength region of 750 nm or longer and generate heat by infrared light of this wavelength.

Formula:

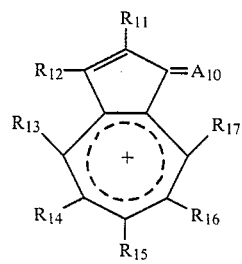

(II)

wherein $R_{11}$–$R_{17}$ each represent hydrogen atom, halogen atom or monovalent organic radical and $A_{10}$ represents divalent organic residue bonded through a double bond.

The above AZ compounds including the above formula (II) can be classified broadly into the three kinds as shown below.

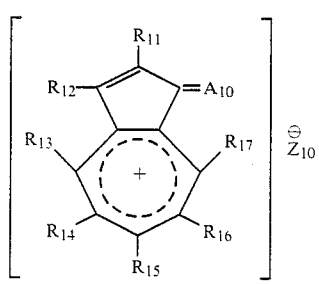

1-1

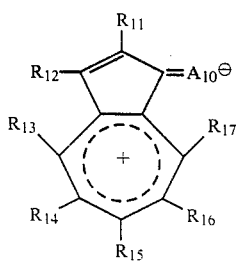

1-2

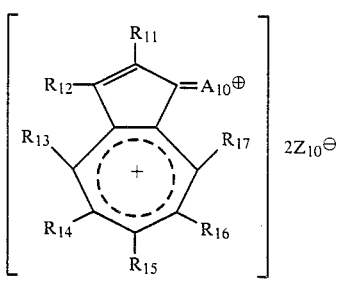

1-3

In the compound shown by the formulae 1-1 to 1-3, each of $R_{11}$ to $R_{17}$ represents a hydrogen atom, a halogen atom or a monovalent organic radical.

Examples of the monovalent organic radical may include alkyl, alkoxy, substituted or unsubstituted aryl, acyl, substituted or unsubstituted amino, nitro, hydroxy, carboxy, cyano or substituted or unsubstituted arylazo radicals.

$A_{10}$ represents a divalent organic radical bonded through a double bond as shown in the following specific examples.

$Z_{10}^{\ominus}$ represents an anionic radical such as perchlorate, fluoroborate, p-toluenesulfonate, periodide, chloride, bromide or iodide.

Specific examples of the AZ compounds to be used in the present invention are set forth below.

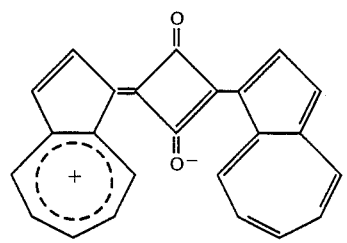

1-1-1

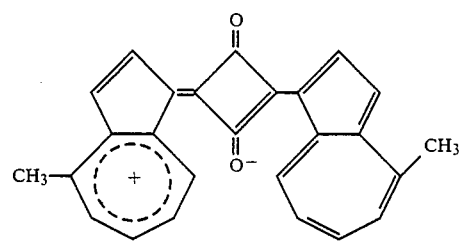

1-1-2

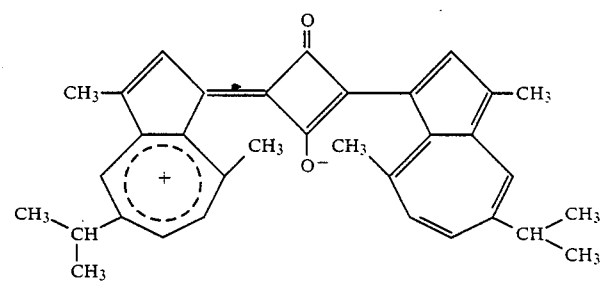

1-1-3

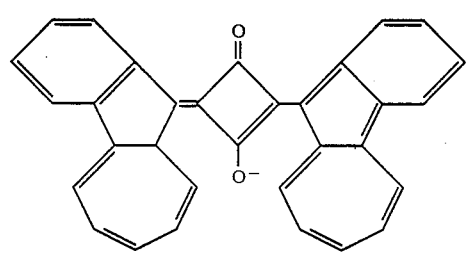

1-1-4

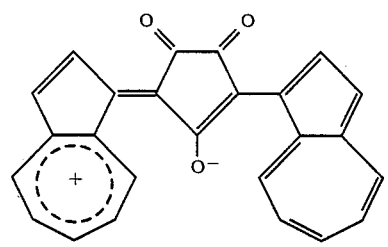

1-1-5

-continued
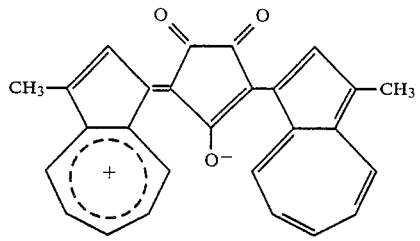
1-1-6
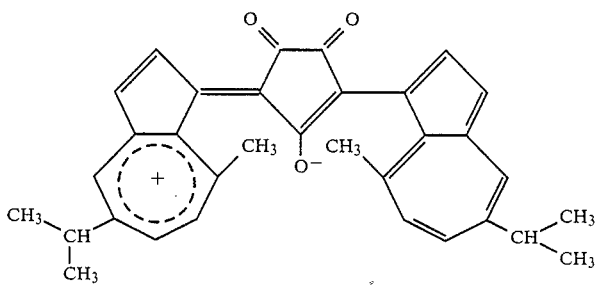
1-1-7
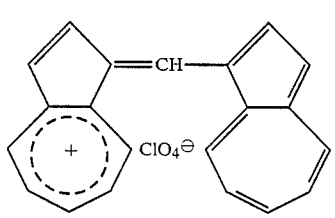
1-1-8
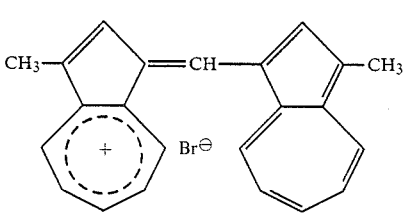
1-1-9
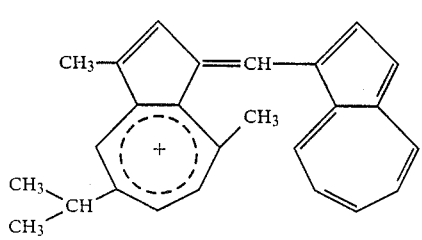
1-1-10
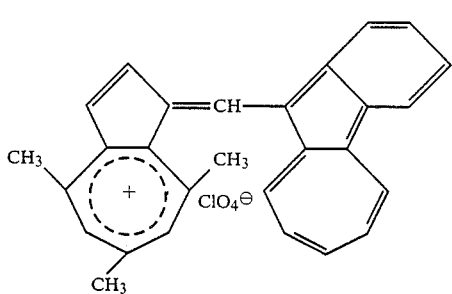
1-1-11

-continued
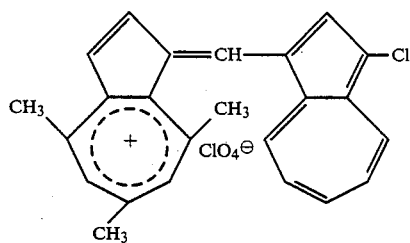
1-1-12
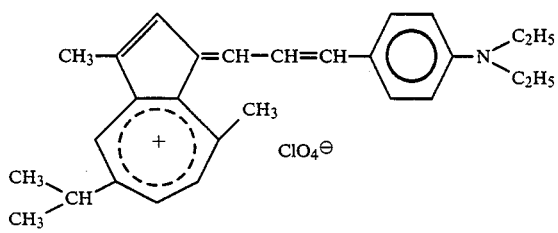
1-1-13
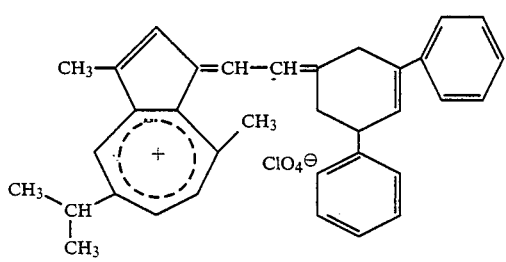
1-1-14
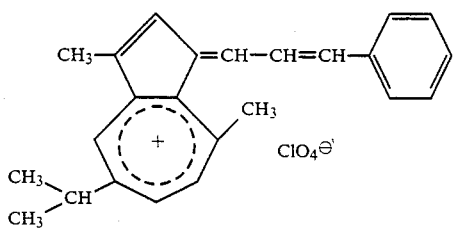
1-1-15
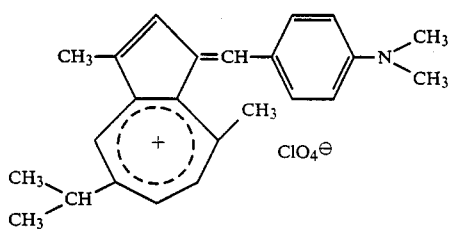
1-1-16
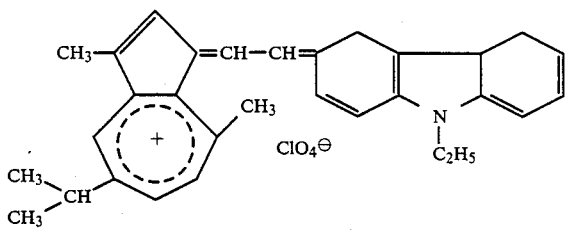
1-1-17

-continued 1-1-18

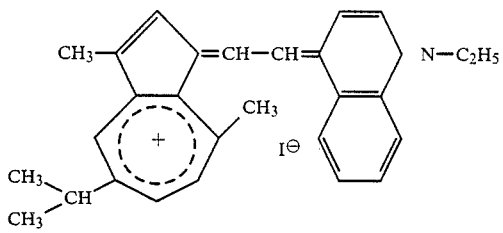

The pyrylium dyes, thiopyrylium dyes and selenapyrylium dyes (hereinafter called generally pyrylium dyes) are compounds represented by the following basic structure, having absorption peak at 780–900 nm, which can generate heat by infrared rays of this wavelength:

Basic structure:

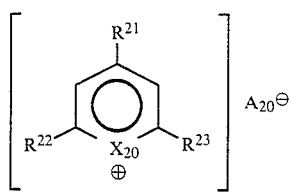

(wherein $X_{20}$ represents an oxygen atom, a sulfur atom or selenium atom, $R^{21}$, $R^{22}$ and $R^{23}$ represent various organic radicals and $A_{20}$ represents an anion). Typical examples of the pyrylium dyes are represented by the following formulae 2-1 to 2-3:

(wherein $R^{24}$, $R^{25}$, $R^{26}$ and $R^{27}$ represent substituted or unsubstituted aryl radicals such as phenyl, tolyl, xylyl, chlorophenyl, methoxyphenyl and the like, or substituted or unsubstituted heterocyclic radicals such as 2-pyridyl, 3-pyridyl, 2-furyl, 2-thienyl, 2-thiazolyl, 3-carbazolyl, 2-quinolyl, 3-quinolyl, 2-imidazolyl, 2-lepidyl, 3-methoxy-2-pyridyl, 6-methyl-2-pyridyl, 4,5-dimethyl-2-thiazolyl, 4,5-diphenyl-2-thiazolyl, 4-phenyl-2-thiazolyl, 9-ethyl-3-carbazolyl, and the like, at least one of $R^{24}$, $R^{25}$, $R^{26}$ and $R^{27}$ representing substituted or unsubstituted heterocyclic radical; $R^{28}$ represents a hydrogen atom, an alkyl such as methyl, ethyl, propyl, butyl, etc., or substituted or unsubstituted aryl radical such as phenyl, tolyl, xylyl, chlorophenyl, methoxyphenyl, etc.; $R^{29}$ represents methyl or ethyl; $X^{21}$ and $X^{22}$ represent oxygen atom, sulfur atom or selenium atom; $A_{20}$ represents an anion such as chloride, bromide, iodide, perchlorate, benzenesulfonate, p-toluenesulfonate, methylsulfate, ethylsulfate, propylsulfate, etc.).

Specific examples of these pyrylium dyes are set forth below. For the purpose of convenience, anions were represented all by perchlorates.

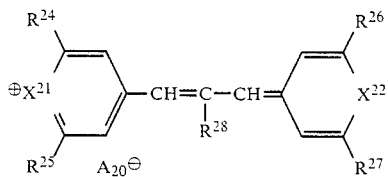

Formula 2-1

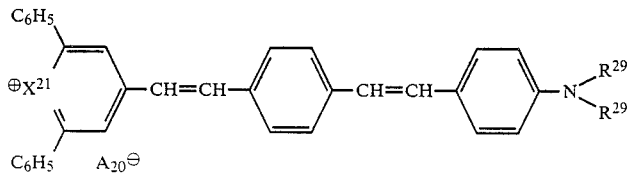

Formula 2-2

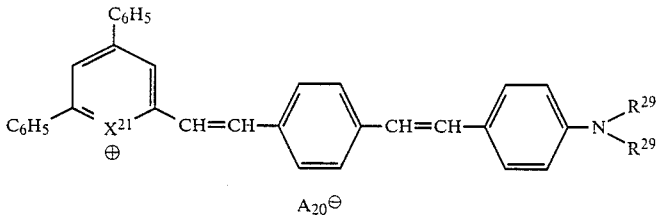

Formula 2-3

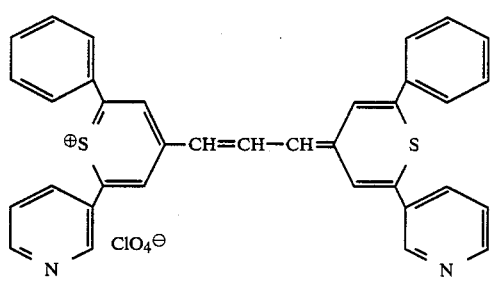
2-1-1
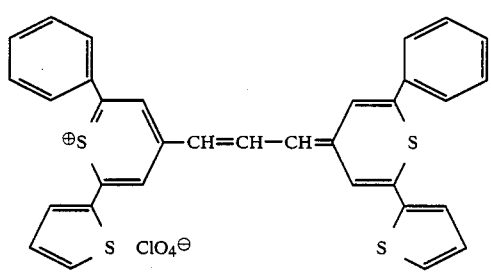
2-1-2
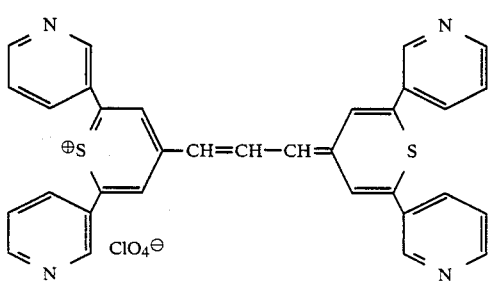
2-1-3
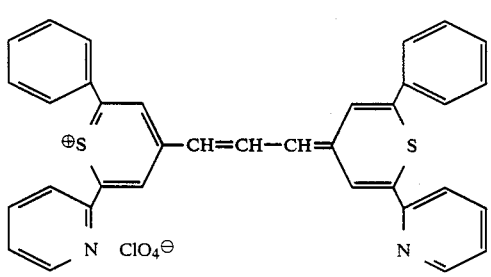
2-1-4
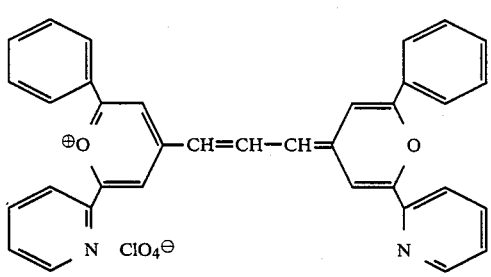
2-1-5

-continued
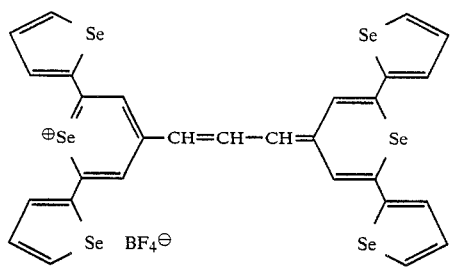
2-1-6
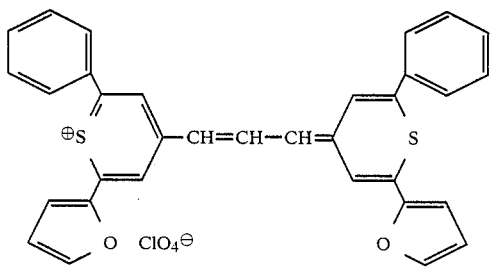
2-1-7
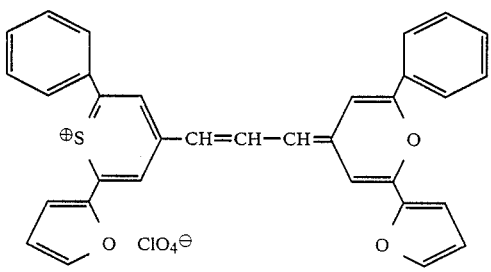
2-1-8
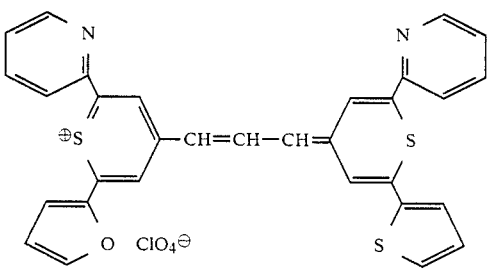
2-1-9
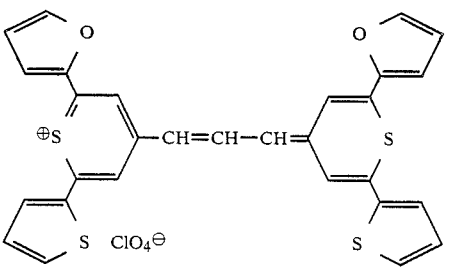
2-1-10
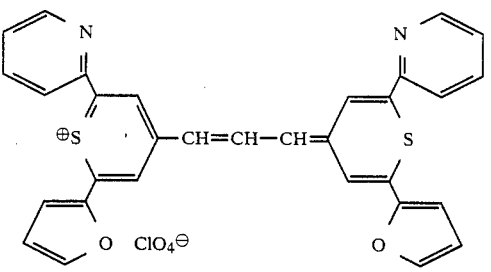
2-1-11

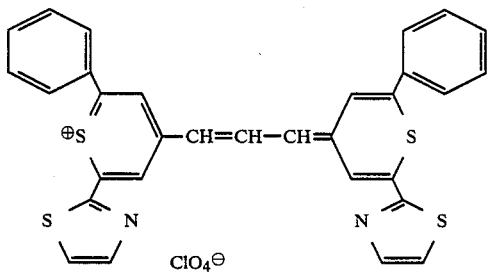

2-1-12

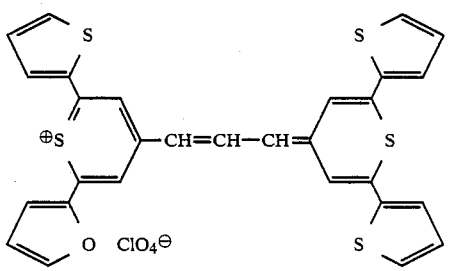

2-1-13

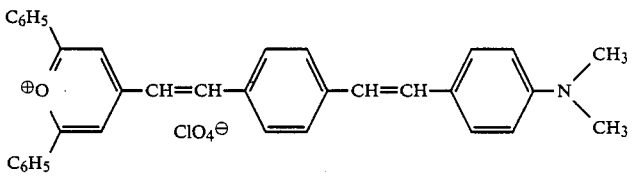

2-1-14

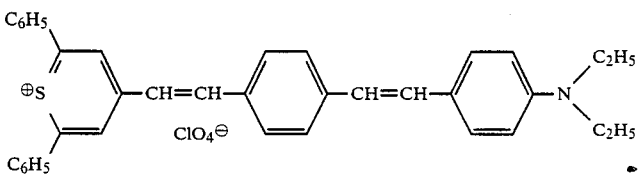

2-1-15

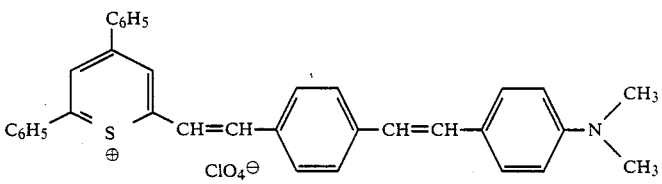

2-1-16

The above diene compound salts to be used in the present invention are compounds having absorption peak in the wavelength region of 750 nm or longer which can generate heat by infrared ray of this wavelength, as represented by the following formula 3-1 or 3-2:

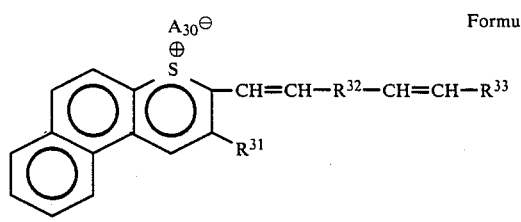

Formula 3-1

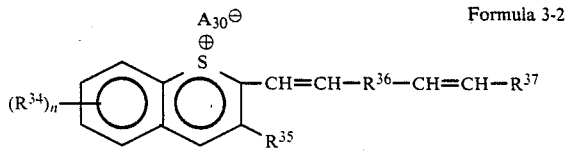

Formula 3-2

(wherein $R^{31}$ represents alkyl group, phenyl group or styryl group which may have substituent; $R^{32}$ and $R^{36}$ represent arylene group which may have substituent and can form a conjugated double bond system together with the two —CH=CH— groups adjacent thereto; $R^{33}$ and $R^{37}$ represent phenyl group or naphthyl group which may have substituent; $R^{34}$ represents alkoxy group; $R^{35}$ represents alkyl group; and $A_{30}$ represents anion radical).

To describe in more detail about the diene compound salts, in the formulae 3-1 and 3-2, $R^{31}$ represents an alkyl radical such as methyl, ethyl, propyl, isopropyl, butyl, hexyl, etc., or a phenyl radical or a styryl radical which may have substituent. Here, examples of the substituent may include alkoxy radicals such as methoxy, ethoxy, butoxy, etc.; halogen atoms such as chlorine, bromine, iodine, etc.; alkyl radicals such as methyl, ethyl, propyl, isopropyl, etc.; and nitro radical. $R^{32}$ and $R^{36}$ each represent an arylene radical which may have substituent and can form a conjugated double bond system with the two —CH=CH— groups adjacent thereto such as p-phenylene, 1,4-naphthylene, etc. Here, examples of the substituent may include halogen aotms such as chlorine, bromine, iodide, etc.; alkyl radicals such as methyl, ethyl, etc.; and alkoxy radicals such as methoxy, ethoxy, etc. $R^{33}$ and $R^{37}$ each represent a phenyl radical or a naphthyl radical which may have substituent. Examples of the substituent may include substituted amino radicals such as dimethylamino, diethylamino, dipropylamino, dibutylamino, diphenylamino, phenylamino, phenylbenzylamino, phenylethylamino, etc.; cyclic amino radical such as morpholino, piperidinyl, pyrrolidino, etc.; and alkoxy radical such as methoxy, ethoxy, butoxy, etc. $R^{34}$ represents an alkoxy radical such as methoxy, ethoxy, butoxy, etc. $R^{35}$ represents an alkyl radical such as methyl, ethyl, propyl, isopropyl, butyl, hexyl, etc.

$A_{30}^{\ominus}$ represents an anion residue, including for example:

$BF_4^{\ominus}$, $ClO_5^{\ominus}$, $CF_3COO^{\ominus}$, $PF_6^{\ominus}$, $Cl^{\ominus}$, $Br^{\ominus}$, $I^{\ominus}$, $ClSO_3^{\ominus}$, $CH_3SO_3^{\ominus}$, $C_2H_5SO_3^{\ominus}$, $C_3H_7SO_3^{\ominus}$, $C_4H_9SO_3^{\ominus}$, $C_5H_{11}SO_3^{\ominus}$, $C_6H_{13}SO_3^{\ominus}$, $CH_3CHClSO_3^{\ominus}$, $ClCH_2CH_2SO_3^{\ominus}$,

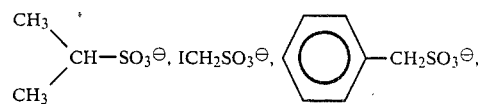

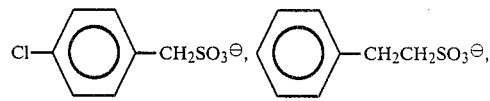

$^{\ominus}O_3SCH_2SO_3^{\ominus}$, $^{\ominus}O_3SCH_2CH_2SO_3^{\ominus}$, $^{\ominus}O_3SCH_2CH_3—CH_2SO_3^{\ominus}$, $^{\ominus}O_3SCH_2CH_2CH_2SO_3^{\ominus}$, $^{\ominus}O_3SCH_2CH_2CH_2CH_2CH_2CH_2SO_3^{\ominus}$, $^{\ominus}O_3SCH_2CH_2—O—CH_2CH_2SO_3^{\ominus}$,

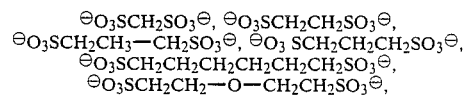

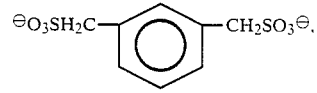

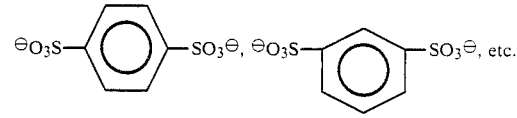

Specific examples of the diene compounds are shown below.

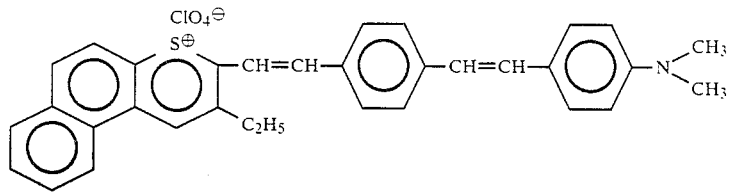

3-1-1

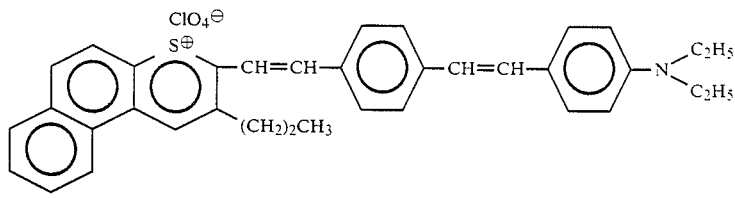

3-1-2

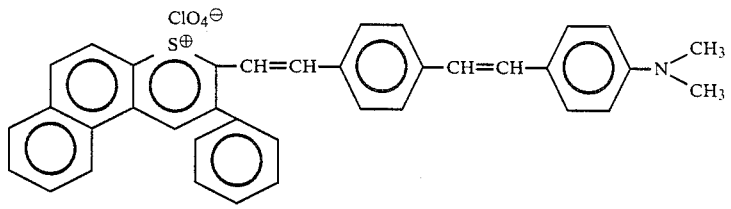

3-1-3

-continued
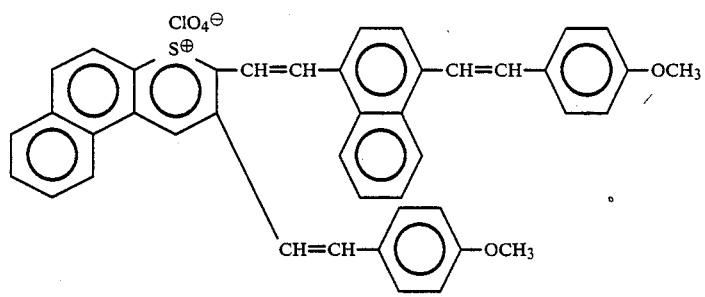
3-1-4
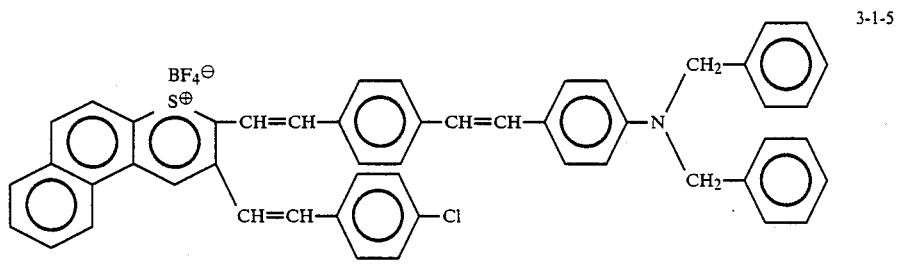
3-1-5
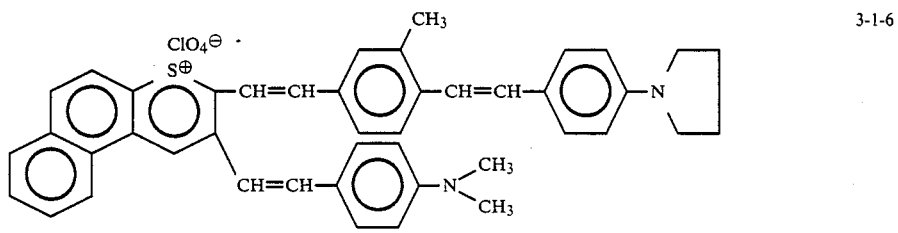
3-1-6
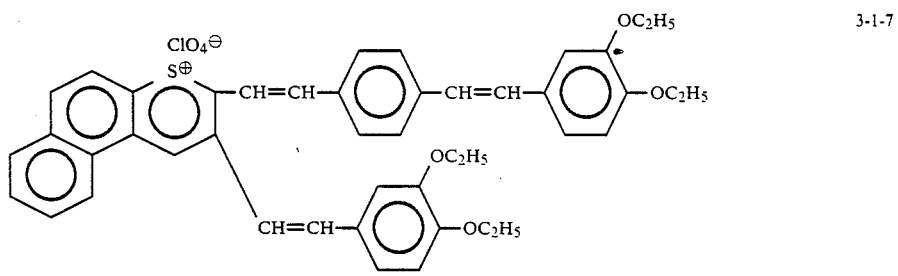
3-1-7
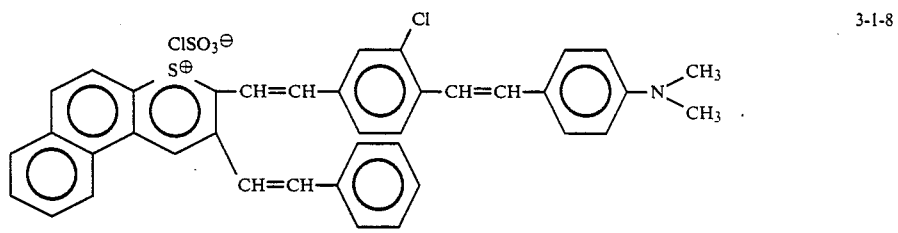
3-1-8
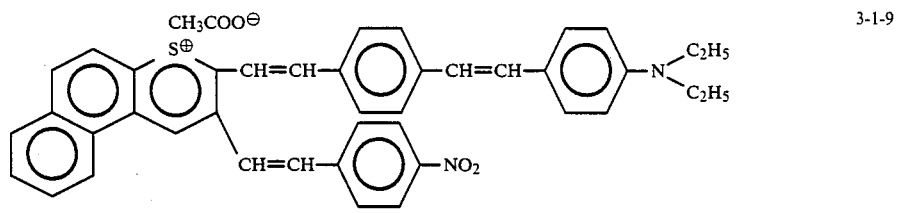
3-1-9

-continued
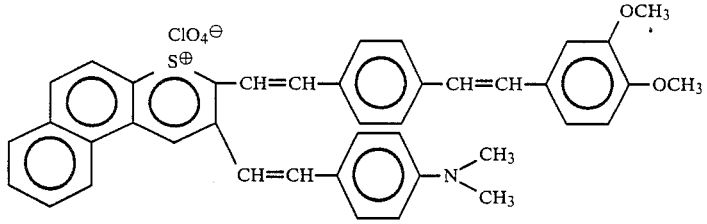 3-1-10
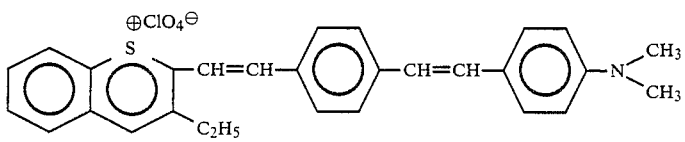 3-1-11
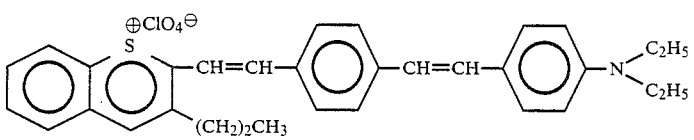 3-1-12
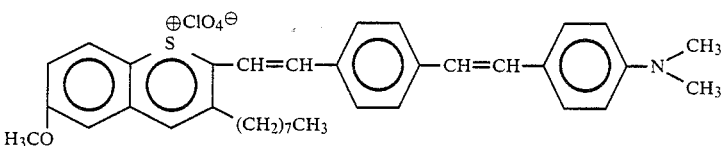 3-1-13
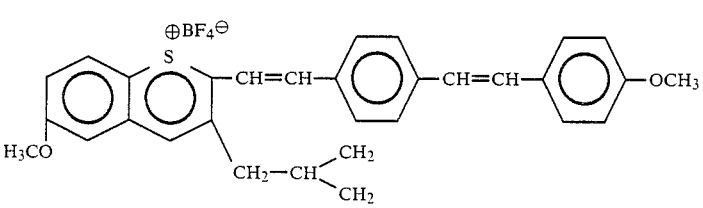 3-1-14
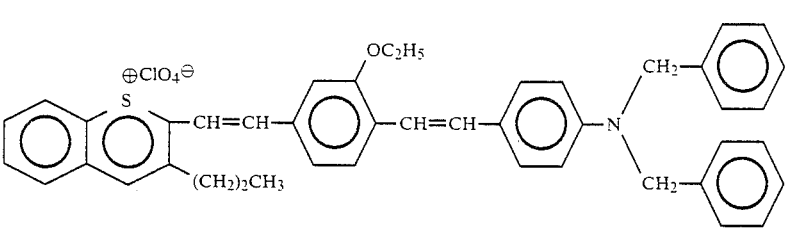 3-1-15
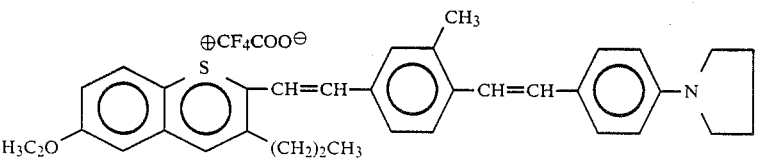 3-1-6
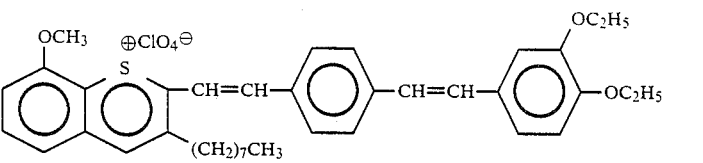 3-1-17
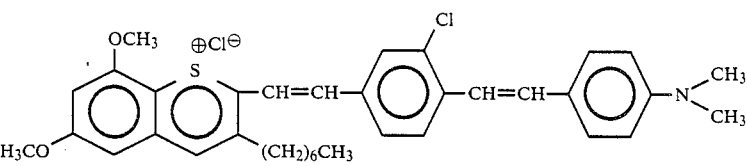 3-1-18

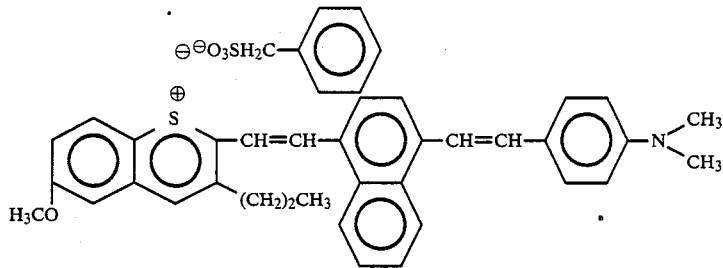

3-1-19

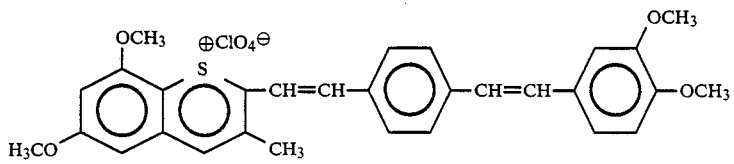

3-1-20

The above croconic methine dyes to be used in the present invention are compounds having the following basic structure (including intramolecular salts), having an absorption peak at 800 to 900 nm, which can generate heat by infrared ray of this wavelength:

Typical examples of the croconic methine dyes may include the dyes represented by the following formulae 4-1 to 4-4.

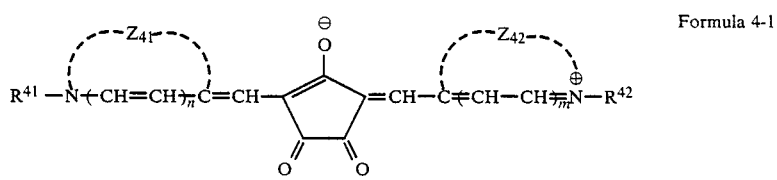

Formula 4-1

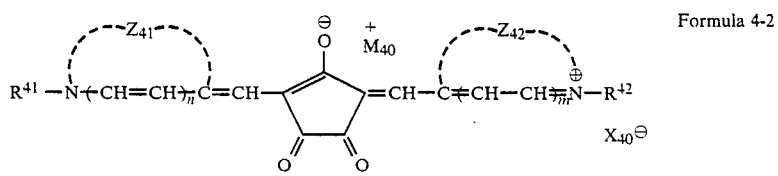

Formula 4-2

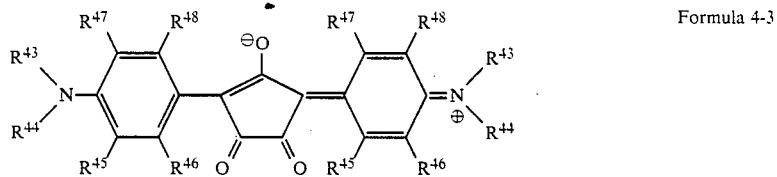

Formula 4-3

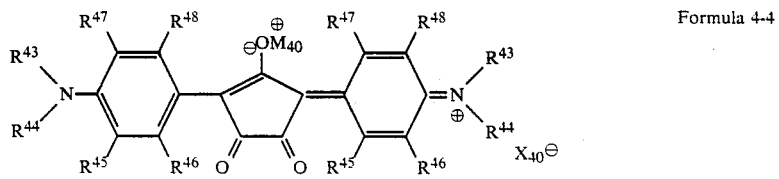

Formula 4-4

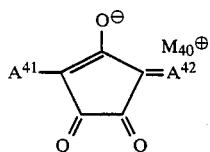

$M_{40}^{\oplus}$: as hereinafter described,
$A^{41}$, $A^{42}$: substituent containing aromatic ring and/or heterocyclic ring.

In the above formulae, $R^{41}$ and $R^{42}$ each represent an alkyl radical (e.g. methyl, ethyl, n-propyl), isopropyl, n-butyl, sec-butyl, isobutyl, t-butyl, n-amyl, t-amyl, n-hexyl, n-octyl, t-octyl, etc.), a substituted alkyl radical (e.g. 2-hydroxyethyl, 3-hydroxypropyl, 4-hydroxybutyl, 2-acetoxyethyl, carboxymethyl, 2-carboxyethyl, 3-carboxypropyl, 2-sulfoethyl, 3-sulfopropyl, 4-sulfobutyl, 3-sulfatopropyl, 4-sulfatobutyl, N-(methylsulfonyl)-carbamylmethyl, 3-(acetylsulfamyl)propyl, 4-(acetylsulfamyl)butyl, etc.), a cyclic alkyl radical (e.g. cyclohexyl, etc.), an allyl group ($CH_2=CH-CH_2-$), and aralkyl radical (e.g. benzyl, phenethyl, α-naphthylmethyl, β-naphthylmethyl, etc.), a substituted aralkyl radical (e.g. carboxybenzyl, sulfobenzyl, hydroxybenzyl, etc.), an aryl radical (e.g. phenyl, etc.) or a substituted aryl radical (e.g. carboxyphenyl, sulfophenyl, hydroxyphenyl, etc.). Particularly, in the present invention, of these organic radicals, hydrophobic ones are preferred.

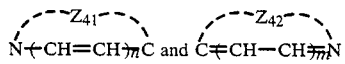

each represent a group of non-metallic atoms necessary for completing a substituted or unsubstituted heterocyclic ring such as a nucleus of thiazole series (e.g. thiazole, 4-methylthiazole, 4-phenylthiazole, 5-methylthiazole, 5-phenylthiazole, 4,5-dimethylthiazole, 4,5-diphenylthiazole, 4-(2-thienyl)-thiazole, etc.), a nucleus of benzothiazole series (e.g. benzothiazole, 5-chlorobenzothiazole, 5-methylbenzothiazole, 6-methylbenzothiazole, 5,6-dimethylbenzothiazole, 5-bromobenzothiazole, 5-phenylbenzothiazole, 5-methoxybenzothiazole, 6-methoxybenzothiazole, 5,6-dimethoxybenzothiazole, 5,6-dioxymethylenebenzothiazole, 5-hydroxybenzothiazole, 6-hydroxybenzothiazole, 4,5,6,7-tetrahydrobenzothiazole, etc.), a nucleus of naphthothiazole series (e.g. naphtho[2,1-d]thiazole, naphtho[1,2-d]thiazole, 5-methoxynaphtho[1,2-d]thiazole, 5-ethoxynaphtho[1,2-d]thiazole, 8-methoxynaphtho[2,1,-d]thiazole, 7-methoxynaphtho[2,1-d]thiazole, etc.), a nucleus of thionaphthene[7,6-d]thiazole series (e.g. 7-methoxythionaphthene[7,6-d]thiazole), a nucleus of oxazole series (e.g. 4-methyloxazole, 5-methyloxazole, 4-phenyloxazole, 4,5-diphenyloxazole, 4-ethyloxazole, 4,5-dimethyloxazole, 5-phenyloxazole), a nucleus of benzoxazole series (e.g. benzoxazole, 5-chlorobenzoxazole, 5-methylbenzoxazole, 5-phenylbenzoxazole, 6-methylbenzoxazole, 5,6-dimethylbenzoxazole, 5-methoxybenzoxazole, 6-methoxybenzoxazole, 5-hydroxybenzoxazole, 6-hydroxybenzoxazole, etc.), a nucleus of naphthoxazole series (e.g. naphtho[2,1-d]oxazole, naphtho[1,2-d]oxazole, etc.), a nucleus of selenazole series (e.g. 4-methylselenazole, 4-phenylselenazole, etc.), a nucleus of benzoselenazole series (e.g. benzoselenazole, 5-chlorobenzoselenazole, 5-methylbenzoselenazole, 5,6-dimethylbenzoselenazole, 5-methoxybenzoselenazole, 5-methyl-6-methoxybenzoselenazole, 5,6-dioxymethylenebenzoselenazole, 5-hydroxybenzoselenazole, 4,5,6,7-tetrahydrobenzoselenazole, etc.), a nucleus of naphthoselenazole series (e.g. naphtho[2,1-d]selenazole, naphtho[1,2-d]selenazole), a nucleus of thiazoline series (e.g. thiazoline, 4-methylthiazoline, 4-hydroxymethyl-4-methylthiazoline, 4,4-bis-hydroxymethylthiazoline, etc.), a nucleus of oxazoline series (e.g. oxazoline), a nucleus of selenazoline series (e.g. selenazoline), a nucleus of 2-quinoline series (e.g. quinoline, 6-methylquinoline, 6-chloroquinoline, 6-methoxyquinoline, 6-ethoxyquinoline, 6-hydroxyquinoline), a nucleus of 4-quinoline series (e.g. quinoline, 6-methoxyquinoline, 7-methylquinoline, 8-methylquinoline), a nucleus of 1-isoquinoline series (e.g. isoquinoline, 3,4-dihydroisoquinoline), a nucleus of 3-isoquinoline series (e.g. isoquinoline), a nucleus of 3,3-dialkylindolenine series (e.g., 3,3-dimethylindolenine, 3,3-dimethyl-5-chloroindolenine, 3,3,5-trimethylindolenine, 3,3,7-trimethylindolenine), a nucleus of pyridine series (e.g. pyridine, 5-methylpyridine), or a nucleus of benzimidazole series (e.g. 1-ethyl-5,6-dichlorobenzimidazole, 1-hydroxyethyl-5,6-dichlorobenzimidazole, 1-ethyl-5-chlorobenzimidazole, 1-ethyl-5,6-dibromobenzimidazole, 1-ethyl-5-phenylbenzimidazole, 1-ethyl-5-fluorobenzimidazole, 1-ethyl-5-cyanobenzimidazole, 1-($\beta$-acetoxyethyl)-5-cyanobenzimidazole, 1-ethyl-5-chloro-6-cyanobenzimidazole, 1-ethyl-5-fluoro-6-cyanobenzimidazole, 1-ethyl-5-acetylbenzimidazole, 1-ethyl-5-carboxybenzimidazole, 1-ethyl-5-ethoxycarbonylbenzimidazole, 1-ethyl-5-sulfamylbenzimidazole, 1-ethyl-5-N-ethylsulfamylbenzimidazole, 1-ethyl-5,6-difluorobenzimidazole, 1-ethyl-5,6-dicyanobenzimidazole, 1-ethyl-5-ethylsulfonylbenzimidazole, 1-ethyl-5-methylsulfonylbenzimidazole, 1-ethyl-5-trifluoromethylbenzimidazole, 1-ethyl-5-trifluoromethylsulfonylbenzimidazole, 1-ethyl-5-trifluoromethylsulfinylbenzimidazole, etc.).

$R^{43}$ and $R^{44}$ each represents an alkyl radical such as methyl, ethyl, propyl, butyl, etc. $R^{43}$ and $R^{44}$ can also form a ring such as morpholino, piperidinyl, pyrrolidino, etc., together with the nitrogen atom. $R^{45}$, $R^{46}$, $R^{47}$ and $R^{48}$ each represent a hydrogen atom, an alkyl radical (methyl, ethyl, propyl, butyl, etc.), an alkoxy radical (methoxy, ethoxy, propoxy, butoxy, etc.) or a hydroxy radical. Also, $R^{45}$ and $R^{46}$ can be bonded to form a benzene ring, and further $R^{45}$ and $R^{46}$, and $R^{47}$ and $R^{48}$ may be bonded to each other, respectively, to form a benzene ring.

$X_{40}^{\ominus}$ represents an anion such as ions of chloride, bromide, iodide, perchlorate, benzenesulfonate, p-toluenesulfonate, methylsulfate, ethylsulfate, propylsulfate, etc., with proviso that no $X_{40}^{\ominus}$ exists when $R^{41}$ and (or $R^{42}$ itself contains an anion group such as $-SO_3^{\ominus}$, $-OSO_3^{\ominus}$, $-COO^{\ominus}$, $SO_2^{\ominus}NH-$, $-SO_2-N^{\ominus}-CO-$, and $-SO_2-N^{\ominus}-SO_2-$.

$M_{40}^{\oplus}$ represents a cation such as hydrogen, sodium, ammonium, potassium, pyridium cation, etc. n and m are 0 or 1.

In the following, typical examples of the croconic methin dyes to be used in the present invention are enumerated. For the purpose of convenience, they are represented by betaine structures of the formula 4-1 or 4-3. However, in preparation of these tyes, mixtures of dyes in the betaine form or salt form are obtained, and therefore they are generally frequently used as mixtures.

Typical examples of the formulae 4-1, and 4-2;

4-1-1

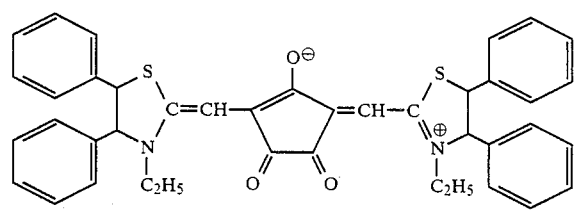

-continued
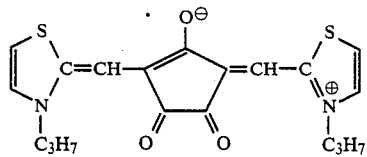
4-1-2
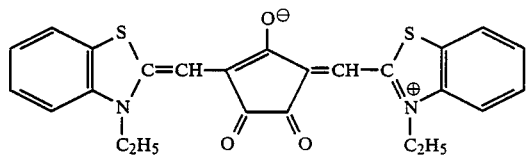
4-1-3
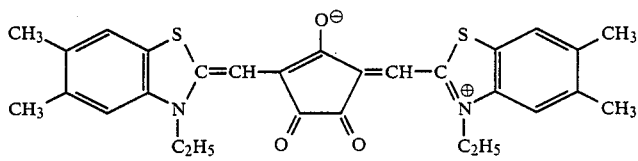
4-1-4
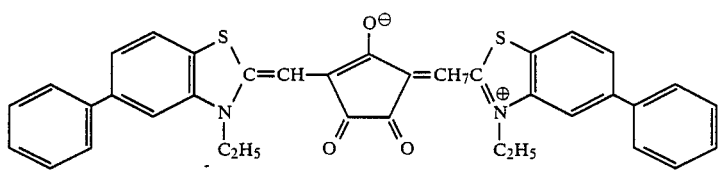
4-1-5
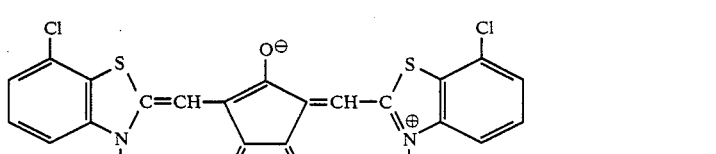
4-1-6
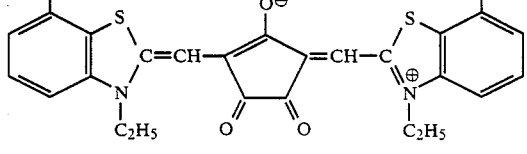
4-1-7
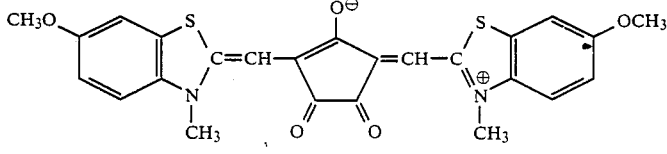
4-1-8
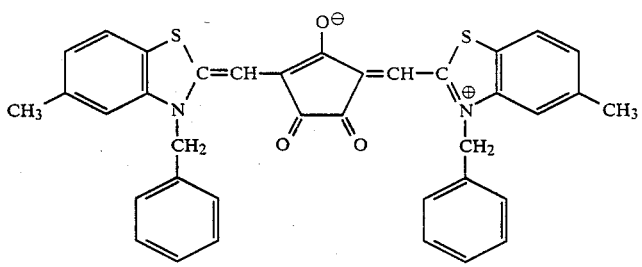
4-1-9
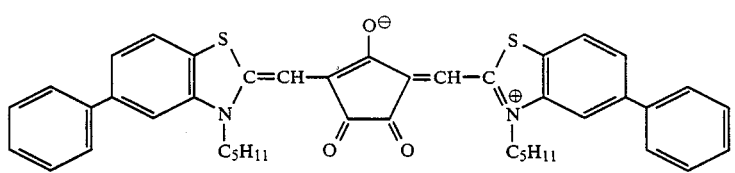
4-1-10
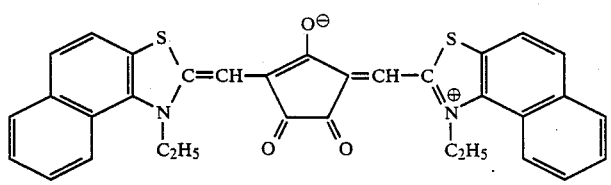

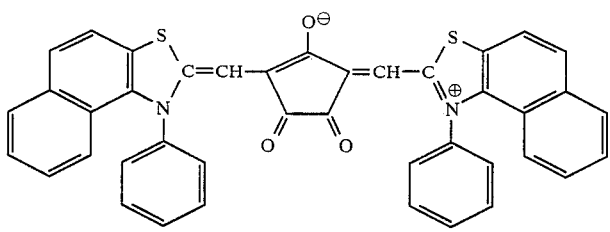
4-1-11
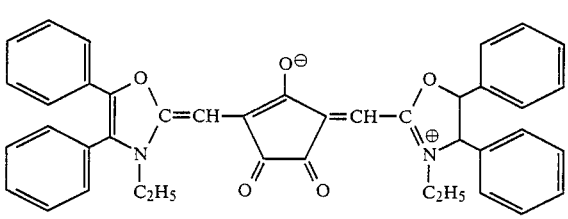
4-1-12
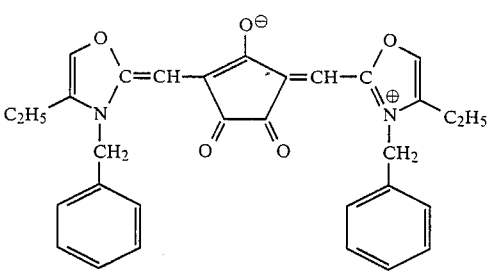
4-1-13
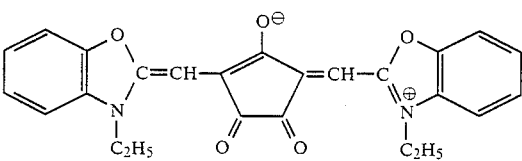
4-1-14
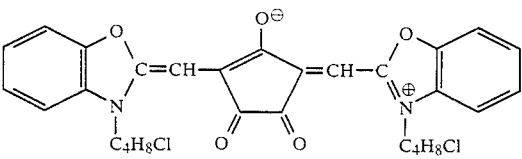
4-1-15
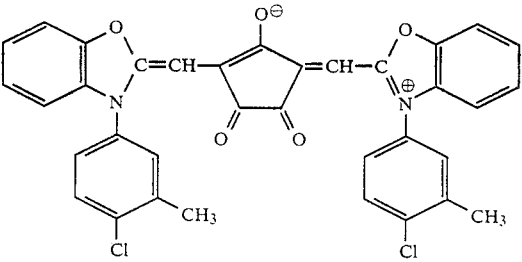
4-1-16
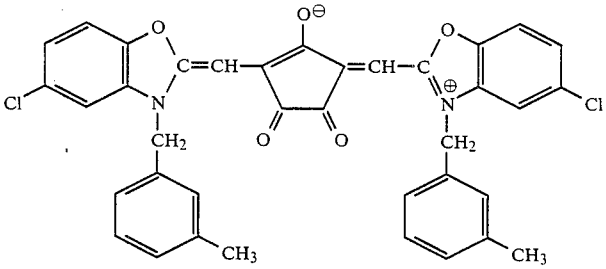
4-1-17

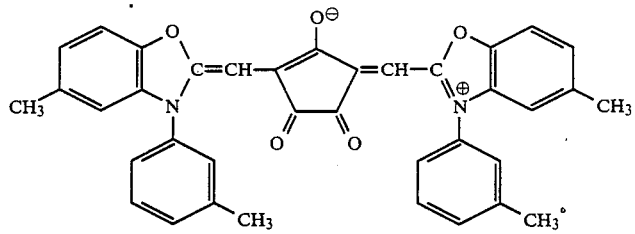
4-1-18
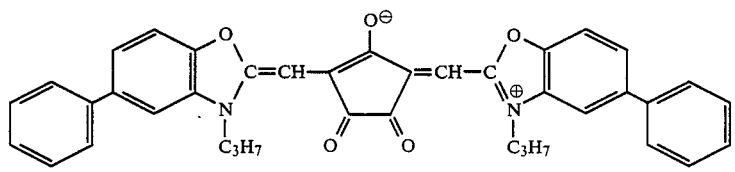
4-1-19
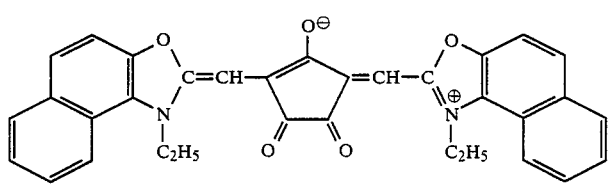
4-1-20
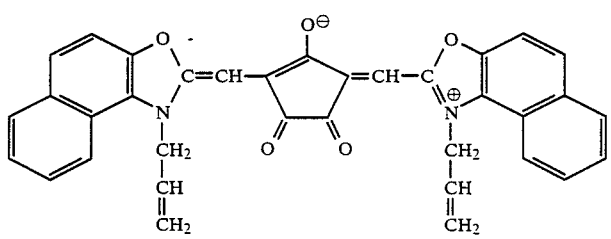
4-1-21
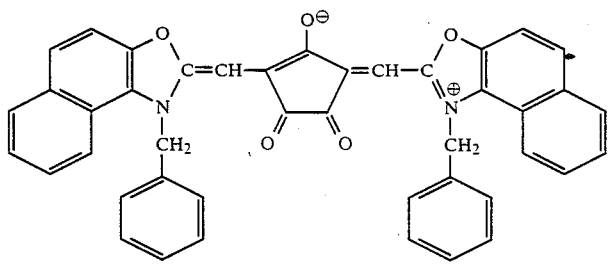
4-1-22
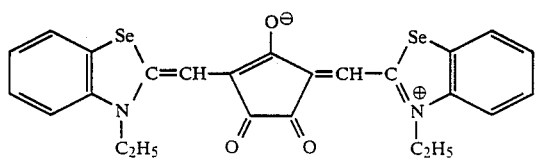
4-1-23
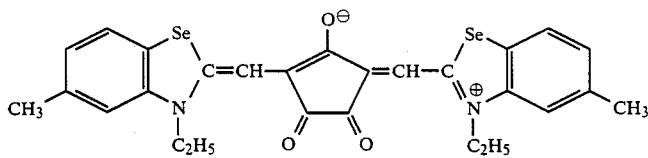
4-1-24
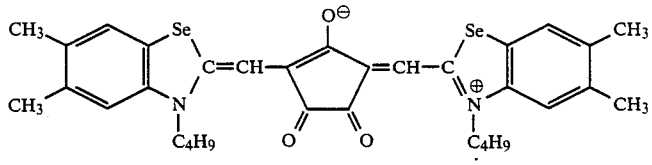
4-1-25

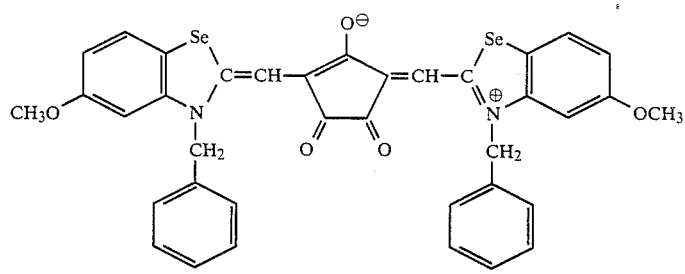
4-1-26
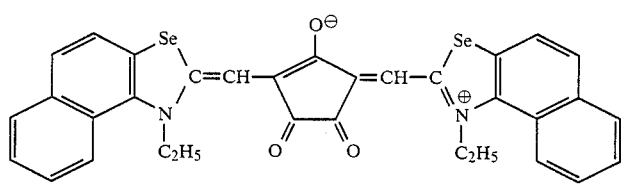
4-1-27
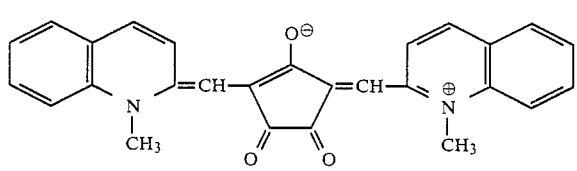
4-1-28
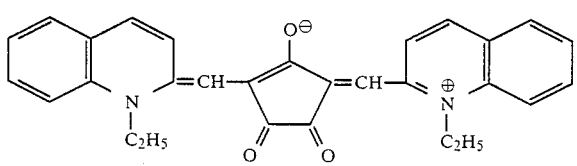
4-1-29
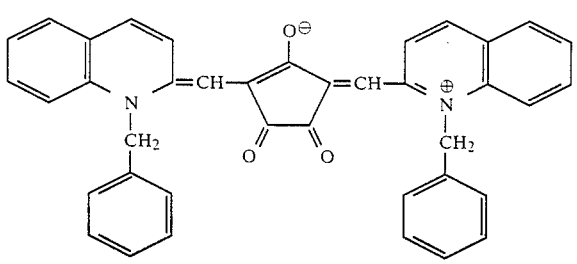
4-1-30
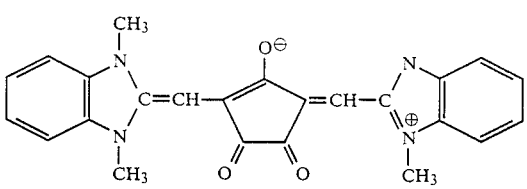
4-1-31
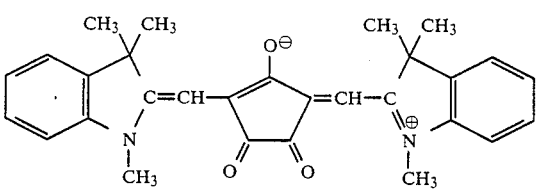
4-1-32

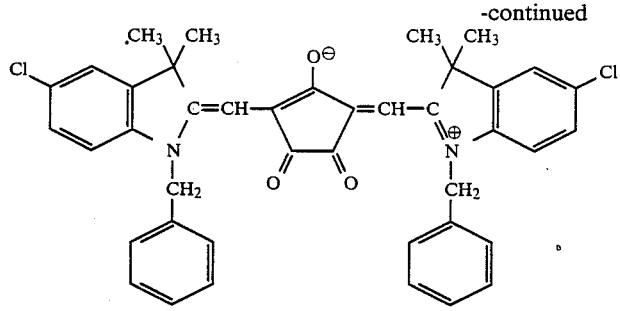
4-1-33

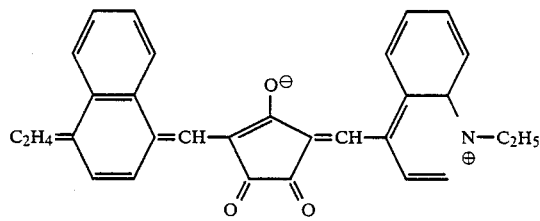
4-1-34

Typical examples of the formulae 4-3 and 4-4;

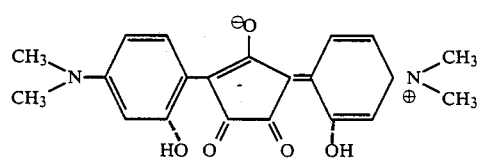
4-1-35

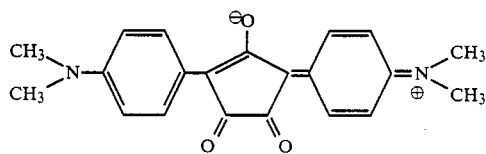
4-1-36

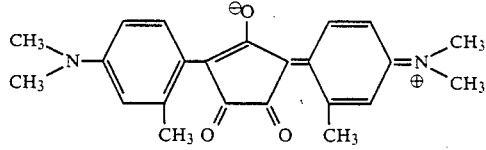
4-1-37

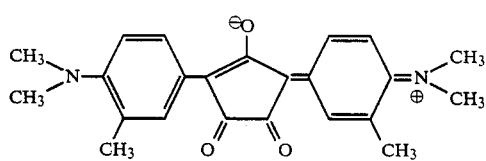
4-1-38

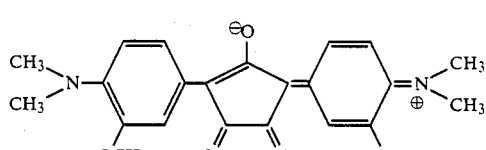
4-1-39

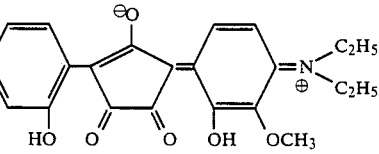
4-1-40

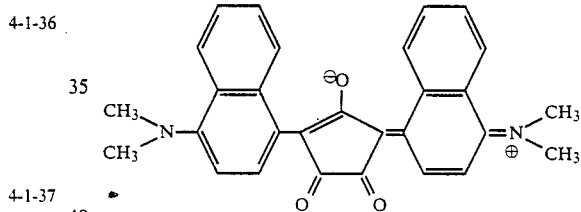
4-1-41

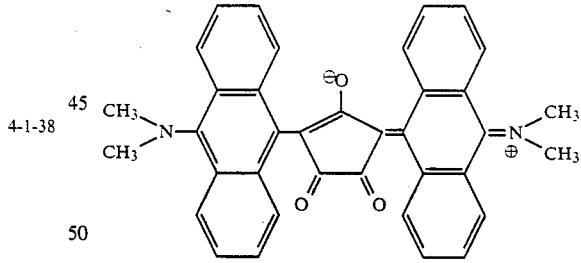
4-1-42

The above croconic methine dyes of the formulae 4-1-1 to 4-1-42 can be used either individually or as a combination of two or more compounds.

The above polymethine compounds to be used in the present invention are compounds having an absorption peak in the wavelength region of 750 nm or longer which can generate heat by infrared rays of such wavelength, as represented by the following formula 5-1 or 5-2:

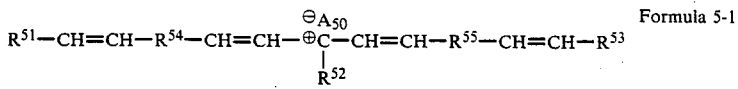

Formula 5-1

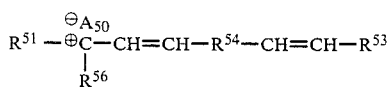
Formula 5-2

(wherein $R^{51}$, $R^{52}$ and $R^{53}$ each independently represent aryl group which may have substituent; $R^{54}$ and $R^{55}$ represent arylene group which may have substituent and can form a conjugated double bond system together with the two —CH=CH— groups adjacent thereto; $R^{56}$ represents hydrogen or aryl group which may have substituent; and $A_{50}$ represents anion radical).

To describe in more detail about the polymethine compound salts, in the formulae 5-1 and 5-2, $R^{51}$, $R^{52}$ and $R^{53}$ each independently represent an aryl radical such as phenyl, naphthyl, etc., which may have substituent. Here, examples of the substituent may include substituted amino radicals such as dimethylamino, diethylamine, dipropylamino, dibutylamino, diphenylamino, phenylbenzylamino, phenylethylamino, etc., cyclic amino radical such as morpholino, piperidinyl, pyrrolidino, etc., alkoxy radical such as methoxy, ethoxy, butoxy, etc. $R^{54}$ and $R^{55}$ each represents an arylene radical which may be substituted and can form a conjugated double bond system with two —CH=CH— radicals adjacent thereto such as p-phenylene, 1,4-naphthylene, etc. Here, examples of the substituent may include halogen atoms such as chlorine, bromine, iodine, etc., alkyl group such as methyl, ethyl, etc., and alkoxy radicals such as methoxy, ethoxy, etc. $R^{56}$ represents hydrogen or an aryl radical such as phenyl, naphthyl, etc., which may be substituted. Examples of the substituents may include those as exemplified for $R^{51}$ to $R^{53}$. $A_{50}^{\ominus}$ represents an anion radical, including, for example, $BF_4^{\ominus}$, $ClO_4^{\ominus}$, $CF_3COO^{\ominus}$, $PF_6^{\ominus}$; halogen radicals such as $Cl^{\ominus}$, $Br^{\ominus}$, $I^{\ominus}$, etc.; $ClSO_3^{\ominus}$; alkyl sulfonic acid radicals such as $CH_3SO_3^{\ominus}$, $C_2H_5SO_3^{\ominus}$, $C_3H_7SO_3^{\ominus}$, $C_4H_9SO_3^{\ominus}$, $C_5H_{11}SO_3^{\ominus}$, $C_6H_{13}SO_3^{\ominus}$, $CH_3CHClSO_3^{\ominus}$, $ClCH_2CH_2SO_3^{\ominus}$,

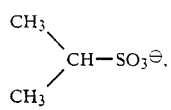

$ICH_2SO_3^{\ominus}$, etc.; benzenesulfonic acid radicals such as

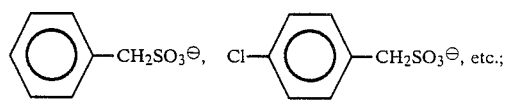

alkyldisulfonic acid radicals such as $^{\ominus}O_3SCH_2SO_3^{\ominus}$, $^{\ominus}O_3SCH_2CH_2SO_3^{\ominus}$, $^{\ominus}O_3S(CH_2)_6SO_3^{\ominus}$, $^{\ominus}O_3SCH_2CH_2-O-CH_2CH_2SO_3^{\ominus}$, etc.;

benzenedisulfonic acid radicals such as

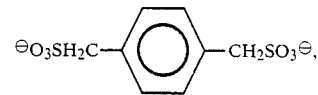

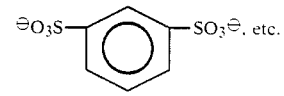

Specific examples of the polymethine compounds are shown below.

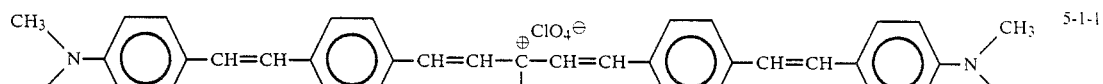
5-1-1

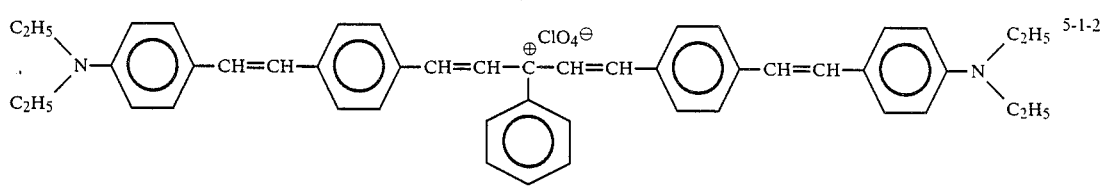
5-1-2

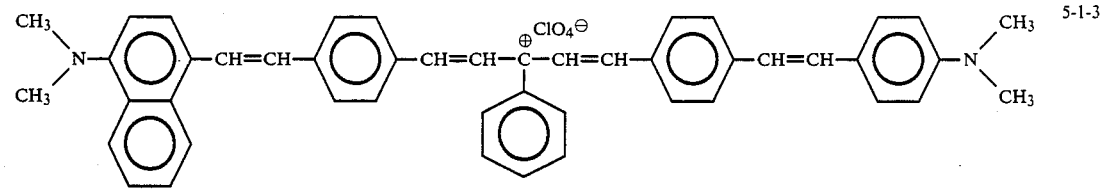
5-1-3
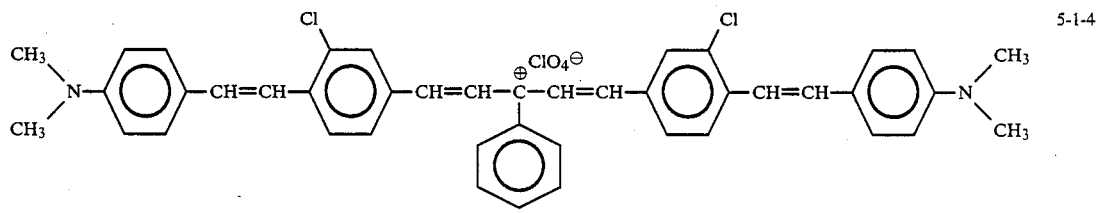
5-1-4
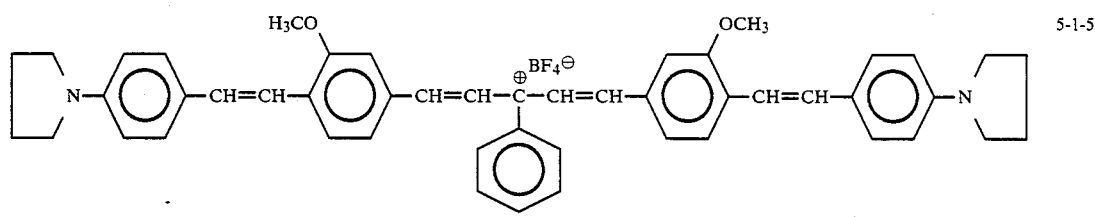
5-1-5
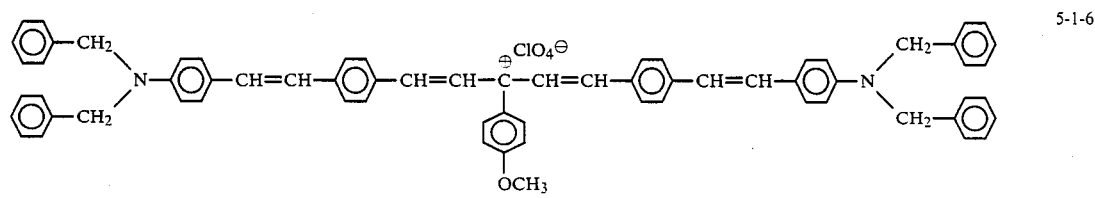
5-1-6
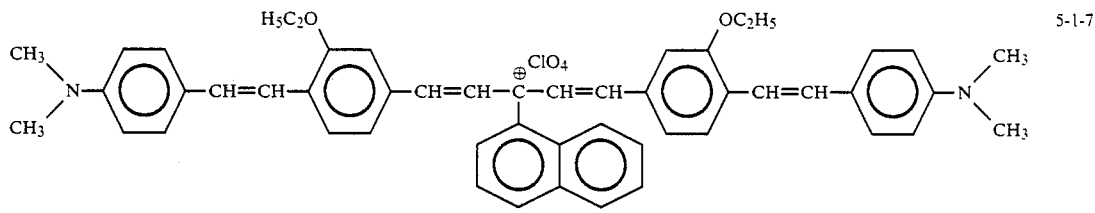
5-1-7
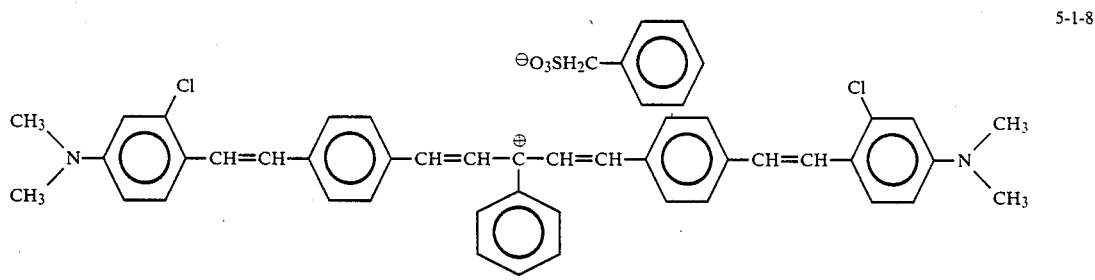
5-1-8
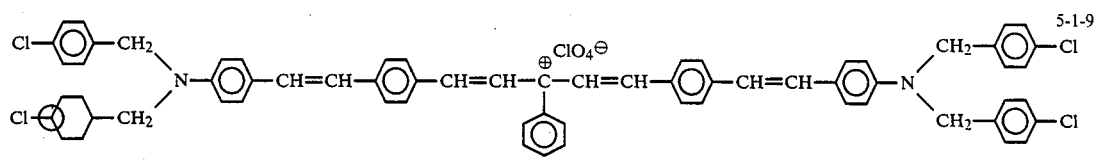
5-1-9

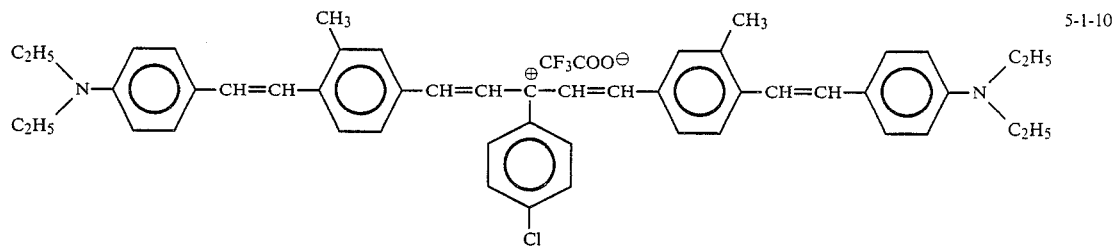
5-1-10
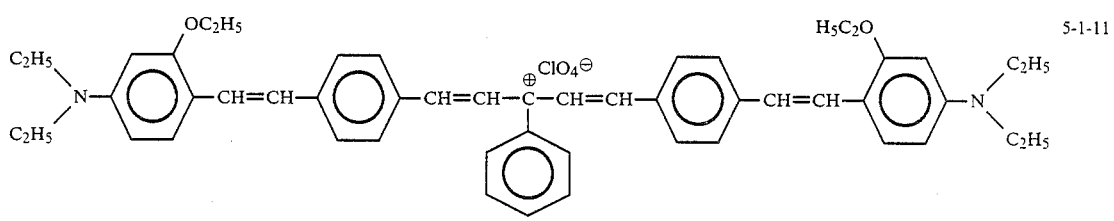
5-1-11
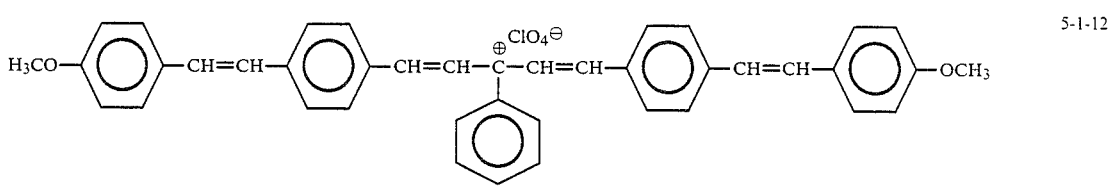
5-1-12
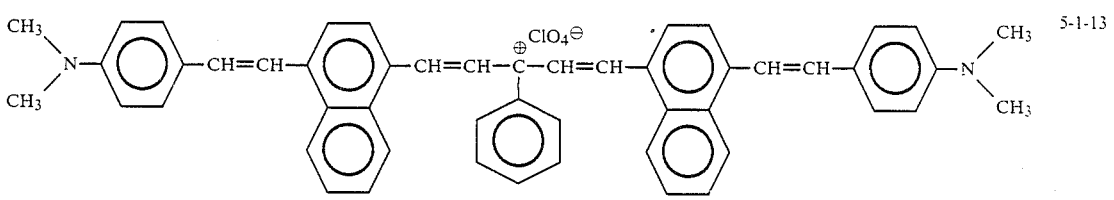
5-1-13
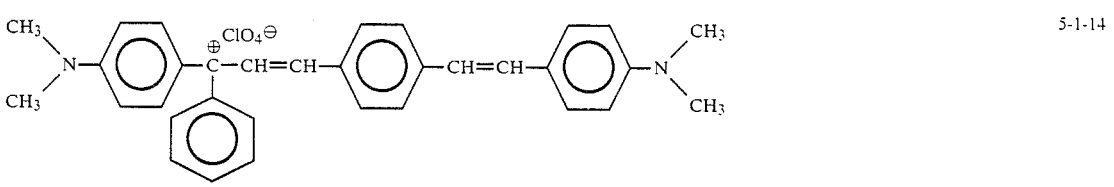
5-1-14
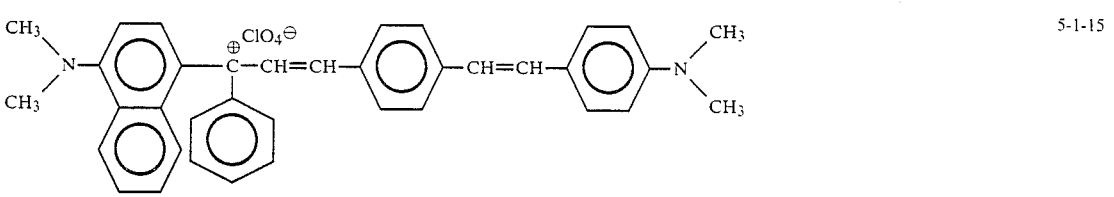
5-1-15
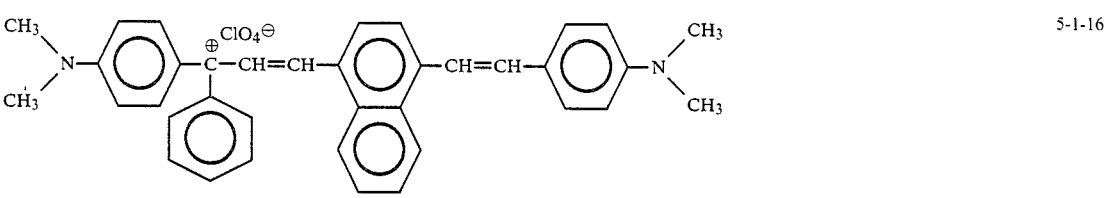
5-1-16

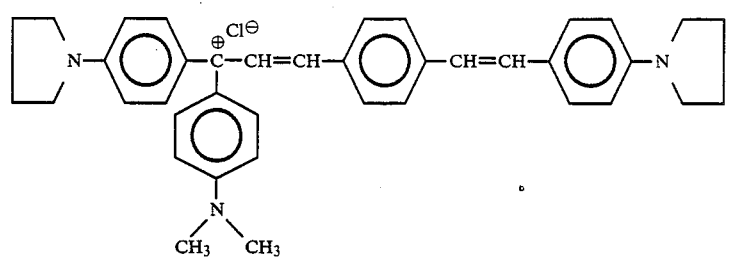
5-1-17
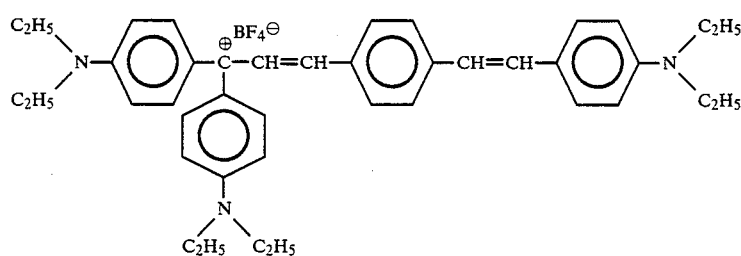
5-1-18
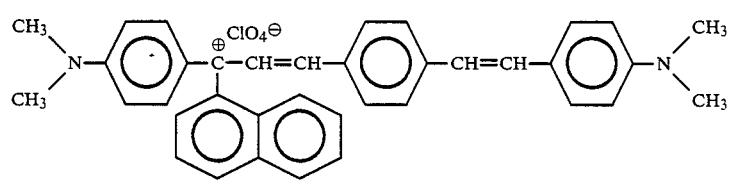
5-1-19
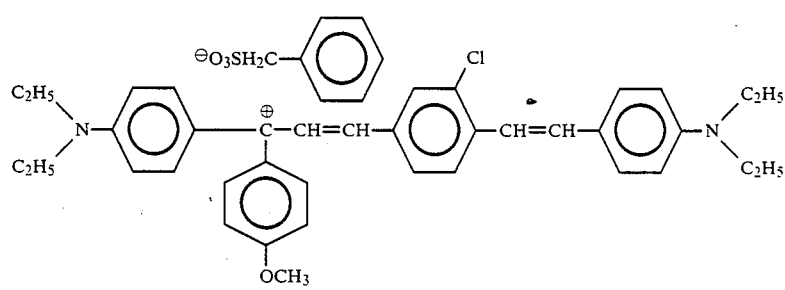
5-1-20
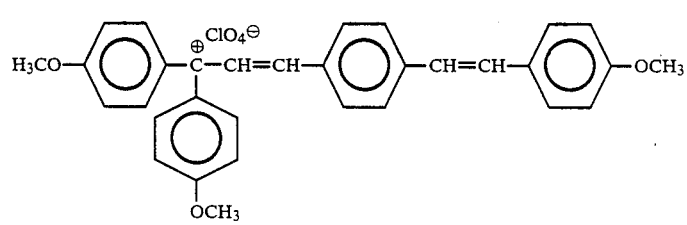
5-1-21
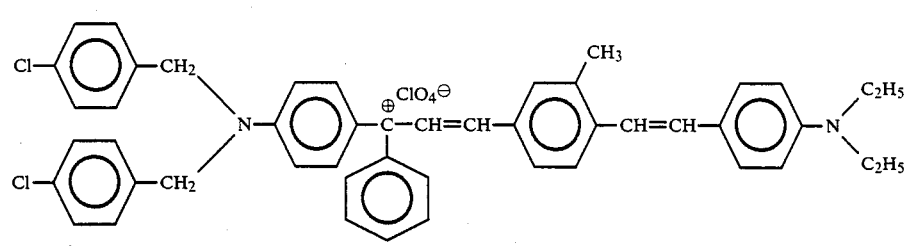
5-1-22

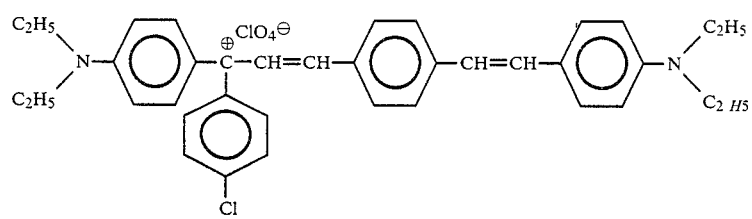
5-1-23
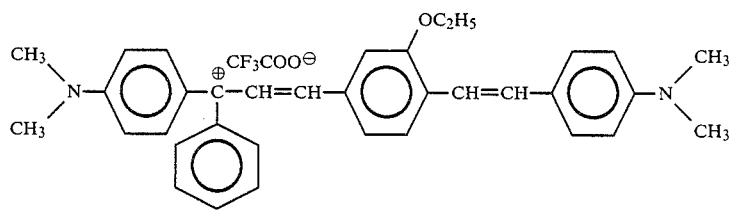
5-1-24
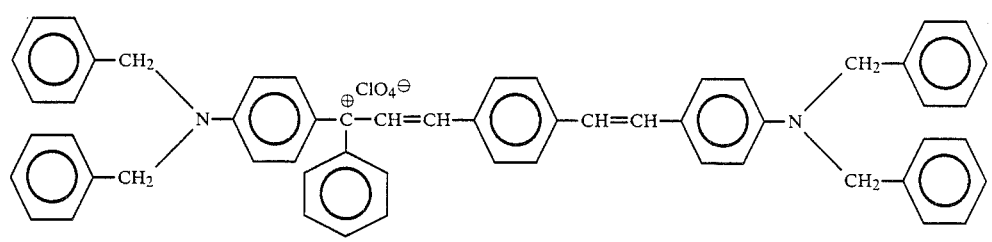
5-1-25
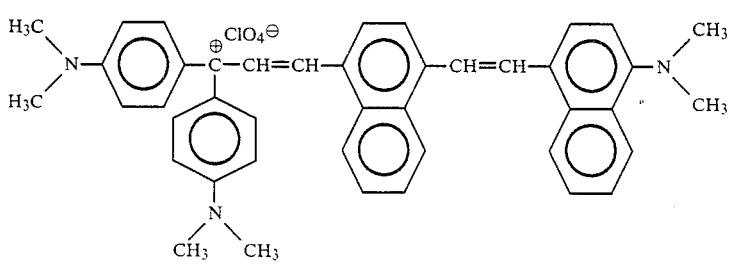
5-1-26
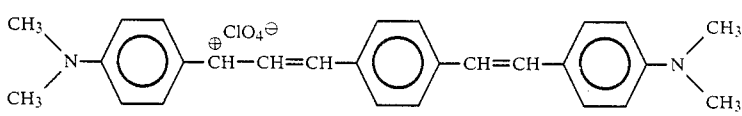
5-1-27
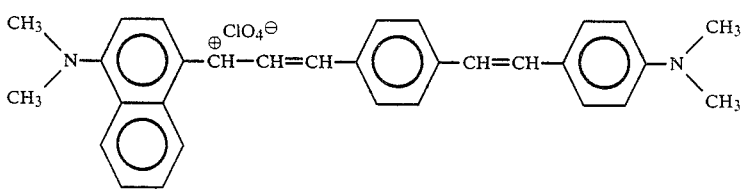
5-1-28
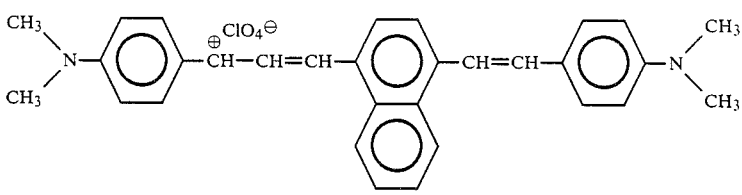
5-1-29
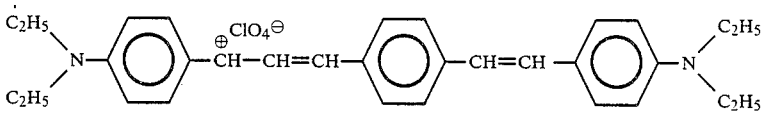
5-1-30

-continued

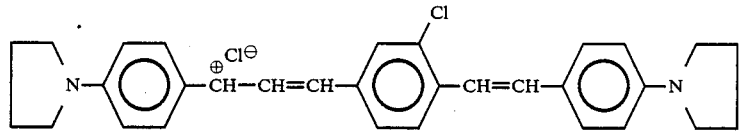

5-1-31

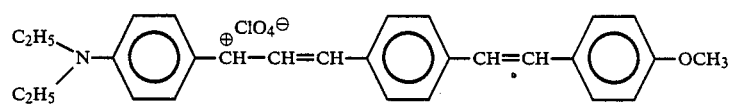

5-1-32

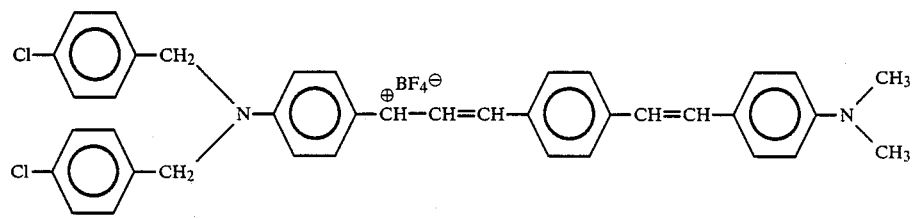

5-1-33

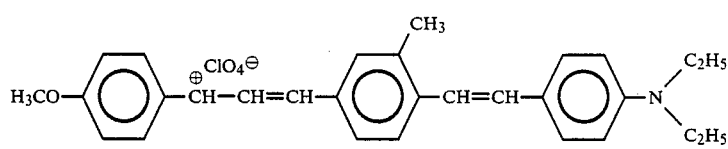

5-1-34

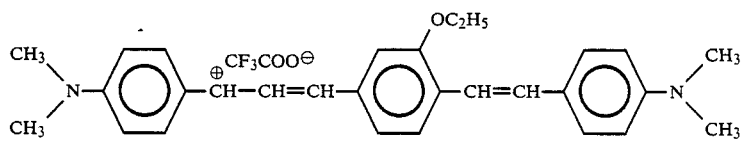

5-1-35

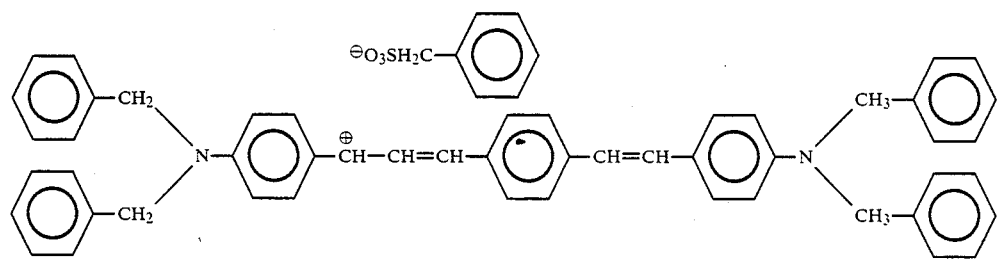

5-1-36

The optical recording medium to be used in the present invention comprises the above DA compound and at least one selected from the AZ compounds of pyrylium dyes or diene compound salts or croconic methine dyes and polymethine compounds (hereinafter called the group B), having preferably a recording layer in which said DA compound alone or as a mixture with at least one selected from the group B forms a monomolecular film or built-up film thereof. Specific constitutions of said optical recording medium may include the embodiments as shown below.

Figure 2:
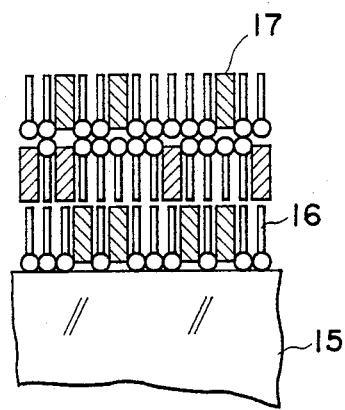
FIG. 2 to FIG. 4 are each schematic sectional view showing an example of the optical recording medium to be used for the method of the present invention.

(1) One having a recording layer comprising a mixed monomolecular film of the DA compound 16 and the compound 17 selected from the group B or a built-up film thereof (FIG. 2 shows its schematic sectional view).

Figure 3:
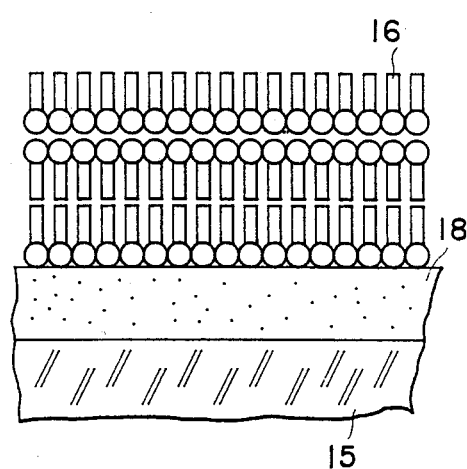

(2) One having a recording layer comprising two layers of a layer comprising a monomolecular film of the DA compound 16 or a built-up film thereof and a radiation absorbing layer 18 containing the compound 17 selected from the group B (two separated layer system; FIG. 3 shows its schematic sectional view).

Figure 4:
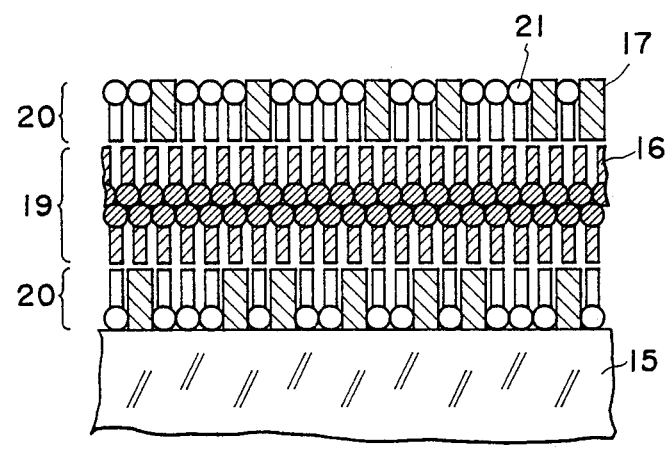

(3) One having a recording layer comprising at least one layer of the layer (A) 19 comprising a monomolecular film of the DA compound 16 or a built-up film thereof and at least one layer of the layer (B) 20 comprising a monomolecular film containing the compound 17 selected from the group B or a built-up film thereof laminated (hetero-built-up system; FIG. 4 shows its schematic sectional view).

In the two separated layer system and the hetero-built-up system, the layer comprising a monomolecular film of the DA compound or a built-up film thereof and the radiation absorbing layer 18 or the layer (B) 20 containing the compound selected from the group B may be laminated in the order in which either one of them may be positioned on the surface side of the recording layer, and various protective layers may be provided on the recording layer thus constituted, if desired.

As the substrate 15 of the optical recording medium to be used in the present invention, there may be employed various supporting materials such as glass, plastic plates of acrylic resins, etc., plastic films of polyesters, etc., paper, metal and others. When recording is practiced by irradiating, from the substrate side, a substrate capable of transmitting a radiation for recording of a specific wavelength is used.

For formation of a monomolecular film of a DA compound or monomolecular built-up film thereof on a substrate or a layer containing a compound selected from the group B, for example, the Langmuir-Blodgett method (hereinafter abbreviated as LB method) developed by I. Langmuir et al. may be used. The LB method is a method in which a monomolecular film or a film having monomolecular layers built-up is prepared by utilizing the phenomenon that, in a molecule with a structure having a hydrophilic moiety and a hydrophobic moiety in the molecule, when the balance between the both (amphiphilic balance) is adequately maintained, the molecular becomes a monomolecular layer on the water surface with the hydrophilic moiety directed downward. The monomolecular layer on the water surface has the characteristics of the two-dimensional system. When the molecules are scattered sparsely, the following formula of the two-dimensional ideal gas is valid between the area A per one molecule and the surface pressure $\pi$:

$$\pi A = kT,$$

thus becoming "gas film". Here, k is the Boltzmann's constant and T is an absolute temperature. When A is made sufficiently small, intermolecular interactions are strengthened, whereby the molecules become "condensed film (or solid film)" of a two-dimensional solid. The condensed films can be transferred one layer by one layer onto the surface of a substrate such as glass.

By use of this method, a monomolecular film of a DA compound or a built-up film thereof can be prepared, for example, as follows. First, a DA compound is dissolved in a solvent such as chloroform, and the resulting solution is spread on an aqueous phase to form a spreading layer in which the compound is spread in a film. Next, a partitioning plate (or a buoy) is provided to prevent too broad expansion of the spreading layer through free diffusion on the aqueous phase whereby the area of the spreading layer is restricted to control the gathered state of the DA compound and obtain a surface pressure $\pi$ in proportion to the gathered state. By moving this partitioning plate, the gathered state of the film substance can be controlled by reducing the spreading area, whereby the surface pressure can be gradually elevated to be set at a surface pressure suitable for preparation of built-up film. At the surface pressure constantly maintained, by moving vertically a clean substrate or a substrate having on its surface a layer containing a compound selected from the group B, gently, a monomolecular film of a DA compound is transferred onto the substrate or the layer containing the compound selected from the group B. A monomolecular film can be thus produced, and a built-up film of monomolecular layers can be formed to a desired built-up degree of repeating the above operation.

For transfer of the monomolecular film onto a substrate, other than the above vertical dipping method, such methods as the horizontal lifting method, the rotating cylinder method, etc., may be employed. The horizontal lifting method is a method in which transfer is effected with the substrate being contacted horizontally on the water surface, and the rotating cylinder method is a method in which the monomolecular layer is transferred onto the substrate surface by rotating a cylindrical substrate on the water surface. In the vertical dipping method as described above, when a substrate having a hydrophilic surface is withdrawn from the water in the direction transversing the water surface, a monomolecular layer with the hydrophilic groups of the DA compound faced toward the substrate side is formed as the first layer on the substrate. When the substrate is moved up and down in a vartical direction, a monomolecular film is laminated one layer by one layer in every step. Since the direction of the film forming molecules in the withdrawing step becomes opposite to that in the dipping step, according to this method, there is formed a Y type film in which the hydrophilic moieties and hydrophilic moieties, or hydrophobic moieties and hydrophobic moieties are faced to each other between the respective layers.

In contrast, the horizontal lifting method is a method in which a monomolecular film is transferred with the substrate contacted horizontally with the water surface, whereby a monomolecular film is formed on the substrate with a hydrophobic moiety of the DA compound faced toward the substrate side. According to this method, even when a film is built-up, there is no change in the direction of the molecules of the DA compound, but there is formed an X type film in which the hydrophobic groups are faced toward the substrate side in all of the layers. On the contrary, a built-up film in which the hydrophilic groups in all the layers are faced toward the substrate side is called a Z type film.

In a rotating cylinder method, a monomolecular layer is transferred onto the substrate surface by rotating a cylindrical substrate on the water surface. The method for transferring monomolecular layers onto a substrate is not limited to these, but it is also possible to employ a method in which a substrate is extruded into an aqueous phase from substrate roll, when employing a large area substrate. Also, the direction of the hydrophilic moiety and the hydrophobic moiety toward the substrate as described above are given as general rules, and it is also modified then by the surface treatment of the substrate, etc.

Detailes of the transferring operation of these monomolecular films are already known and described in, for example, "Shin Jikken Kagaku Koza (New Experimental Chemical Course) 18 Interface and Colloid" P. 498-507, published by Maruzen.

Also, the so-called mixed monomolecular film or the mixed monomolecular built-up film comprising two or more compounds can be obtained according to the same method as described above. In this case, at lest one of the two or more compounds constituting the mixed monomolecular film or the mixed monomolecular built-up film may have hydrophilic site and hydrophobic site in combination, and it is not necessarily required that all the compounds should have hydrophilic site and hydrophobic site in combination. That is, provided that amphiphilic balance is maintained in at least one compound, a monomolecular layer can be formed on the water surface and the other compound can be sandwiched between the amphiphilic compound, whereby a monomolecular layer having molecular orderliness can be consequently formed.

Accordingly, a recording layer comprising a mixed monomolecular film or a mixed monomolecular built-up film of a DA compound and the compound selected from the group B can be formed according to the LB method similarly as described above by dissolving the DA compound and the compound selected from the group B in a solvent such as chloroform, and spreading the solution on an aqueous phase to form a spreading layer having these compounds spread in the form of a film.

However, for improving dramatically the film forming property, the compound selected from the group B is required to be made amphiphilic.

On the other hand, for formation of a layer containing the compound selected from the group B, there may be typically employed the method in which the compound selected from the group B is dissolved in an appropriate volatile solvent to prepare a coating solution, which is then coated. Also, for formation of a recording layer containing a diacetylene derivative compound and at least one compound selected from the group B, there may be employed the method in which fine powder of a polydiacetylene compound and/or at least one compound selected from the group B are dispersed or dissolved in an appropriate volatile solvent to prepare a coating liquid and this coating liquid or these coating liquids are applied on a substrate. The coating solution may also incorporate various binders comprising natural or synthetic polymers for improvement of adhesion to the substrate or the layer comprising monomolecular film of a DA compound or its built-up film. Further, for improving stability and quality of the layer, various kinds of additives may be added.

Suitable binders can be selected from a variety of resins. Specific examples may include cellulose esters such as nitrocellulose, cellulose phosphate, cellulose sulfate, cellulose acetate, cellulose propionate, cellulose butyrate, cellulose myristate, cellulose palmitate, cellulose acetate propionate, cellulose acetate butyrate, etc.; cellulose ethers such as methyl cellulose, ethyl cellulose, propyl cellulose, butyl cellulose, etc.; vinyl resins such as polystyrene, polyvinyl chloride, polyvinyl acetate, polyvinyl butyral, polyvinyl acetal, polyvinyl alcohol, polyvinyl pyrrolidone, etc.; copolymer resins such as styrene-butadiene copolymer, styrene-acrylonitrile copolymer, styrene-butadiene-acrylonitrile copolymer, vinyl chloride-vinyl acetate copolymer, etc.; acrylic resins such as polymethyl methacrylate, polymethyl acrylate, polyacrylic acid, polymethacrylic acid, polyacrylamide, polyacrylonitrile, etc.; polyesters such as polyethylene terephthalate, etc.; polyarylate resins such as poly(4,4'-isopropylidenediphenylene-co-1,4-cyclohexylenedimethylene carbonate, poly(ethylenedioxy-3,3'-phenylene thiocarbonate), poly(4,4'-isopropylidenediphenylene carbonate-coterephthalate), poly(4,4'-isopropylidenediphenylene carbonate), poly(4,4'-sec-butylidenediphenylene carbonate), poly(4,4'-isopropylidenediphenylene carbonate-block-oxyethylene), etc.; polyamides; polyimides; epoxy resins; phenol resins; and polyolefins such as polyethylene, polypropylene, chlorinated polyethylene, etc.

Preferable dispersing medium for DA compounds may include alcohols such as methanol, ethanol, isopropanol, etc., ketones such as acetone, methyl ethyl ketone, cyclohexanone, etc.; saturated hydrocarbons such as cyclohexane, n-hexane, etc.; aliphatic halogenated hydrocarbons such as chloroform, methylene chloride, dichloroethylene, carbon tetrachloride, trichloroethylene, etc.; aromatic hydrocarbons such as benzene, toluene, xylene, monochlorobenzene, dichlorobenzene, etc. Among them, chloroform, benzene and toluene are particularly preferred.

The solvent to be used for coating may include, in the case of AZ compounds, pyrylium dyes, diene compounds salts or polymethine compounds, alcohols such as methanol, ethanol, isopropanol, etc., ketones such as acetone, methyl ethyl ketone, cyclohexanone, etc.; aliphatic nitriles such as acetonitrile, etc.; aliphatic halogenated hydrocarbons such as chloroform, methylene chloride, dichloroethylene, carbon tetrachloride, trichloroethylene, etc.; and others. Methylene chloride and acetonitrile are particularly preferred. In the case of croconic methines, the solvent used may be selected suitably depending on the state of the croconic methine dyes. In the case of a croconic methine dye under amorphous state, there may be employed alcohols such as methanol, ethanol, isopropanol, etc.; ketones such as acetone, methyl ethyl ketone, cyclohexanone, etc.; amides such as N,N-dimethylformamide, N,N-dimethylacetamide, etc.; sulfoxides such as dimethyl sulfoxide, etc.; ethers such as tetrahydrofuran, dioxane, ethylene glycol monomethyl ether, etc.; esters such as methyl acetate, ethyl acetate, etc.; aromatics such as benzene, toluene, xylene, ligroin, etc. On the other hand, in the case of a croconic methine under state of particles, there may be selected halogenated hydrocarbons such as dichloromethane, chloroform, carbon tetrachloride, 1,1-dichloromethane, 1,2-dichloromethane, 1,1,2-trichloromethane, chlorobenzene, bromobenzene, 1,2-dichlorobenzene, etc.

For coating of the coating solution thus obtained, there may be employed various methods such as spinner rotary coating, dip coating, spray coating, bead coating, wire bar coating, blade coating, roller coating, curtain coating, etc.

Also, the layer containing the compound selected from the group B may be a monomolecular film or a built-up film thereof similarly to the layer of a DA compound comprising a monomolecular film thereof or its built-up film. However, because the compound selected from the group B is not an amphiphilic substance, when a monomolecular film is formed solely from the compound selected from the group B by means of an LB method, a monomolecular film or monomolecular built-up film can be formed by introducing a long chain alkyl or the like thereto; alternatively by simultaneous use of organic molecules, as a molecular carrier, having a well-balanced amphiphilicity such as higher fatty acid including stearic acid and arachic acid in an appropriate proportion, there can be formed a mixed monomolecular film or a mixed monomolecular built-up film containing the compound selected from the group B.

When the recording layer comprises a mixed monomolecular film of a DA compound and a compound selected from the group B or built-up film thereof, its film thickness may be suitably that of up to about 400 built-up films. In other words, it may be about 500 Å to 2 μm, particularly preferably within the range from 1000 to 5000 Å. Above all, in the case of a mixed monomolecular film of the DA compound and the compound selected from the group B, their mixing ratio should preferably be about 1/15 to 15/1, most preferably 1/5 to 10/1.

In the case of the two separated layer system, the film thickness of the monomolecular film of the DA compound or the built-up film thereof may be preferably that of up to about 400 built-up layers, and the film thickness of the layer containing the compound selected from the group B may preferably be that of up to about 200 built-up layers when formed as a monomolecular film or a built-up film thereof, or about 100 Å to 1 μm, particularly preferably in the range from 200 to 5000 Å, when formed as a non-monomolecular film.

In the case of the hetero-built-up film system, it is practically preferable that two or more bonded interfaces between the A layer 19 and the B layer 20 exist, and the combined built-up layer of the A layer and the B layer is up to about 200.

In the optical recording-reproducing method of the present invention, the recording medium as constituted above to be provided for recording and reproduction is first subjected to polymerization of the DA compound in the recording layer. That is, the DA compound which is substantially colorless and transparent at the initial stage is polymerized on irradiation of UV-rays onto the whole recording layer to be changed to a polydiacetylene derivative compound. As the results of this polymerization, the recording layer becomes to have the maximum absorption wavelength at 620 to 660 nm to be changed to blue color or dark color. The change in hue based on this polymerization is an irreversible change, so that the recording layer once changed to blue color or dark color will never be returned to the colorless transparent film. Thus, first, the DA compound in the recording layer is polymerized to be changed to a polydiacetylene derivative compound, thereby changing the recording layer as a whole to blue color or dark color.

The polydiacetylene derivative compound changed to blue color or dark color, when heated to about 50° C. or higher, becomes for this time to have the maximum absorption wavelength at about 540 nm to be changed to red color. This change is also an irreversible change. The optical recording method of the present invention performs recording by utilizing such color change characteristic of the polydiacetylene derivative compound, and the recording method of the present invention is described in detail below.

FIG. 1 is a schematic illustration showing one embodiment of the optical recording-reproducing device to be used for practicing the optical recording-reproducing method of the present invention. The optical recording-reproducing device is constituted of an optical recording medium mounting means (not shown) for setting the optical recording medium 1 at a predetermined position, an information writing means for writing an information onto the optical recording medium and an information reading means for reading the recorded information written in the optical recording medium. The information writing means comprises a semiconductor laser 2 for radiating infrared rays of the wavelength within the range from 800 to 900 nm, a control circuit 3 for controlling oscillation of the semiconductor laser 2 corresponding to the input information and an optical system (collimator lens 4, a dichroic mirror 5 reflective plate 6, wavelength plate 7 and objective lens 8). As the semiconductor laser 2, it is particularly preferable to use a GaAs junction laser of output wavelength of 800 to 900 nm.

On the ther hand, the information reading means is controlled by a driving circuit 9 and comprises a semiconductor laser or emission diode 10 radiating a visible light without wavelength ranging from 500 to 750 nm, a photodetector 12 connected to an output circuit 11 and an optical pick-up optical system (most of the optical system shared by the optical system for the information writing means, but having a collimator lens 13 and a polarized light beam splitter 14 of its own).

As the semiconductor laser 10, it is preferable to use one radiating a visible light with wavelengths ranging from 650 to 750 nm such as a PN junction laser of GaAlAs and, as the emission diode 10, it is preferable to use one radiating a visible light with wavelengths ranging from 500 to 750 nm such as a junction diode of GaAsP, GaP, GaAlAs, etc.

The input information is converted to an optical signal by the semiconductor laser via the control circuit 3. The optical signal, by passing through the optical system, is converged at a predetermined position of the optical recording medium having a blue or dark recording layer which is placed on the optical recording medium mounting means and is rotated synchronously. The converted position is in the recording layer in the case of an optical recording medium of one layer mixed system or in the radiation absorbing layer containing the compound selected from the group B in the case of the two-layer separated system. While the polydiacetylene derivative compound existing at the image formation point (site) does not absorb the laser beam of this wavelength, but the compound selected from the group B absorbs the laser beam to generate heat. The heat generated from the compound selected from the group B is transferred to the adjacent polydiacetylene derivative compound, whereby the polydiacetylene derivative compound turns red. Thus, optical writing due to color change of the recording site on the recording layer is practiced corresponding to the input information.

On the other hand, optical recording reading is practiced by use of a low output, continuous oscillation light radiated from a semiconductor laser or an emission diode 10 radiating a visible light with wavelengths ranging from 550 to 750 nm. The reading light is of low output and also its wavelength is outside the IR region, and therefore it will not generate heat from the compound selected from the group B. Therefore, no recording is effected by this reading light during the reading operation. The reading light is converted on the surface of the recording layer of the optical recording medium 1 to be reflected thereagainst. Since the reflectance of the reading light differs depending on the recorded site (color changed site) from that on other sites, the reflected light can be projected through an optical pick-up optical system against the light-receiving surface of the photodetector 12 to be converted to an electrical signal, which is in turn read for reproduction of recording through the output circuit 11.

As the optical recording medium, a disc (optical disc) shaped in a disc has been employed in the above example, but it is also possible to use an optical tape, an optical card, etc., depending on the kind of the substrate supporting the recording layer containing the polydiacetylene derivative compound and the compound selected from the group B.

The present invention is described in more detail by referring to the following Examples.

EXAMPLE 1-1

A solution of 1 part by weight of a diacetylene derivative represented by $C_{12}H_{25}-C\equiv C-C\equiv C-C_8H_{16}-COOH$ and 1 part by weight of an AZ compound represented by the above formula 1-1-1 dissolved at a concentration of $1\times 10^{-3}$ mole/liter in chloroform was spread on an aqueous phase with pH 6.5 and a cadmium chloride concentration of $1\times 10^{-3}$ mole/liter. After removal of the solvent chloroform, at a surface pressure enhanced to 200 dyne/cm and maintained constantly thereat, a glass substrate sufficiently cleaned having a hydrophilic surface was moved up and down vertically in the direction transversing the water surface gently at a speed of 1.0 cm/min. to have a mixed monomolecular film of the DA compound and the AZ compound transferred onto the substrate. Thus, optical recording media having a mixed monomolecular film and mixed monomolecular built-up film built up in 21 layers, 41 layers and 81 layers formed on the substrate, respectively, were prepared.

On these optical recording media, UV-ray of 254 nm was irradiated uniformly and sufficiently to have the DA compound in the recording layer polymerized to make the recording layer a blue film, and by use of a recording device shown in FIG. 1, recording writing was practiced following the input information under the recording conditions shown below.
Semiconductor laser wavelength: 830 nm
Laser beam diameter: 1 μm
Laser output: 3 mW
Irradiation time of laser beam per 1 bit: 200 ns When laser beam was irradiated on the blue optical recording medium surface, the irradiated portion was changed to red color to effect recording writing. For reading of the recording, a semiconductor laser with a wavelength of 680 nm and an output of 1 mW was used as the reading light source, and the reflected light was received by a photodetector (PN junction photodiode).

Evaluation of recording writing was practiced as follows. For the recorded density, the optical density at the recorded (red) portion was measured. For the resolution and the sensitivity, correspondence of the recorded image to the laser beam diameter was judged by microscopic observation, and very good correspondence was rated as ⊙, good correspondence as ○, incapability of recording or inferior correspondence as X. Recording reading was evaluated by measuring the conveying wave noise ratio (C/N ratio). The evaluation results are shown in Table 1-1.

EXAMPLE 1-2

On the four kinds of optical recording media prepared in Example 1-1, UV-ray of 254 nm was irradiated uniformly and sufficiently to make the recording layers blue films, followed by practice of recording writing under the conditions shown below following the input information.
Laser wavelength: 870 nm
Laser beam diameter: 1 μm
Laser output: 3 mW
Irradiation time of laser beam per 1 bit: 200 ns Recording reading and evaluation were practiced similarly as in Example 1-1 and the evaluation results are shown in Table 1-1.

COMPARATIVE EXAMPLE 1-1

On the four kinds of optical recording media prepared in Example 1-1, UV-ray of 254 nm was irradiated uniformly and sufficiently to make the recording layers blue films, followed by practice of recording writing under the conditions shown below following the input information.
Laser wavelength: 790 nm
Laser beam diameter: 1 μm
Laser output: 3 mW
Irradiation time of laser beam per 1 bit: 200 ns Recording reading and evaluation were practiced similarly as in Example 1-1 and the evaluation results are shown in Table 1-1.

COMPARATIVE EXAMPLE 1-2

Optical recording media were prepared according to the same method as in Example 1-1 except for using no AZ compound. After the recording layers of the optical recording media were made blue, writing of recording was practiced under the conditions of Examples 1-1 and 1-2, and Comparative Example 1-1. Evaluation of recording was practiced in the same manner as in Example 1-1, and the results are shown in Table 1-1.

TABLE 1-1

| Example No. | Built-up degree of film | Writing condition | Sensitivity | Resolution | Image density | C/N ratio |
|---|---|---|---|---|---|---|
| Example 1-1 | 1 | Example 1-1 | ⊙ | ⊙ | 0.9 | 20 |
|  | 21 | Example 1-1 | ⊙ | ⊙ | 2.4 | 47 |
|  | 41 | Example 1-1 | ⊙ | ⊙ | 2.8 | 51 |
|  | 81 | Example 1-1 | ⊙ | ⊙ | 3.2 | 56 |
| Example 1-2 | 1 | Example 1-1 | X | X | X | X |
|  | 21 | Example 1-1 | X | X | X | X |
|  | 41 | Example 1-1 | O | O | 1.8 | 39 |
|  | 81 | Example 1-1 | ⊙ | ⊙ | 2.1 | 42 |
| Comparative example 1-1 | 1 | Example 1-1 | X | X | X | X |
|  | 21 | Example 1-1 | X | X | X | X |
|  | 41 | Example 1-1 | X | X | X | X |
|  | 81 | Example 1-1 | ⊙ | ⊙ | 1.6 | 38 |
| Comparative example 1-2 | 41 | Example 1-1 | X | X | X | X |
|  | 41 | Comparative example 1-1 | X | X | X | X |
|  | 41 | Comparative example 1-2 | X | X | X | X |

EXAMPLE 1-3

According to the same procedure as in Example 1-1 except for using a diacetylene derivative compound represented by $C_8H_{17}-C\equiv C-C\equiv C-C_2H_4-COOH$ in place of the diacetylene derivative compound represented by $C_{12}H_{25}-C\equiv C-C\equiv C-C_8H_{16}-COOH$, an optical recording medium having monomolecular films built up in 41 layers were prepared. For the recording medium, writing and reading of recording were practiced under the same conditions as in Example 1-1. The evaluation results are shown in Table 1-2.

EXAMPLES 1-4 TO 1-7

According to the same procedure as in Example 1-3 except for using the AZ compounds represented by the formulae 1-1-3, 1-1-8, 1-1-12 and 1-1-15, respectively, in place of the AZ compounds represented by the formula 1-1-1, optical recording media were prepared. For the recording media, writing and reading of recording were practiced under the same conditions as in Example 1-1. The evaluation results are shown in Table 1-2.

TABLE 1-2

| Example No. | Sensitivity | Resolution | Image density | S/N ratio |
|---|---|---|---|---|
| Example No. 1-3 | ⊚ | ⊚ | 2.8 | 51 |
| Example No. 1-4 | ⊚ | ⊚ | 2.5 | 47 |
| Example No. 1-5 | ⊚ | ⊚ | 2.8 | 51 |
| Example No. 1-6 | ⊚ | ⊚ | 2.5 | 48 |
| Example No. 1-7 | ⊚ | ⊚ | 2.6 | 49 |

EXAMPLE 1-8

A coating solution obtained by dissolving 1 parts by weight of an AZ compound salt represented by the formula 1-1-1 in 4 parts by weight of methylene chloride was added in a small amount dropwise at the central portion of a disc substrate made of a glass (thickness 1.5 mm, diameter 200 mm) mounted on a spinner coating machine, and then coating was effected by rotating the spinner for a predetermined time at a predetermined rotation number, followed by drying at normal temperature, to prepare a large number of coatings with film thicknesses after drying of 200 Å and 3000 Å, respectively, on the substrate.

Next, a monomolecular built-up film of the DA compound represented by $C_{12}H_{25}$—C≡C—C≡C—$C_8H_{16}$—COOH was transferred onto the AZ compound layer on the substrate according to the same method as in Example 1-1 to prepare recording media having monomolecular films built up in 7 layers, 41 layers, 101 layers and 201 layers, respectively. After the recording layers of these optical recording media were made blue films, writing and reading of recording were practiced under the same conditions as in Example 1-1. Evaluation of recording was conducted in the same manner as in Example 1-1, and the results are shown in Table 1-3.

TABLE 1-3

| Thickness of azulenium salt compound containing layer | Built-up degree of monomolecular film | Sensitivity | Resolution | Image density | S/N ratio |
|---|---|---|---|---|---|
| 200Å | 7 | ⊚ | ⊚ | 2.8 | 51 |
|  | 41 | ○ | ○ | 2.0 | 41 |
|  | 101 | ○ | ○ | 2.3 | 47 |
|  | 201 | X | X | X | 50 |
| 3000Å | 7 | ⊚ | ⊚ | 1.6 | 38 |
|  | 41 | ⊚ | ⊚ | 3.0 | 54 |
|  | 101 | ⊚ | ⊚ | 3.2 | 56 |
|  | 201 | ⊚ | ⊚ | 3.4 | 57 |

EXAMPLE 1-9

A solution of DA compound of the formula $C_{12}H_{25}$—C≡C—C≡C—$C_8H_{16}$—COOH dissolved in chloroform at a concentration of $1\times10^{-3}$ mol/liter was spread on an aqueous phase of pH 6.5 and a cadmium chloride concentration of $1\times10^{-3}$ mol/liter. After evaporation of the solvent chloroform, the surface pressure was enhanced to 20 dyn/cm. At the surface pressure maintained constantly, a glass substrate with sufficiently cleaned hydrophilic surface (including the case when a built-up film, etc. constituted of monomolecular film containing the group B compound had been already formed) was moved vertically in the direction transversing the water surface gently at a speed of 1.0 cm/min. for desired times (with intermediate drying steps being practiced) have a monomolecular film containing the DA compound transferred onto the substrate, thereby forming a monomolecular film or monomolecular built-up film thereof.

A solution of 1 part by weight of the AZ salt compound shown by the formula 1-1-1 and 2 parts by weight of arachic acid dissolved in chloroform at a concentration of $1\times10^{-3}$ mol/liter was spread on an aqueous phase with pH 6.5 and a cadmium chloride concentration of $1\times10^{-3}$ mol/liter. After evaporation of the solvent chloroform, the surface pressure was enhanced to 20 dyn/cm. At the surface pressure maintained constantly, a carrier of a glass substrate with sufficiently clean and hydrophilic surface (including the case when a built-up film, etc. constituted of monomolecular film of DA compound had been already formed) was moved up and down vertically in the direction transversing the water surface gently at a speed of 1.0 cm/min for desired times (with intermediate drying steps being practiced) to have a monomolecular film containing the AZ compound transferred onto the substrate, thereby forming a monomolecular film or monomolecular built-up film thereof.

Based on the preparation processes of a monomolecular film of the DA compound and a monomolecular film containing the AZ compound, 8 kinds of hetero-built-up films were prepared from a suitable combination of these operations. The hetero-built-up films thus prepared (optical recording media) are shown in Table 1-4. The symbols and the numerals shown for constitution of the optical recording media have the meanings as exemplified below.

① G/20AZ/60DA/20AZ

An optical recording medium having a constitution in which 20 built-up layers of a monomolecular built-up film containing the AZ compound, 60 built-up layers of a monomolecular built-up film of the DA compound, and 20 built-up layers of a monomolecular built-up film containing the AZ compound salt are laminated in this order on the glass substrate (G).

② G/10X(2AZ/6DA)

An optical recording medium having a constitution in which a lamination combination of 2 built-up layers of a monomolecular built-up film containing the AZ compound and 6 built-up layers of a monomolecular built-up film of the DA compound is laminated repeatedly for 10 times on the glass substrate (G).

On these optical recording media, UV-ray of 254 nm was uniformly and sufficiently irradiated to polymerize the DA compound in the recording layer to make the recording layer a blue film, and thereafter recording was practiced following an input information under the same recording conditions as in Example 1-1. Evaluation of recording was conducted in the same manner as in Example 1-1 and the results are shown in Table 1-4.

TABLE 1-4

| Sample No. | Constitution of recording medium | Sensitivity | Resolution | Image density | S/N ratio |
|---|---|---|---|---|---|
| 1 | G/40AZ/60DA | ⊚ | ⊚ | 3.1 | 54 |
| 2 | G/20AZ/60DA/20AZ | ⊚ | ⊚ | 3.2 | 56 |
| 3 | G/30AZ/40AZ/30DA | ⊚ | ⊚ | 3.2 | 56 |
| 4 | G/20x(2AZ/3DA) | ⊚ | ⊚ | 3.3 | 57 |
| 5 | G/10x(4AZ/6DA) | ⊚ | ⊚ | 3.3 | 57 |
| 6 | G/3x(2AZ/2DA) | ⊚ | ⊚ | 1.8 | 39 |
| 7 | G/5x(2AZ/2DA) | ⊚ | ⊚ | 1.9 | 39 |
| 8 | G/10x(5AZ/5DA) | ⊚ | ⊚ | 3.2 | 56 |

EXAMPLE 2-1

The same experiment as in Example 1-1 was repeated except for using a pyrylium dye represented by the formula 2-1-5 in place of the AZ compound represented by the formula 1-1-1. In addition, the recording writing was practiced in the same manner as in Example 1-1 except for changing the irradiation time of laser beam per one bit to 300 ns. The evaluation method was the same as that in Example 1-1. The evaluation results are shown in Table 2-1.

EXAMPLE 2-2

The experiment and evaluation were carried out in the same manner as in Example 2-1 except for changing the wavelength of the recording laser beam to 800 nm. The evaluation results are shown in Table 2-1.

EXAMPLES 2-3 AND COMPARATIVE EXAMPLES 2-1, 2-2

Recording was practiced under the same conditions as in Example 2-1 except for changing the laser used for recording to those shown below, respectively. The evaluation results are shown in Table 2-1.

Example 2-3: Semiconductor laser [Ga-As laser (W-hetero structure), trially prepared], laser wavelength: 890 nm;

Comparative example 2-1: Semiconductor laser [Ga-As laser (W-hetero structure); trially prepared], laser wavelength: 950 nm;

Comparative example 2-2: Xenon gas laser, laser wavelength: 752 nm

COMPARATIVE EXAMPLE 2-3

Optical recording media were prepared according to the same method as in Example 2-1 except for using no pyrylium dye. After the recording layers of the optical recording media were made blue, writing and reading of recording was practiced under the conditions of Example 2-1, and Comparative examples 2-1, 2-2. Evaluation of recording was practiced in the same manner as in Example 2-1, and the results are shown in Table 2-1.

TABLE 2-1

| Example No. | Built-up degree of film | Writing condition | Sensitivity | Resolution | Image density | C/N ratio |
|---|---|---|---|---|---|---|
| Example 2-1 | 1 | Example 2-1 | ⊚ | ⊚ | 1.5 | 5 |
| | 21 | Example 2-1 | ⊚ | ⊚ | 2.3 | 40 |
| | 41 | Example 2-1 | ⊚ | ⊚ | 2.9 | 51 |
| | 81 | Example 2-1 | ⊚ | ⊚ | 3.1 | 50 |
| Example 2-2 | 1 | Example 2-2 | ○ | ⊚ | 1.2 | 5 |
| | 21 | Example 2-2 | ○ | ⊚ | 2.1 | 36 |
| | 41 | Example 2-2 | ⊚ | ⊚ | 2.6 | 46 |
| | 81 | Example 2-2 | ⊚ | ⊚ | 2.9 | 50 |
| Example 2-3 | 1 | Example 2-3 | ○ | ○ | 0.8 | 4 |
| | 21 | Example 2-3 | ○ | ○ | 2.0 | 35 |
| | 41 | Example 2-3 | ○ | ○ | 2.3 | 45 |
| | 81 | Example 2-3 | ○ | ○ | 2.7 | 47 |
| Comparative example 2-1 | 1 | Example 2-1 | X | X | — | — |
| | 21 | Example 2-1 | X | X | — | — |
| | 41 | Example 2-1 | X | X | — | — |
| | 81 | Example 2-1 | X | X | 0.7 | 3 |
| Comparative example 2-2 | 1 | Example 2-1 | X | X | — | — |
| | 21 | Example 2-1 | X | X | — | — |
| | 41 | Example 2-1 | X | X | — | — |
| | 81 | Example 2-1 | X | X | — | — |
| Comparative example 2-3 | 21 | Example 2-1 | X | X | — | — |
| | 21 | Comparative example 2-1 | X | X | — | — |
| | 21 | Comparative example 2-2 | X | X | — | — |

EXAMPLE 2-4

According to the same procedure as in Example 2-1 except for using a DA compound represented by $C_8H_{17}-C\equiv C-C\equiv C-C_2H_4-COOH$ in place of the DA compound represented by $C_{12}H_{25}-C\equiv C-C\equiv C-C_8H_{16}-COOH$, an optical recording medium having a monomolecular film of 21 built-up layers were prepared. For the recording medium, writing and reading of recording were practiced under the same conditions as in Example 2-1. The evaluation results are shown in Table 2-2.

EXAMPLES 2-5 TO 2-8

According to the same procedure as in Example 2-4 except for using pyrylium dyes represented by the formulae 2-1-7, 2-1-6 and 2-1-14, respectively, in place of the pyrylium dye used in Example 2-4, the same experiment was carried out. The evaluation results are shown in Table 2-2.

TABLE 2-2

| Example No. | Sensitivity | Resolution | Image density | C/N ratio |
|---|---|---|---|---|
| Example No. 2-4 | ⊚ | ⊚ | 3.0 | 54 |
| Example No. 2-5 | ⊚ | ⊚ | 2.8 | 48 |
| Example No. 2-6 | ⊚ | ⊚ | 2.8 | 50 |
| Example No. 2-7 | ⊚ | ⊚ | 2.9 | 51 |
| Example No. 2-8 | ⊚ | ⊚ | 2.7 | 48 |

EXAMPLE 2-9

The same experiment as in Example 1-8 was repeated except for using a pyrylium dye represented by the formula 2-1-5 in place of the AZ compound salt represented by the formula 1-1-1. The writing of recording and the reading were practiced under the same conditions as in Example 2-1. The evaluation of recording was made in the same manner as that in Example 2-1. The evaluation results are shown in Table 2-3.

TABLE 2-3

| Thickness of pyrylium dye layer | Built-up degree of monomolecular film | Sensitivity | Resolution | Image density | C/N ratio |
|---|---|---|---|---|---|
| 200Å | 1 | ⊚ | ⊚ | 1.3 | 4 |
|  | 21 | ⊚ | ⊚ | 2.4 | 45 |
|  | 41 | ⊚ | ⊚ | 2.7 | 48 |
|  | 81 | ○ | ○ | 2.7 | 48 |
| 1000Å | 1 | ⊚ | ⊚ | 1.3 | 4 |
|  | 21 | ⊚ | ⊚ | 2.6 | 47 |
|  | 41 | ⊚ | ⊚ | 2.9 | 50 |
|  | 81 | ⊚ | ⊚ | 3.2 | 52 |

EXAMPLE 2-10

Experiment was carried out according to the same procedure as in Example 1-9 except for using the pyrylium dye represented by the formula 2-1-5 in place of the AZ compound salt represented by the formula 1-1-1.

The hetero-built-up films thus prepared (optical recording media) are shown in Table 2-4. The symbols and the numerals shown for constitution of the media have the same meanings as in Example 1-9 (PL means a pyrylium dye).

After the recording layers of these optical recording media were made blue films, writing and reading of recording were practiced under the same conditions as in Example 2-1. Evaluation of recording was conducted in the same manner as in Example 2-1 and the results are shown in Table 2-4.

TABLE 2-4

| Sample No. | Constitution of recording medium | Sensitivity | Resolution | Image density | C/N ratio |
|---|---|---|---|---|---|
| 1 | G/40PL/60DA | ⊚ | ○ | 3.2 | 53 |
| 2 | G/20PL/60DA/20PL | ⊚ | ○ | 3.1 | 53 |
| 3 | G/30DA/40PL/30DA | ⊚ | ⊚ | 3.3 | 53 |
| 4 | G/20x(2PL/3DA) | ⊚ | ⊚ | 3.3 | 55 |
| 5 | G/10x(4PL/6DA) | ⊚ | ⊚ | 3.4 | 55 |
| 6 | G/3x(2PL/2DA) | ⊚ | ⊚ | 2.6 | 45 |
| 7 | G/5x(2PL/2DA) | ⊚ | ⊚ | 2.7 | 47 |
| 8 | G/10x(5PL/5DA) | ⊚ | ⊚ | 3.4 | 55 |

EXAMPLE 3-1

The same experiment as in Example 1-1 was repeated except for using a diene compound salt represented by the formula 3-1-1 in place of the AZ compound represented by the formula 1-1-1. In addition, the recording writing was practiced in the same manner as in Example 2-1. The evaluation of recording was carried in the same manner as that in Example 1-1. The evaluation results are shown in Table 3-1.

EXAMPLE 3-2

On the four kinds of optical recording media prepared in Example 3-1, recording writing was practiced in the same manner as in Example 2-2.

Evaluation of recording was practiced according to the same standards as in Example 3-1 and the evaluation results are shown in Table 3-1.

EXAMPLES 3-3 AND COMPARATIVE EXAMPLES 3-1, 3-2

Recording and writing were practiced under the same conditions as in Example 3-1 except for changing the laser used for recording to the same one used in Example 2-3, and the evaluation results are shown in Table 3-1.

COMPARATIVE EXAMPLE 3-3

Optical recording media were prepared according to the same method as in Example 3-1 except for using no diene compound salt. After the recording layers of the optical recording media were made blue, writing and reading of recording were practiced under the conditions of Example 3-1, Comparative examples 3-1, 3-2. Evaluation of recording was practiced in the same manner as in Example 3-1, and the results are shown in Table 3-1.

TABLE 3-1

| Example No. | Built-up degree of film | Writing condition | Sensitivity | Resolution | Image density | C/N ratio |
|---|---|---|---|---|---|---|
| Example 3-1 | 1 | Example 3-1 | ◉ | ◉ | 1.0 | 5 |
| | 21 | Example 3-1 | ◉ | ◉ | 2.0 | 35 |
| | 41 | Example 3-1 | ◉ | ◉ | 2.4 | 45 |
| | 81 | Example 3-1 | ◉ | ◉ | 2.8 | 50 |
| Example 3-2 | 1 | Example 3-2 | ○ | ◉ | 0.7 | 4 |
| | 21 | Example 3-2 | ○ | ◉ | 1.8 | 30 |
| | 41 | Example 3-2 | ◉ | ◉ | 2.1 | 40 |
| | 81 | Example 3-2 | ◉ | ◉ | 2.6 | 47 |
| Example 3-3 | 1 | Example 3-3 | ○ | ○ | 0.5 | 3 |
| | 21 | Example 3-3 | ○ | ○ | 1.6 | 25 |
| | 41 | Example 3-3 | ○ | ○ | 1.8 | 30 |
| | 81 | Example 3-3 | ◉ | ◉ | 2.1 | 39 |
| Comparative example 3-1 | 1 | Example 3-1 | X | X | — | — |
| | 21 | Example 3-1 | X | X | — | — |
| | 41 | Example 3-1 | X | X | — | — |
| | 81 | Example 3-1 | ○ | ○ | 0.8 | 4 |
| Comparative example 3-2 | 1 | Example 3-1 | X | X | — | — |
| | 21 | Example 3-1 | X | X | — | — |
| | 41 | Example 3-1 | X | X | — | — |
| | 81 | Example 3-1 | X | X | — | — |
| Comparative example 3-3 | 81 | Example 3-1 | X | X | X | — |
| | 81 | Comparative example 3-1 | X | X | X | — |
| | 81 | Comparative example 3-2 | X | X | X | — |

EXAMPLE 3-4

According to the same procedure as in Example 3-1 except for using a DA compound represented by $C_8H_{17}-C\equiv C-C\equiv C-C_2H_4-COOH$ in place of the DA compound represented by $C_{12}H_{25}-C\equiv C-C\equiv C-C_8H_{16}-COOH$, an optical recording medium of monomolecular films built up in 21 layers were prepared. For the recording medium, writing and reading of recording were practiced under the same conditions as in Example 3-1. The evaluation results are shown in Table 3-2.

EXAMPLES 3-5 TO 3-9

According to the same procedure as in Example 3-4 except for using the diene compound salts represented by the formulae 3-1-3, 3-1-8, 3-1-12, 3-1-15 and 3-1-20 in place of the diene compound salt represented by the formula 3-1-1, respectively, optical recording media were prepared. For these recording media, writing and reading were practiced under the same conditions as in Example 3-1. The evaluation results are shown in Table 3-2.

TABLE 3-2

| Example No. | Sensitivity | Resolution | Image density | C/N ratio |
|---|---|---|---|---|
| Example No. 3-4 | ◉ | ◉ | 2.6 | 49 |
| Example No. 3-5 | ◉ | ◉ | 2.3 | 45 |
| Example No. 3-6 | ◉ | ◉ | 2.2 | 43 |
| Example No. 3-7 | ◉ | ◉ | 2.3 | 45 |
| Example No. 3-8 | ◉ | ◉ | 2.4 | 47 |
| Example No. 3-9 | ◉ | ◉ | 2.5 | 48 |

EXAMPLE 3-10

Experiment was carried out according to the same procedure as in Example 1-8 except for using the diene dye represented by the formula 3-1-1 in place of the AZ compound salt represented by the formula 1-1-1. Writing and reading of recording were practiced under the same conditions as in Example 3-1. Evaluation of recording was conducted in the same manner as in Example 3-1, and the results are shown in Table 3-3.

TABLE 3-3

| Thickness of layer containing diene compound | Built-up degree of monomolecular film | Sensitivity | Resolution | Image density | C/N ratio |
|---|---|---|---|---|---|
| 200Å | 7 | ◉ | ◉ | 1.5 | 7 |
| | 41 | ◉ | ◉ | 2.5 | 48 |
| | 101 | ○ | ○ | 2.3 | 45 |
| | 201 | X | X | — | — |
| 1000Å | 7 | ◉ | ◉ | 1.5 | 7 |
| | 41 | ◉ | ◉ | 2.9 | 53 |
| | 101 | ◉ | ◉ | 3.0 | 54 |
| | 201 | ◉ | ◉ | 3.1 | 55 |

EXAMPLE 3-11

Experiment was carried out according to the same procedure as in Example 1-9 except for using the diene compound salt represented by the formula 3-1-1 in place of the AZ compound salt represented by the formula 1-1-1.

The hetero-built-up films thus prepared (optical recording media) are shown in Table 3-4. The symbols and the numerals shown for the constitution of media have the same meanings as in Example 1-9 (DE means a diene compound salt).

After the recording layers of these optical recording media were made blue films, writing and reading of recording were practiced under the same conditions as in Example 3-1. Evaluation of recording was conducted in the same manner as in Example 3-1 and the results are shown in Table 3-4.

TABLE 3-4

| Sample No. | Constitution of recording medium | Sensitivity | Resolution | Image density | C/N ratio |
|---|---|---|---|---|---|
| 1 | G/40DE/60DA | ◉ | ◉ | 3.0 | 54 |
| 2 | G/20DE/60DA/20DE | ◉ | ◉ | 3.1 | 55 |
| 3 | G/30DA/40DE/30DA | ◉ | ◉ | 3.1 | 55 |
| 4 | G/20x(2DE/3DA) | ◉ | ◉ | 3.2 | 56 |
| 5 | G/10x(4DE/6DA) | ◉ | ◉ | 3.2 | 56 |
| 6 | G/3x(2DE/2DA) | ◉ | ◉ | 1.7 | 8 |
| 7 | G/5x(2DE/2DA) | ◉ | ◉ | 1.8 | 10 |
| 8 | G/10x(5DE/5DA) | ◉ | ◉ | 3.2 | 55 |

EXAMPLE 4-1

Recording media were prepared in the same manner as in Example 1-1 except for using a croconic methine dye represented by the formula 4-1-6 in place of the AZ compound represented by the formula 1-1-1.

Writing of recording and evaluation thereof was conducted in the same manner as in Example 2-1. The evaluation results are shown in Table 4-1.

EXAMPLE 4-2

On the four kinds of optical recording media prepared in Example 4-1, recording writing was practiced in the same manner as in Example 2-2.

Reading of recording and evaluation were practiced similarly as in Example 4-1 and the evaluation results are shown in Table 4-1.

EXAMPLE 4-3 AND COMPARATIVE EXAMPLES 4-1, 4-2

Recording was practiced under the same conditions as in Example 4-1 except for changing the laser used for recording to the same one used in Example 2-3, and the evaluation results are shown in Table 4-1.

COMPARATIVE EXAMPLE 4-3

Optical recording media were prepared according to the same method as in Example 4-1 except for using no croconic methine dye. After the recording layers of the optical recording media were made blue, writing and reading of recording was practiced under the conditions of Example 4-1, Comparative examples 4-1, 4-2. Evaluation of recording was practiced in the same manner as in Example 4-1, and the results are shown in Table 4-1.

TABLE 4-1

| Example No. | Built-up degree of film | Writing condition | Sensitivity | Resolution | Image density | C/N ratio |
|---|---|---|---|---|---|---|
| Example 4-1 | 1 | Example 4-1 | ◉ | ◉ | 0.8 | 4 |
| | 21 | Example 4-1 | ◉ | ◉ | 2.4 | 45 |
| | 41 | Example 4-1 | ◉ | ◉ | 3.0 | 54 |
| | 81 | Example 4-1 | ◉ | ◉ | 3.2 | 55 |
| Example 4-2 | 1 | Example 4-2 | ○ | ◉ | 0.7 | 4 |
| | 21 | Example 4-2 | ◉ | ◉ | 2.0 | 35 |
| | 41 | Example 4-2 | ◉ | ◉ | 2.4 | 45 |
| | 81 | Example 4-2 | ◉ | ◉ | 2.7 | 49 |
| Example 4-3 | 1 | Example 4-3 | ○ | ○ | 0.5 | 3 |
| | 21 | Example 4-3 | ○ | ◉ | 1.6 | 25 |
| | 41 | Example 4-3 | ○ | ◉ | 1.9 | 32 |
| | 81 | Example 4-3 | ◉ | ◉ | 2.3 | 43 |
| Comparative example 4-1 | 1 | Example 4-1 | X | X | — | — |
| | 21 | Example 4-1 | X | X | — | — |
| | 41 | Example 4-1 | X | X | — | — |
| | 81 | Example 4-1 | ○ | ○ | 0.8 | 4 |
| Comparative example 4-2 | 1 | Example 4-1 | X | X | — | — |
| | 21 | Example 4-1 | X | X | — | — |
| | 41 | Example 4-1 | X | X | — | — |
| | 81 | Example 4-1 | X | X | — | — |
| Comparative example 4-3 | 41 | Example 4-1 | X | X | — | — |
| | 41 | Comparative example 4-1 | X | X | — | — |
| | 41 | Comparative example 4-2 | X | X | — | — |

EXAMPLE 4-4

According to the same procedure as in Example 4-1 except for using a DA compound represented by $C_8H_{17}$—C≡C—C≡C—$C_2H_4$—COOH in place of the DA compound represented by $C_{12}H_{25}$—C≡C—C≡C—$C_8H_{16}$—COOH, an optical recording medium of monomolecular films built up in 21 layers were prepared. For the recording medium, writing and reading of recording were practiced under the same conditions as in Example 4-1. The evaluation results are shown in Table 4-2.

EXAMPLES 4-5 TO 4-8

According to the same procedure as in Example 4-2 except for using the croconic methine dyes represented by the formulae 4-1-14, 4-1-24, 4-1-35 and 4-1-39, respectively, in place of the croconic methine dye represented by the formula 4-1-6, optical recording media were prepared. For these recording media, writing and reading of recording were practiced under the same conditions. The evaluation results are shown in Table 4-2.

TABLE 4-2

| Example No. | Sensitivity | Resolution | Image density | C/N ratio |
|---|---|---|---|---|
| Example No. 4-4 | ◉ | ◉ | 3.0 | 54 |
| Example No. 4-5 | ◉ | ◉ | 2.9 | 50 |
| Example No. 4-6 | ◉ | ◉ | 2.8 | 50 |
| Example No. 4-7 | ◉ | ◉ | 2.9 | 50 |
| Example No. 4-8 | ◉ | ◉ | 3.0 | 53 |

EXAMPLE 4-9

The same experiment as in Example 1-8 was repeated except for using a croconic methine dye represented by the formula 4-1-6 in place of the AZ compound salt represented by the formula 1-1-1.

Writing and reading of recording were practiced under the same conditions as in Example 4-1. Evaluation of recording was conducted in the same manner as in Example 4-1, and the results are shown in Table 4-3.

TABLE 4-3

| Thickness of croconic methine dye layer | Built-up degree of monomolecular film | Sensitivity | Resolution | Image density | C/N ratio |
|---|---|---|---|---|---|
| 200Å | 7 | ◉ | ◉ | 1.0 | 6 |
|  | 21 | ◉ | ◉ | 2.3 | 43 |
|  | 41 | ○ | ◉ | 2.5 | 46 |
|  | 81 | ○ | ○ | — | — |
| 1000Å | 7 | ◉ | ◉ | 1.1 | 6 |
|  | 21 | ◉ | ◉ | 2.7 | 50 |
|  | 41 | ◉ | ◉ | 2.9 | 53 |
|  | 81 | ◉ | ◉ | 3.0 | 54 |

EXAMPLE 4-10

Experiment was carried out according to the same procedure as in Example 1-9 except for using the croconic methine dye represented by the formula 4-1-6 in place of the AZ compound salt represented by the formula 1-1-1.

The hetero-built-up films thus prepared (optical recording media) are shown in Table 4-4. The symbols and the numerals shown for the constitution of media have the same meanings as in Example 1-8 (CR means a croconic methine dye).

After the recording layers of these optical recording media were made blue films, writing and reading of recording were practiced under the same conditions as in Example 4-1. Evaluation of recording was conducted in the same manner as in Example 4-1 and the results are shown in Table 4-4.

TABLE 4-4

| Sample No. | Constitution of recording medium | Sensitivity | Resolution | Image density | C/N ratio |
|---|---|---|---|---|---|
| 1 | G/40CR/60DA | ◉ | ◉ | 3.0 | 54 |
| 2 | G/20CR/60DA/20CR | ◉ | ◉ | 3.1 | 55 |
| 3 | G/30DA/40CR/30DA | ◉ | ◉ | 3.1 | 55 |
| 4 | G/20x(2CR/3DA) | ◉ | ◉ | 3.2 | 56 |
| 5 | G/10x(4CR/6DA) | ◉ | ◉ | 3.2 | 56 |
| 6 | G/3x(2CR/2DA) | ◉ | ◉ | 1.6 | 7 |
| 7 | G/5x(2CR/2DA) | ◉ | ◉ | 1.7 | 9 |
| 8 | G/10x(5CR/5DA) | ◉ | ◉ | 3.2 | 55 |

G: Glass substrate
CR: Croconic methine dye
DA: Diacetylene derivative compound

EXAMPLE 5-1

The same experiment as in Example 1-1 was repeated except for using a polymethine compound represented by the formula 5-1-14 in place of the AZ compound represented by the formula 1-1-1. In addition, the recording writing was practiced in the same manner as in Example 2-1. The evaluation of recording writing was carried in the same manner as that in Example 1-1. The evaluation results are shown in Table 5-1.

EXAMPLE 5-2

On the four kinds of optical recording media prepared in Example 5-1, recording writing was practiced in the same manner as in Example 2-2. Reading of recording was carried out in the same manner as in Example 5-1.

Evaluation of recording was practiced similarly as in Example 5-1 and the evaluation results are shown in Table 5-1.

EXAMPLE 5-3 AND COMPARATIVE EXAMPLES 5-1, 5-2

Writing and reading of recording were practiced under the same conditions as in Example 5-1 except for changing the laser used for recording to the same one as in Example 2-3, and the evaluation results are shown in Table 5-1.

COMPARATIVE EXAMPLE 5-3

Optical recording media were prepared according to the same method as in Example 5-1 except for using no polymethine compound. After the recording layers of the optical recording media were made blue, writing and reading of recording were practiced under the conditions of Example 5-1, Comparative examples 5-1, 5-2. Evaluation of recording was practiced in the same manner as in Example 5-1, and the results are shown in Table 5-1.

TABLE 5-1

| Example No. | Built-up degree of film | Writing condition | Sensitivity | Resolution | Image density | C/N ratio |
|---|---|---|---|---|---|---|
| Example 5-1 | 1 | Example 5-1 | ⊚ | ⊚ | 0.8 | 4 |
| | 21 | Example 5-1 | ⊚ | ⊚ | 1.9 | 34 |
| | 41 | Example 5-1 | ⊚ | ⊚ | 2.4 | 45 |
| | 81 | Example 5-1 | ⊚ | ⊚ | 2.8 | 50 |
| Example 5-2 | 1 | Example 5-2 | ○ | ⊚ | 0.4 | 3 |
| | 21 | Example 5-2 | ○ | ⊚ | 1.6 | 25 |
| | 41 | Example 5-2 | ⊚ | ⊚ | 2.1 | 40 |
| | 81 | Example 5-2 | ⊚ | ⊚ | 2.6 | 47 |
| Example 5-3 | 1 | Example 5-3 | ○ | ⊚ | 0.5 | 3 |
| | 21 | Example 5-3 | ○ | ⊚ | 1.6 | 25 |
| | 41 | Example 5-3 | ○ | ⊚ | 1.8 | 30 |
| | 81 | Example 5-3 | ⊚ | ⊚ | 2.4 | 45 |
| Comparative example 5-1 | 1 | Example 5-1 | X | X | — | — |
| | 21 | Example 5-1 | X | X | — | — |
| | 41 | Example 5-1 | X | X | — | — |
| | 81 | Example 5-1 | ○ | ○ | 0.9 | 4 |
| Comparative example 5-2 | 1 | Example 5-1 | X | X | — | — |
| | 21 | Example 5-1 | X | X | — | — |
| | 41 | Example 5-1 | X | X | — | — |
| | 81 | Example 5-1 | X | X | — | — |
| Comparative example 5-3 | 81 | Example 5-1 | X | X | — | — |
| | 81 | Comparative example 5-1 | X | X | — | — |
| | 81 | Comparative example 5-2 | X | X | — | — |

EXAMPLE 5-4

According to the same procedure as in Example 5-1 except for using a DA compound represented by $C_8H_{17}-C\equiv C-C\equiv C-C_2H_4-COOH$ in place of the DA compound represented by $C_{12}H_{25}-C\equiv C-C\equiv C-C_8H_{16}-COOH$, an optical recording medium of monomolecular films built up in 21 layers were prepared. For the recording medium, writing and reading of recording were practiced under the same conditions as in Example 5-1. The evaluation results are shown in Table 5-2.

EXAMPLES 5-5 TO 5-8

According to the same procedure as in Example 5-4 except for using the polymethine compounds represented by the formulas 5-1-1, 5-1-5, 5-1-18 and 5-1-26, respectively, in place of the polymethine compound represented by the compound 5-1-14, optical recording media were prepared. For these recording media, writing and reading of recording were practiced under the same conditions as in Example 5-1. The evaluation results are shown in Table 5-2.

TABLE 5-2

| Example No. | Sensitivity | Resolution | Image density | C/N ratio |
|---|---|---|---|---|
| Example No. 5-4 | ○ | ⊚ | 2.6 | 49 |
| Example No. 5-5 | ⊚ | ⊚ | 2.6 | 49 |
| Example No. 5-6 | ⊚ | ⊚ | 2.4 | 47 |
| Example No. 5-7 | ⊚ | ⊚ | 2.5 | 48 |
| Example No. 5-8 | ⊚ | ⊚ | 2.5 | 48 |
| Example No. 5-9 | ⊚ | ⊚ | 2.4 | 47 |

EXAMPLE 5-9

Experiment was carried out according to the same procedure as in Example 1-8 except for using the polymethine compound represented by the formula 5-1-14 in place of the AZ compound salt represented by the formula 1-1-1.

Writing and reading of recording were practiced under the same conditions as in Example 5-1. Evaluation of recording was conducted in the same manner as in Example 5-1, and the results are shown in Table 5-3.

TABLE 5-3

| Thickness of layer containing polymethine dye | Built-up degree of monomolecular film | Sensitivity | Resolution | Image density | C/N ratio |
|---|---|---|---|---|---|
| 300Å | 7 | ⊚ | ⊚ | 1.2 | 6 |
| | 41 | ○ | ○ | 2.5 | 48 |
| | 101 | X | X | — | — |
| | 201 | X | X | — | — |
| 3000Å | 7 | ⊚ | ⊚ | 1.2 | 6 |
| | 41 | ⊚ | ⊚ | 2.7 | 50 |
| | 101 | ⊚ | ⊚ | 2.9 | 52 |

TABLE 5-3-continued

| Thickness of layer containing polymethine dye | Built-up degree of monomolecular film | Sensitivity | Resolution | Image density | C/N ratio |
|---|---|---|---|---|---|
| | 201 | ◎ | ◎ | 3.1 | 55 |

EXAMPLE 5-10

The same experiment as in Example 1-9 was repeated except for using a polymethine compound represented by the formula 5-1-14 in place of the AZ compound salt represented by the formula 1-1-1.

The hetero-built-up films thus prepared (optical recording media) are shown in Table 5-4. The symbols and the numerals shown for the constitution of media have the same meanings as in Example 1-8 (PM means a polymethine compound).

After the recording layers of these optical recording media were made blue films, writing and reading of recording were practiced under the same conditions as in Example 5-1. Evaluation of recording was conducted in the same manner as in Example 5-1 and the results are shown in Table 5-4.

TABLE 5-4

| Sample No. | Constitution of recording meidum | Sensitivity | Resolution | Image density | C/N ratio |
|---|---|---|---|---|---|
| 1 | G/40PM/60DA | ○ | ◎ | 2.9 | 50 |
| 2 | G/20PM/60DA/20PM | ◎ | ◎ | 3.0 | 52 |
| 3 | G/30DA/40PM/30DA | ◎ | ◎ | 3.0 | 52 |
| 4 | G/20x(2PM/3DA) | ◎ | ◎ | 3.2 | 56 |
| 5 | G/10x(4PM/6DA) | ◎ | ◎ | 3.2 | 56 |
| 6 | G/3x(2PM/2DA) | ◎ | ◎ | 1.6 | 7 |
| 7 | G/5x(2PM/2DA) | ◎ | ◎ | 1.7 | 8 |
| 8 | G/10x(5PM/5DA) | ◎ | ◎ | 3.2 | 55 |

EXAMPLE 6-1

One part by weight of fine crystalline powder of a diacetylene derivative represented by the formula $C_{12}H_{25}-C\equiv C-C\equiv C-C_8H_{16}-COOH$ and 1 part by weight of the AZ compound represented by the formula 1-1-1 were added to 4 parts by weight of methylene chloride, followed by thorough stirring, to prepare a coating solution.

Next, a disc substrate made of a glass (thickness 1.5 mm, diameter 20 mm) was mounted on a spinner coating machine, and the above coating solution was added in a small amount dropwise at the central portion of the disc substrate and thereafter the spinner was rotated at a predetermined rotational number for a predetermined time to effect coating, followed by drying at ordinary temperature, to prepare optical recording media with thicknesses of coated films after drying of 500 Å, 1000 Å and 2000 Å, respectively.

On these optical recording media were irradiated uniformly and sufficiently UV-rays of 254 nm to polymerize the DA compound in the recording layers, thereby converting the recording layers to blue films.

For these optical recording media, by means of the recording device shown in FIG. 1, recording writing was practiced according to the recording conditions shown below following the input information.
Semiconductor laser wavelength: 830 nm
Laser beam diameter: 1 μm
Laser output: 3 mW
Irradiation time of laser beam per 1 bit: 200 ns.

When laser beam was irradiated on the blue surface of the optical recording medium, the irradiated portion was changed in color to red to effect recording writing. For reading of recording, a semiconductor laser with wavelength of 680 nm and an output of 1 mW was used as the reading light source, and the reflected light was received with the photodetector (PN junction photodiode).

Evaluation of the recording writing was practiced in the same manner as in Example 1-1. The evaluation results are shown in Table 6-1.

EXAMPLE 6-2

On the three kinds of recording media prepared in Example 6-1, UV-rays of 254 nm were irradiated uniformly and sufficiently to convert the recording layers to blue films, and then recording writing was practiced following the input information under the following conditions.
Laser wavelength: 870 nm
Laser beam diameter: 1 μm
Laser output: 3 mW
Irradiation time of laser beam per 1 bit: 200 ns.

Reading and evaluation of recording were practiced in the same manner as in Example 6-1, and the evaluation results are shown in Table 6-1.

COMPARATIVE EXAMPLE 6-1

On the three kinds of recording media prepared in Example 6-1, UV-rays of 254 nm were irradiated uniformly and sufficiently to convert the recording layers to blue films, and then recording writing was practiced following the input information under the following conditions.
Laser wavelength: 790 nm
Laser beam diameter: 1 μm
Laser output: 3 mW
Irradiation time of laser beam per 1 bit: 200 ns.

Reading and evaluation of recording were practiced in the same manner as in Example 6-1, and the evaluation results are shown in Table 6-1.

EXAMPLE 6-3

On the same disc substrate made of a glass used in Example 6-1, first a coated film with a thickness of 1000 Å after drying was formed in the same manner as in Example 6-1 by use of a coating solution obtained by dissolving 1 part by weight of the AZ compound salt represented by the formula 1-1-1 in 2 parts by weight of methylene chloride. Next, a coating solution obtained by dispersing and dissolving 1 part by weight of fine crystalline powder of the diacetylene derivative compound used in Example 6-1 and 1 part by weight of nitrocellulose as the binder in 4 parts by weight of methylene chloride was applied on the coated film of the AZ compound salt to form a coated film with a thickness of 1000 Å after drying in the same manner as described above. After the recording layer of this optical recording medium was converted to a blue film, writing and reading of recording were practiced under the same recording conditions as in Example 6-1. Evaluation of recording was practiced in the same manner as in Example 6-1 and the evaluation results are shown in Table 6-1.

COMPARATIVE EXAMPLE 6-2

Without use of the AZ compound salt, by use of a solution of 1 part by weight of the diacetylene derivative compound and 1 part by weight of nitrocellulose dissolved in 2 parts by weight of methylene chloride, a recording medium was prepared in the same manner as in Example 6-1. For this recording medium, writing and reading were practiced under the three kinds of conditions used in Example 6-1, Example 6-2 and Comparative example 6-1. The evaluation results are shown in Table 6-1.

TABLE 6-1

| Example No. | Film thickness of recording | Recording condition | Sensitivity | Resolution | Image density | C/N ratio |
|---|---|---|---|---|---|---|
| Example 6-1 | 500Å | Example 6-1 | ◎ | ◎ | 1.6 | 38 |
| | 1000Å | Example 6-1 | ◎ | ◎ | 2.1 | 43 |
| | 2000Å | Example 6-1 | ◎ | ◎ | 2.7 | 50 |
| Example 6-2 | 500Å | Comparative example 6-1 | X | X | / | / |
| | 1000Å | Comparative example 6-1 | O | O | 1.6 | 40 |
| | 2000Å | Comparative example 6-1 | O | O | 2.2 | 43 |
| Comparative example 6-1 | 500Å | Comparative example 6-2 | X | X | / | / |
| | 1000Å | Comparative example 6-2 | X | X | / | / |
| | 2000Å | Comparative example 6-2 | O | O | 2.1 | 42 |
| Example 6-3 | 1000Å | Example 6-1 | ◎ | ◎ | 2.7 | 48 |
| Comparative example 6-2 | 1000Å | Example 6-1 | X | X | / | / |
| | 1000Å | Comparative example 6-1 | X | X | / | / |
| | 1000Å | Comparative example 6-2 | X | X | / | / |

EXAMPLE 6-4

According to the same procedure as in Example 6-1 except for using a diacetylene derivative compound represented by $C_8H_{17}-C\equiv C-C\equiv C-C_2H_4-COOH$ in place of the diacetylene derivative compound represented by $C_{12}H_{25}-C\equiv C-C\equiv C-C_8H_{16}-COOH$, an optical recording medium was prepared. For the recording medium, recording and reproducing were practiced under the same conditions as in Example 6-1. The evaluation results are shown in Table 6-2.

EXAMPLES 6-5 TO 6-8

According to the same procedure as in Example 6-1 except for using the AZ compound salts represented by the formulae 1-1-3, 1-1-8, 1-1-12, 1-1-15, in place of the AZ compound salt represented by the formula 1-1-1, optical recording media were prepared. For each of these recording media, recording was practiced under the same conditions as in Example 6-1. The evaluation results are shown in Table 6-2.

TABLE 6-2

| Recording medium | Film thickness | Sensitivity | Resolution | Image density | C/N ratio |
|---|---|---|---|---|---|
| Example 6-4 | 500Å | ◎ | ◎ | 1.5 | 35 |
| | 1000Å | ◎ | ◎ | 2.0 | 45 |
| | 2000Å | ◎ | ◎ | 3.0 | 52 |
| Example 6-5 | 500Å | ◎ | ◎ | 1.6 | 33 |
| | 1000Å | ◎ | ◎ | 2.2 | 47 |
| | 2000Å | ◎ | O | 3.1 | 55 |
| Example 6-6 | 500Å | O | ◎ | 1.4 | 20 |
| | 1000Å | ◎ | ◎ | 2.0 | 45 |
| | 2000Å | ◎ | O | 2.8 | 50 |
| Example 6-7 | 500Å | ◎ | ◎ | 1.6 | 22 |
| | 1000Å | ◎ | ◎ | 2.2 | 46 |
| | 2000Å | ◎ | ◎ | 2.6 | 49 |
| Example 6-8 | 500Å | ◎ | ◎ | 1.5 | 34 |
| | 1000Å | ◎ | ◎ | 2.2 | 46 |
| | 2000Å | ◎ | ◎ | 3.0 | 54 |

EXAMPLE 7-1

Experiments were carried out in the same manner as in Example 6-1 except for using a pyrylium dye represented by the formula 2-1-5 in place of the AZ compound represented by the formula 1-1-1.

Writing of recording was practiced according to the same method as in Example 6-1 except for changing the irradiation time of laser beam per 1 bit to 300 ns.

Evaluation of writing of recording was practiced in the same manner as in Example 1-1. The evaluation results are shown in Table 7-1.

EXAMPLE 7-2

According to the same procedure as in Example 7-1, except for changing the laser wavelength to 800 nm, on the three kinds of optical recording media prepared in Example 7-1, writing of recording was practiced and reading of recording was practiced in the same manner as in Example 7-1.

Evaluation of recording was practiced according to the same standards as in Example 7-1 and the evaluation results are shown in Table 7-1.

EXAMPLE 7-3, COMPARATIVE EXAMPLES 7-1, 7-2

Except for changing the laser used for recording to that used in Example 2-2, writing and reading of recording were practiced under the same conditions as in Example 7-1, and the evaluation results are shown in Table 7-1.

EXAMPLE 7-4

Experiments were carried out in the same manner as in Example 6-3, except for using a pyrylium dye represented by the formula 2-1-5 in place of the AZ compound salt represented by the formula 1-1-1.

Writing and reading of recording were practiced under the same conditions as in Example 7-1. Evaluation of recording was practiced in the same manner as in Example 7-1 and the evaluation results are shown in Table 7-1.

COMPARATIVE EXAMPLE 7-3

Without use of the pyrylium dye, by use of a solution of 1 part by weight of the diacetylene derivative compound and 1 part by weight of nitrocellulose dissolved in 4 parts by weight of methylene chloride as the coating solution, an optical recording medium was prepared in the same manner as in Example 7-1. For this recording medium, writing and reading of recording were practiced under the conditions of Example 7-1, Comparative examples 7-1, 7-2, respectively. The evaluation results are shown in Table 7-1.

For this optical recording medium, without practicing irradiation of UV-rays, the semiconductor laser beam was irradiated directly following the input information, by varying variously the wavelength and the irradiation time of the laser beam (irradiation time 500 ns/bit–5 μs/bit) on the predetermined position on the surface of the recording medium at the same output as in Example 7-1, thereby practicing writing of recording by formation of pit. For this recording medium, as the result of observation by a microscope, it was found that an irradiation time of 2 μs or longer was required for clear formation of one pit.

EXAMPLE 7-5

According to the same procedure as in Example 7-1 except for using a diacetylene derivative compound represented by $C_8H_{17}-C\equiv C-C\equiv C-C_2H_4-COOH$ in place of the diacetylene derivative compound represented by $C_{12}H_{25}-C\equiv C-C\equiv C-C_8H_{16}-COOH$, an optical recording medium was prepared. For the recording medium, recording and reproduction were practiced under the same conditions as in Example 7-1. The evaluation results are shown in Table 7-2.

EXAMPLES 7-6 TO 7-9

Similar experiments were carried out by changing the pyrylium dye in Example 7-1 to the pyrylium dyes represented by the formulae 2-1-7, 2-1-6, 2-1-14 and 2-1-16, respectively. The results are shown in Table 7-2.

TABLE 7-1

| Example No. | Film thickness of recording | Writing Condition | Sensitivity | Resolution | Image density | C/N ratio |
|---|---|---|---|---|---|---|
| Example 7-1 | 500Å | Example 7-1 | ⊙ | ⊙ | 1.5 | 35 |
|  | 1000Å | Example 7-1 | ⊙ | ⊙ | 2.2 | 45 |
|  | 2000Å | Example 7-1 | ⊙ | ⊙ | 2.5 | 50 |
| Example 7-2 | 500Å | Example 7-2 | ○ | ⊙ | 1.2 | 26 |
|  | 1000Å | Example 7-2 | ○ | ⊙ | 2.0 | 43 |
|  | 2000Å | Example 7-2 | ⊙ | ⊙ | 2.4 | 48 |
| Example 7-3 | 500Å | Example 7-3 | ⊙ | ⊙ | 1.4 | 34 |
|  | 1000Å | Example 7-3 | ⊙ | ⊙ | 2.1 | 44 |
|  | 2000Å | Example 7-3 | ⊙ | ○ | 2.3 | 48 |
| Comparative example 7-1 | 500Å | Comparative example 7-1 | X | X | — | — |
|  | 1000Å | Comparative example 7-1 | X | X | — | — |
|  | 2000Å | Comparative example 7-1 | ○ | ○ | 0.6 | 3 |
| Comparative example 7-2 | 500Å | Comparative example 7-2 | X | X | — | — |
|  | 1000Å | Comparative example 7-2 | X | X | — | — |
|  | 2000Å | Comparative example 7-2 | X | X | — | — |
| Example 7-4 | 3000Å | Example 7-1 | ⊙ | ⊙ | 2.5 | 50 |
| Comparative example 7-3 | 3000Å | Example 7-1 | X | X | — | — |
|  | 3000Å | Comparative example 7-1 | X | X | — | — |
|  | 3000Å | Comparative example 7-2 | X | X | — | — |

COMPARATIVE EXAMPLE 7-4

Without use of the diacetylene derivative compound, by use of a solution of 1 part by weight of the pyrylium dye and 1 part by weight of nitrocellulose in 3 parts by weight of methylene chloride as the coating solution, an optical recording medium having a recording layer of 5000 Å thickness was prepared according to the same method as in Example 7-1.

TABLE 7-2

| Optical recording medium | Film thickness | Sensitivity | Resolution | Image density | C/N ratio |
|---|---|---|---|---|---|
| Example 7-5 | 500Å | ⊙ | ⊙ | 1.3 | 30 |
|  | 1000Å | ⊙ | ⊙ | 1.9 | 40 |
|  | 2000Å | ⊙ | ⊙ | 2.2 | 48 |
| Example 7-6 | 500Å | ○ | ○ | 1.0 | 20 |
|  | 1000Å | ○ | ○ | 2.0 | 42 |
|  | 2000Å | ⊙ | ⊙ | 2.2 | 47 |
| Example | 500Å | ⊙ | ⊙ | 1.6 | 30 |

TABLE 7-2-continued

| Optical recording medium | Film thickness | Sensitivity | Resolution | Image density | C/N ratio |
|---|---|---|---|---|---|
| 7-7 | 1000Å | ◉ | ◉ | 2.4 | 47 |
|  | 2000Å | ◉ | ◉ | 2.7 | 52 |
| Example 7-8 | 500Å | ○ | ○ | 1.0 | 20 |
|  | 1000Å | ◉ | ◉ | 1.8 | 36 |
|  | 2000Å | ◉ | ◉ | 2.3 | 47 |
| Example 7-9 | 500Å | ◉ | ◉ | 1.5 | 30 |
|  | 1000Å | ◉ | ◉ | 2.2 | 45 |
|  | 1000Å | ◉ | ◉ | 2.5 | 20 |

EXAMPLE 8-1

Experiments were carried out in the same manner as in Example 7-1 except for using a diene compound salt represented by the formula 3-1-1 in place of the pyrylium dye represented by the formula 2-1-5.

Evaluation of writing of recording was practiced in the same manner as in Example 1-1. The evaluation results are shown in Table 8-1.

EXAMPLE 8-2

According to the same procedure as in Example 7-2, on the three kinds of optical recording media prepared in Example 8-1, recording was practiced and reading of recording was practiced in the same manner as in Example 8-1.

Evaluation of recording was practiced according to the same standards as in Example 8-1 and the evaluation results are shown in Table 8-1.

EXAMPLE 8-3, COMPARATIVE EXAMPLES 8-1, 8-2

Except for changing the laser used for recording to that used in Example 2-2, writing and reading of recording were practiced under the same conditions as in Example 8-1, and the evaluation results are shown in Table 8-1.

EXAMPLE 8-4

Experiments were carried out in the same manner as in Example 6-1, except for using a diene compound salt represented by the formula 3-1-1 in place of the AZ compound salt represented by the formula 1-1-1 to prepare an optical recording medium having a recording layer of the two layer separated structure. After the recording layer of this optical recording medium was converted to a blue film, writing and reading of recording were practiced under the same conditions as in Example 8-1. Evaluation of recording was practiced in the same manner as in Example 8-1 and the evaluation results are shown in Table 8-1.

COMPARATIVE EXAMPLE 8-3

Without use of the diene compound salt, by use of a solution of 1 part by weight of the diacetylene derivative compound and 1 part by weight of nitrocellulose dissolved in 4 parts by weight of methylene chloride as the coating solution, an optical recording medium was prepared in the same manner as in Example 8-1. For this recording medium, writing and reading of recording were practiced under the conditions of Example 8-1 Comparative examples 8-1, 8-2, respectively. The evaluation results are shown in Table 8-1.

TABLE 8-1

| Example No. | Film thickness of recording | Writing condition | Sensitivity | Resolution | Image density | C/N ratio |
|---|---|---|---|---|---|---|
| Example 8-1 | 500Å | Example 8-1 | ◉ | ◉ | 1.5 | 7 |
|  | 1000Å | Example 8-1 | ◉ | ◉ | 2.0 | 35 |
|  | 2000Å | Example 8-1 | ◉ | ◉ | 2.5 | 47 |
| Example 8-2 | 500Å | Example 8-2 | ○ | ◉ | 1.2 | 6 |
|  | 1000Å | Example 8-2 | ○ | ◉ | 1.9 | 33 |
|  | 2000Å | Example 8-2 | ◉ | ◉ | 2.3 | 45 |
| Example 8-3 | 500Å | Example 8-3 | ○ | ◉ | 1.3 | 5 |
|  | 1000Å | Example 8-3 | ○ | ○ | 1.8 | 30 |
|  | 2000Å | Example 8-3 | ○ | ○ | 2.3 | 45 |
| comparative example 8-1 | 500Å | Comparative example 8-1 | X | X | — | — |
|  | 1000Å | Comparative example 8-1 | X | X | — | — |
|  | 2000Å | Comparative example 8-1 | ○ | ○ | 0.7 | 3 |
| Comparative example 8-2 | 500Å | Comparative example 8-2 | X | X | — | — |
|  | 1000Å | Comparative example 8-2 | X | X | — | — |
|  | 2000Å | Comparative example 8-2 | X | X | — | — |
| Example 8-4 | 3000Å | Example 8-1 | ◉ | ◉ | 2.4 | 45 |
| Comparative example 8-3 | 3000Å | Example 8-1 | X | X | — | — |
|  | 3000Å | Comparative example 8-1 | X | X | — | — |
|  | 3000Å | Comparative example 8-2 | X | X | — | — |

COMPARATIVE EXAMPLE 8-4

Without use of the diacetylene derivative compound, by use of a solution of 1 part by weight of the diene compound salt and 1 part by weight of nitrocellulose in 4 parts by weight of methylene chloride as the coating solution, an optical recording medium having a recording layer of 1000 Å was prepared according to the same method as in Example 8-1.

For this optical recording medium, without practicing irradiation of UV-rays, the semiconductor laser beam was irradiated directly following the input information, by varying variously the wavelength and the irradiation time of the laser beam (irradiation time 500 ns/bit-5 μs/bit) on the predetermined position on the surface of the recording medium at the same output as in Example 8-1, thereby practicing writing of recording by formation of pit. For this recording medium, as the result of observation by a microscope, it was found that an irradiation time of 4 μs or longer was required for clear formation of one pit.

EXAMPLE 8-5

According to the same procedure as in Example 8-1 except for using a diacetylene derivative compound represented by $C_8H_{17}-C\equiv C-C\equiv C-C_2H_4-COOH$ in place of the diacetylene derivative compound represented by $C_{12}H_{25}-C\equiv C-C\equiv C-C_8H_{16}-COOH$, an optical recording medium was prepared. For the recording medium, recording and reproduction were practiced under the same conditions as in Example 8-1. The evaluation results are shown in Table 8-2.

EXAMPLES 8-6 TO 8-10

Optical recording media were prepared according to the same method as in Example 8-1 except for using the diene compound salts represented by the formulae 3-1-3, 3-1-8, 3-1-12, 3-1-15 and 3-1-20, respectively, in place of the diene compound salt represented by the formula 3-1-1. For these optical recording media, recording and reproduction were practiced under the same conditions as in Example 8-1. The evaluation results are shown in Table 8-2.

TABLE 8-2

| Optical recording medium | Film thickness | Sensitivity | Resolution | Image density | C/N ratio |
|---|---|---|---|---|---|
| Example 8-5 | 500Å | ◎ | ◎ | 1.4 | 7 |
|  | 1000Å | ◎ | ◎ | 1.9 | 30 |
|  | 2000Å | ◎ | ◎ | 2.4 | 45 |
| Example 8-6 | 500Å | ◎ | ◎ | 1.6 | 7 |
|  | 1000Å | ◎ | ◎ | 2.1 | 43 |
|  | 2000Å | ◎ | ◎ | 2.6 | 49 |
| Example 8-7 | 500Å | ○ | ○ | 1.2 | 6 |
|  | 1000Å | ○ | ○ | 1.8 | 30 |
|  | 2000Å | ○ | ○ | 2.3 | 45 |
| Example 8-8 | 500Å | ◎ | ◎ | 1.5 | 7 |
|  | 1000Å | ◎ | ◎ | 2.1 | 38 |
|  | 2000Å | ◎ | ◎ | 2.5 | 47 |
| Example 8-9 | 500Å | ◎ | ◎ | 1.4 | 8 |
|  | 1000Å | ◎ | ◎ | 2.1 | 39 |
|  | 2000Å | ◎ | ◎ | 2.4 | 45 |
| Example 8-10 | 500Å | ○ | ○ | 1.3 | 7 |
|  | 1000Å | ○ | ○ | 1.8 | 30 |
|  | 2000Å | ○ | ○ | 2.2 | 45 |

EXAMPLE 9-1

Experiments were carried out in the same manner as in Example 6-1 except for using 15 parts by weight of the croconic methine dye represented by the formula 4-1-25 and 20 parts by weight of methylene chloride in place of 1 part by weight of the AZ compound salt represented by the formula 1-1-1 and 4 parts by weight of methylene chloride, respectively.

Writing of recording was practiced in the same manner as in Example 7-1.

Evaluation of writing of recording was practiced in the same manner as in Example 1-1. The evaluation results are shown in Table 9-1.

EXAMPLE 9-2

According to the same procedure as in Example 7-2, on the three kinds of optical recording media prepared in Example 9-1, recording was practiced.

Evaluation of recording was practiced according to the same standards as in Example 9-1 and the evaluation results are shown in Table 9-1.

EXAMPLE 9-3, COMPARATIVE EXAMPLES 9-1, 9-2

Except for changing the laser used for recording to that used in Example 2-2, recording was practiced under the same conditions as in Example 9-1, and the evaluation results are shown in Table 9-1.

EXAMPLE 9-4

Experiments were carried out in the same manner as in Example 6-1, except for using a croconic methine dye represented by the formula 4-1-25 in place of the AZ compound salt represented by the formula 1-1-1. Writing and reading of recording were practiced under the same conditions as in Example 9-1. Evaluation of recording was practiced in the same manner as in Example 9-1 and the evaluation results are shown in Table 9-1.

COMPARATIVE EXAMPLE 9-3

Without use of the croconic methine dye, by use of a solution of 1 part by weight of the diacetylene derivative compound and 1 part by weight of nitrocellulose dissolved in 4 parts by weight of methylene chloride as the coating solution, an optical recording medium was prepared in the same manner as in Example 9-1. For this recording medium, writing and reading of recording were practiced under the conditions of Example 9-1, Comparative examples 9-1, 9-2, respectively. The evaluation results are shown in Table 9-1.

TABLE 9-1

| Example No. | Film thickness of recording | Writing condition | Sensitivity | Resolution | Image density | C/N ratio |
|---|---|---|---|---|---|---|
| Example 9-1 | 500Å | Example 9-1 | ◎ | ◎ | 1.5 | 7 |
|  | 1000Å | Example 9-1 | ◎ | ◎ | 2.0 | 34 |
|  | 2000Å | Example 9-1 | ◎ | ◎ | 2.6 | 49 |
| Example 9-2 | 500Å | Example 9-2 | ○ | ◎ | 1.1 | 6 |
|  | 1000Å | Example 9-2 | ○ | ◎ | 2.0 | 34 |
|  | 2000Å | Example 9-2 | ◎ | ◎ | 2.5 | 47 |
| Example 9-3 | 500Å | Example 9-3 | ◎ | ◎ | 1.4 | 7 |
|  | 1000Å | Example 9-3 | ◎ | ◎ | 2.1 | 40 |
|  | 2000Å | Example 9-4 | ◎ | ◎ | 2.4 | 45 |
| Comparative example 9-1 | 500Å | Comparative example 9-1 | ○ | ◎ | 1.1 | 6 |
|  | 1000Å | Comparative example 9-1 | ◎ | ○ | 2.0 | 35 |
|  | 2000Å | Comparative | ◎ | ○ | 2.1 | 39 |

TABLE 9-1-continued

| Example No. | Film thickness of recording | Writing condition | Sensitivity | Resolution | Image density | C/N ratio |
|---|---|---|---|---|---|---|
| Comparative example 9-2 | 500Å | example 9-1 Comparative example 9-2 | X | X | — | — |
| | 1000Å | Comparative example 9-2 | X | X | — | — |
| | 2000Å | Comparative example 9-2 | X | X | — | — |
| Example 9-4 | 3000Å | Example 9-1 | ◉ | ◉ | 2.6 | 49 |
| Comparative example 9-3 | 3000Å | Example 9-1 | X | X | — | — |
| | 3000Å | Comparative example 9-1 | X | X | — | — |
| | 3000Å | Comparative example 9-2 | X | X | — | — |

EXAMPLE 9-5

According to the same procedure as in Example 9-1 except for using a diacetylene derivative compound represented by $C_{H17}$—C≡C—C≡C—$C_2H_4$—COOH in place of the diacetylene derivative compound represented by $C_{12}H_{25}$—C≡C—C≡C—$C_8H_{16}$—COOH, an optical recording medium was prepared. For the recording medium, recording was practiced under the same conditions as in Example 9-1. The evaluation results are shown in Table 9-2.

EXAMPLES 9-6 TO 9-9

Optical recording media were prepared according to the same method as in Example 9-1 except for using the croconic methine dyes represented by the formulae 4-1-2, 4-1-29, 4-1-37 and 4-1-42, respectively, in place of the croconic methine dye represented by the formula 4-1-25. For these optical recording media, recording was practiced under the same conditions as in Example 9-1. The evaluation results are shown in Table 9-2.

TABLE 9-2

| Recording medium | Film thickness | Sensitivity | Resolution | Image density | C/N |
|---|---|---|---|---|---|
| Example 9-5 | 500Å | ◉ | ◉ | 1.4 | 7 |
| | 1000Å | ◉ | ◉ | 2.2 | 41 |
| | 2000Å | ◉ | ◉ | 2.5 | 47 |
| Example 9-6 | 500Å | ◉ | ◉ | 1.3 | 7 |
| | 1000Å | ◉ | ◉ | 2.2 | 42 |
| | 2000Å | ◉ | ◉ | 2.6 | 49 |
| Example 9-7 | 500Å | ○ | ○ | 1.2 | 6 |
| | 1000Å | ◉ | ◉ | 2.1 | 40 |
| | 2000Å | ◉ | ◉ | 2.5 | 47 |
| Example 9-8 | 500Å | ◉ | ◉ | 1.3 | 6 |
| | 1000Å | ◉ | ◉ | 2.0 | 40 |
| | 2000Å | ◉ | ◉ | 2.5 | 47 |
| Example 9-9 | 500Å | ○ | ○ | 1.2 | 6 |
| | 1000Å | ○ | ○ | 2.0 | 40 |
| | 2000Å | ◉ | ◉ | 2.4 | 46 |

EXAMPLE 10-1

Experiments were carried out in the same manner as in Example 6-1 except for using a polymethine compound represented by the formula 5-1-14 in place of the AZ compound salt represented by the formula 1-1-1. Writing of recording was practiced in the same manner as in Example 7-1.

Evaluation of writing of recording was practiced in the same manner as in Example 1-1. The evaluation results are shown in Table 10-1.

EXAMPLE 10-2

According to the same procedure as in Example 7-2 on the three kinds of optical recording media prepared in Example 10-1, recording was practiced and reading of recording was practiced in the same manner as in Example 10-1.

Evaluation of recording was practiced according to the same standards as in Example 10-1 and the evaluation results are shown in Table 10-1.

EXAMPLE 10-3, COMPARATIVE EXAMPLES 10-1, 10-2

Except for changing the laser used for recording to that used in Example 2-2, writing and reading of recording were practiced under the same conditions as in Example 10-1, and the evaluation results are shown in Table 10-1.

EXAMPLE 10-4

Experiments were carried out in the same manner as in Example 6-3, except for using a polymethine compound represented by the formula 5-1-14 in place of the AZ compound salt represented by the formula 1-1-1. Writing and reading of recording were practiced under the same conditions as in Example 10-1. Evaluation of recording was practiced in the same manner as in Example 10-1 and the evaluation results are shown in Table 10-1.

COMPARATIVE EXAMPLE 10-3

Without use of the polymethine compound, by use of a solution of 1 part by weight of the diacetylene derivative compound and 1 part by weight of nitrocellulose dissolved in 4 parts by weight of methylene chloride as the coating solution, an optical recording medium was prepared in the same manner as in Example 10-1. For this recording medium, writing and reading of recording were practiced under the conditions of Example 10-1, Comparative examples 10-1, 10-2, respectively. The evaluation results are shown in Table 10-1.

TABLE 10-1

| Example No. | Film thickness of recording | Writing condition | Sensitivity | Resolution | Image density | C/N ratio |
|---|---|---|---|---|---|---|
| Example 10-1 | 500Å | Example 10-1 | ◉ | ◉ | 1.5 | 7 |

TABLE 10-1-continued

| Example No. | Film thickness of recording | Writing condition | Sensitivity | Resolution | Image density | C/N ratio |
|---|---|---|---|---|---|---|
| | 1000Å | Example 10-1 | ⊚ | ⊚ | 2.0 | 35 |
| | 2000Å | Example 10-1 | ⊚ | ⊚ | 2.6 | 49 |
| Example 10-2 | 500Å | Example 10-2 | ○ | ⊚ | 1.2 | 6 |
| | 1000Å | Example 10-2 | ○ | ⊚ | 1.9 | 33 |
| | 2000Å | Example 10-2 | ⊚ | ⊚ | 2.4 | 45 |
| Example 10-3 | 500Å | Example 10-3 | ○ | ⊚ | 1.3 | 5 |
| | 1000Å | Example 10-3 | ○ | ⊚ | 1.8 | 30 |
| | 2000Å | Example 10-3 | ○ | ⊚ | 2.3 | 45 |
| Comparative example 10-1 | 500Å | Comparative example 10-1 | X | X | — | — |
| | 1000Å | Comparative example 10-1 | X | X | — | — |
| | 2000Å | Comparative example 10-1 | X | X | — | — |
| Comparative example 10-2 | 500Å | Comparative example 10-2 | X | X | — | — |
| | 1000Å | Comparative example 10-2 | X | X | — | — |
| | 2000Å | Comparative example 10-2 | X | X | — | — |
| Example 10-4 | 3000Å | Example 10-1 | ⊚ | ⊚ | 2.4 | 45 |
| Comparative example 10-3 | 3000Å | Example 10-1 | X | X | — | — |
| | 3000Å | Comparative example 10-1 | X | X | — | — |
| | 3000Å | Comparative example 10-2 | X | X | — | — |

COMPARATIVE EXAMPLE 10-4

Without use of the diacetylene derivative compound, by use of a solution of 1 part by weight of the polymethine compound and 1 part by weight of nitrocellulose in 4 parts by weight of methylene chloride as the coating solution, an optical recording medium having a recording layer of 1000 Å was prepared according to the same method as in Example 10-1.

For this optical recording medium, without practicing irradiation of UV-rays, the semiconductor laser beam was irradiated directly following the input information, by varying variously the wavelength and the irradiation time of the laser beam (irradiation time 500 ns/bit-5 μs/bit) on the predetermined position on the surface of the recording medium at the same output as in Example 10-1, thereby practicing writing of recording by formation of pit. For this recording medium, as the result of observation by a microscope, it was found that an irradiation time of 4 μs or longer was required for clear formation of one pit.

EXAMPLE 10-5

According to the same procedure as in Example 10-1 except for using a diacetylene derivative compound represented by $C_8H_{17}—C≡C—C≡C—C_2H_4—COOH$ in place of the diacetylene derivative compound represented by $C_{12}H_{25}—C≡C—C≡C—C_8H_{16}—COOH$, an optical recording medium was prepared. For the recording medium, recording and reproduction were practiced under the same conditions as in Example 10-1. The evaluation results are shown in Table 10-2.

EXAMPLES 10-6 TO 10-9

Optical recording media were prepared according to the same method as in Example 10-1 except for using the polymethine compound represented by the formulae 5-1-1, 5-1-5, 5-1-18 and 5-1-26, respectively, in place of the polymethine compound represented by the formula 5-1-14. For these optical recording media, recording and reproduction were practiced under the same conditions as in Example 10-1. The evaluation results are shown in Table 10-2.

TABLE 10-2

| Optical recording medium | Film thickness | Sensitivity | Resolution | Image density | C/N ratio |
|---|---|---|---|---|---|
| Example 10-5 | 500Å | ⊚ | ⊚ | 1.4 | 7 |
| | 1000Å | ⊚ | ⊚ | 2.0 | 35 |
| | 2000Å | ⊚ | ⊚ | 2.4 | 45 |
| Example 10-6 | 500Å | ⊚ | ○ | 1.4 | 8 |
| | 1000Å | ⊚ | ○ | 2.1 | 43 |
| | 2000Å | ⊚ | ○ | 2.6 | 49 |
| Example 10-7 | 500Å | ⊚ | ⊚ | 1.5 | 7 |
| | 1000Å | ⊚ | ⊚ | 2.1 | 43 |
| | 2000Å | ⊚ | ⊚ | 2.5 | 47 |
| Example 10-8 | 500Å | ⊚ | ○ | 1.5 | 7 |
| | 1000Å | ⊚ | ○ | 2.0 | 35 |
| | 2000Å | ⊚ | ○ | 2.6 | 47 |
| Example 10-9 | 500Å | ○ | ⊚ | 1.5 | 7 |
| | 1000Å | ○ | ⊚ | 2.0 | 35 |
| | 2000Å | ○ | ○ | 2.6 | 49 |

In the following, the effects obtained by the recording medium and the recording method of the present invention are enumerated.

(1) Since the recording layer contains a compound of the groups B which can absorb the IR-rays with wavelength ranging from 800 to 900 nm, optical writing can be practiced by use of a small scale and lightweight semiconductor laser radiating UV-rays of 800 to 900 nm, and also reading is possible by a small scale and lightweight semiconductor laser or emission diode radiating a visible light with wavelengths ranging from 550 to 750 nm. Also, since the reading light has a wavelength shorter than that of the writing light, recording will not be practiced during reading by the reading light, and further there is the advantage that resolution is good and the spot form can be narrowed to give good efficiency with the use of shorter wavelength.

(2) Since the optical recording medium employed comprises at least the DA compound in the recording layer, which is formed as (mixed) monomolecular film or its built-up films and has high density and high orderliness, high density and homogeneous optical writing and optical reading can be practiced.

(3) Since the present invention is the recording and reproduction method by utilizing change in hue of the recording layer by light irradiation, high speed, high density and high sensitivity optical writing can be practiced, and also high speed and high precision optical reading can be practiced.

(4) Particularly, when an optical recording medium formed as the hetero film having two or more bonded surfaces between a heat-sensitive color change layer comprising a DA compound and a radiation absorbing layer comprising at least one compound selected from the group B formed as a monomolecular film or its built-up films, respectively, is used, the heat transmission efficiency within the optical recording medium is extremely high, and therefore high sensitivity optical writing can be practiced.

We claim:

1. An optical recording-reproducing method comprising the steps of:
   irradiating an optical recording medium using sufficient UV irradiation to cause polymerization, said recording medium having a recording layer containing a diacetylene derivative compound and at least one of the group (B) consisting of azulenium salt compounds, pyrylium dyes, diene compounds, croconic methine dyes and polymethine compounds;
   irradiating said optical recording medium with infrared irradiation in a manner to record information to thereby change the color of a portion of the recording layer; and
   reading the recorded information by irradiating said recording layer with light having a shorter wavelength than said recording radiation.

2. An optical recording-reproducing method according to claim 1, wherein said diacetylene derivative compound is represented by the formula (I):

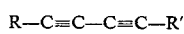

R—C≡C—C≡C—R'  (I)

(wherein R and R' are independently selected from the group consisting of an alkyl group, an olefinic hydrocarbon group, a phenyl, a fused polycyclic aromatic hydrocarbon group, a chain polycyclic phenyl group, other non-polar group, a carboxyl group and its metal salt or amine salt, a sulfonic acid group and its metal salt or amine salt, a sulfoamide group, an amide group, an amino group, an imino group, a hydroxy group, a quaternary ammonium group, an oxyamino group, a diazonium group a guanidine group, a hydrazine group, a phosphoric acid group, a silicic acid group, an aluminic acid group, a nitrile group, a thioalcoholic group).

3. An optical recording-reproducing method according to claim 1, wherein the azulenium salt compounds of said group B are represented by the formula (II):

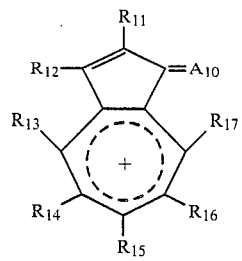

(wherein $R_{11}$–$R_{17}$ independently represent a hydrogen atom, a halogen atom or a monovalent organic radical, and $A_{10}$ is a divalent organic residue which is bonded through a double bond.

4. An optical recording-reproducing method according to claim 1, wherein the pyrylium type dyes of said group B have the structure represented by the formula (III) shown below:

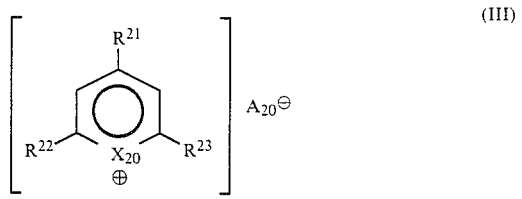

(wherein $X_{20}$ represents an oxygen atom, a sulfur atom or a selenium atom, $R_{21}$, $R_{22}$, and $R_{23}$ represent organic radicals, and $A_{20}$ represents an anion).

5. An optical recording-reproducing method according to claim 1, wherein the diene compounds of said group (B) are represented by the formula (IV) or (V) shown below:

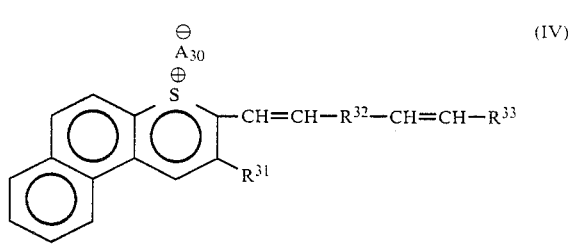

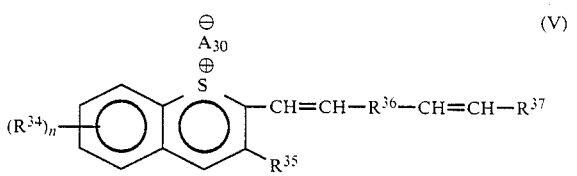

(wherein $R^{31}$ represents an alkyl group, a phenyl group or a substituted or unsubstituted styryl group; $R^{32}$ and $R^{36}$ each represent a substituted or unsubstituted arylene group and form a conjugated double bond system together with the two —CH=CH— groups adjacent thereto; $R^{33}$ and $R^{37}$ represent a phenyl group or a substituted or unsubstituted naphthyl group; $R^{34}$ represents an alkoxy group; $R^{35}$ represents alkyl group; and $A_{30}$ represents anion radical).

6. An optical recording-reproducing method according to claim 1, wherein croconic methine dyes of said group B have the structure represented by the formula (VI) shown below:

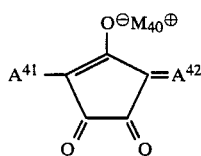

(wherein $M_{40}\oplus$ represents metal ion, $A^{41}$ and $A^{42}$ represent substituents containing an aromatic ring or a heterocyclic ring).

7. An optical recording-reproducing method according to claim 1, wherein polymethine compounds of said group (B) are represented by the formula (VII) or (VIII) shown below:

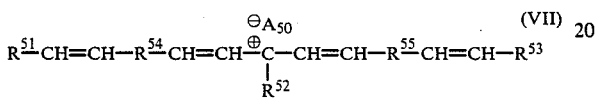

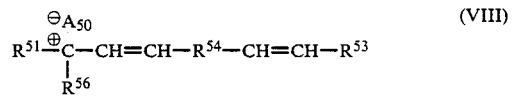

wherein $R^{51}$, $R^{52}$ and $R^{53}$ each independently represent a substituted or unsubstituted aryl group; $R^{54}$ and $R^{55}$ represent a substituted or unsubstituted arylene group and form a conjugated double bond system together with two —CH=CH— groups adjacent thereto; $R^{56}$ represents hydrogen or a substituted or unsubstituted aryl group; and $A_{50}$ represents anion radical).

8. An optical recording-reproducing method according to claim 1, wherein the reading light with a shorter wavelength than said radiation is a visible light.

9. An optical reproducing-reproducing method according to claim 1, wherein an IR-ray of 800–900 nm is used as said IR-ray.

10. An optical recording-reproducing method according to claim 8, wherein said visible light is a visible light of 500–750 nm.

11. An optical recording-reproducing method according to claim 1, wherein the recording layer has been produced using a Langmuir-Blodgett technique.

12. An optical recording-reproducing method according to claim 11, wherein said recording layer is a mixed monomolecular film or a built-up mixed monomolecular film of said diacetylene derivative compound and the compound selected from the group B.

13. An optical recording-reproducing method according to claim 12, wherein said mixed monomolecular film or built-up mixed monomolecular film has a film thickness of about 500 Å to 2 μm.

14. An optical recording-reproducing method according to claim 12, wherein the weight ratio of the diacetylene derivative compound to the compound of said group B in the recording layer of said mixed monomolecular film or built-up mixed monomolecular film is about 1/15 to 15/1.

15. An optical recording-reproducing method according to claim 11, wherein the recording layer comprises two layers of a layer comprising a monomolecular film of said diacetylene derivative compound or a built-up film thereof and a layer containing at least one compound selected from the group B.

16. An optical recording-reproducing method according to claim 15, wherein of the recording medium comprising said two layers, the monomolecular film of the diacetylene derivative compound or the built-up films has a film thickness of up to about 400 built-up layers, and the layer having the compound selected from the group B has a film thickness of up to about 200 built-up layers.

17. An optical recording-reproducing method according to claim 11, wherein the recording layer comprises one or more layer comprising a monomolecular film of said diacetylene derivative compound or a built-up film thereof and one or more layer comprising a monomolecular film containing a compound selected from the group B or a built-up film thereof laminated on one another.

18. An optical recording-reproducing method according to claim 17, wherein the total of the film thickness of the layer of the compound selected from the group B of said laminate is that of about 200 built-up layers.

19. An optical recording-reproducing method according to claim 1, wherein the compound selected from said group B is arranged between organic molecules to form a monomolecular film or built-up monomolecular film.

20. An optical recording-reproducing method comprising the steps of:
   irradiating an optical recording medium with infrared irradiation in a manner to record information having a recording layer containing a polydiacetylene derivative compound and at least one of the group (B) consisting of azulenium salt compounds, pyrylium dyes, diene compounds, croconic methine dyes and polymethine compounds to thereby change the color at the irradiate portion of the recording layer; and
   recording information by irradiating said reading the recorded layer with light having a shorter wavelength than said recording radiation.

21. An optical recording-reproducing method according to claim 20, wherein the monomer for said polydiacetylene derivative compound is represented by the formula (I):

(wherein R and R' are independently selected from the group consisting of an alkyl group, an olefinic hydrocarbon group, phenyl, a fused polycyclic aromatic hydrocarbon group, a chain polycyclic phenyl group, other non-polar groups, a carboxyl group and its metal salt or amine salt, a sulfonic acid group and its metal salt or amine salt, a sulfoamide group, an amide group, an amino group, an imino group, a hydroxy group, a quaternary ammonium group, an oxyamino group, a diazonium group, a guanidine group, a hydrazine group, a phosphoric acid group, a silicic acid group, an aluminic acid group, a nitrile group, a thioalcoholic group).

22. An optical recording-reproducing method according to claim 20, wherein the azulenium salt compounds of said group B are represented by the formula (II):

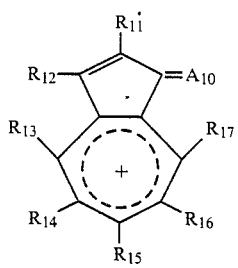

(II)

(wherein $R_{11}$–$R_{17}$ independently represent hydrogen atom, halogen atom or monovalent organic radical, and $A_{10}$ is a divalent organic residue which is bonded through a double bond).

23. An optical recording-reproducing method according to claim 20, wherein the pyrylium type dyes of said group B have the structure represented by the formula (III) shown below:

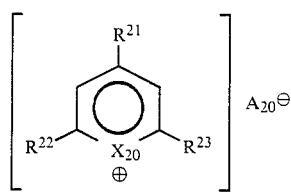

(III)

(wherein $X_{20}$ represents an oxygen atom, a sulfur atom or a selenium atom, $R^{21}$ $R^{22}$ and $R^{23}$ represent organic radicals, and $A_{20}$ represents an anion).

24. An optical recording-reproducing method according to claim 20, wherein the diene compounds of said group (B) are represented by the formula (IV) or (V) shown below:

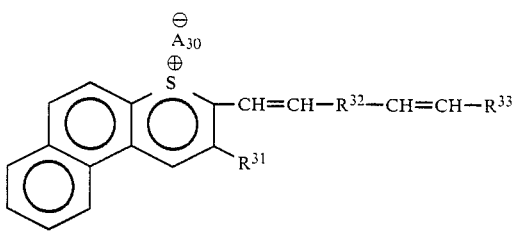

(IV)

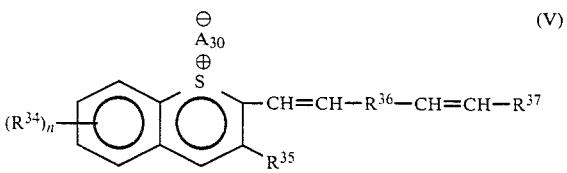

(V)

(wherein $R^{31}$ represents an alkyl group, a phenyl group or a substituted or unsubstituted styryl group; $R^{32}$ and $R^{36}$ represent a substituted or unsubstituted arylene group and form a conjugated double bond system together with the two —CH=CH— groups adjacent thereto; $R^{33}$ and $R^{37}$ represent phenyl group or a substituted or unsubstituted naphthyl group; $R^{34}$ represent an alkoxy group; $R^{35}$ represents an alkyl group; and $A_{30}$ represents an anion radical).

25. An optical recording-reproducing method according to claim 20, wherein croconic methine dyes of said group B have the structure represented by the formula (VI) shown below:

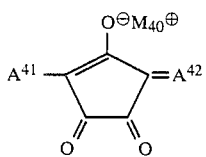

(VI)

(wherein $M_{40}\oplus$ represents a metal ion, $A^{41}$ and $A^{42}$ each represent substituents containing an aromatic ring or a heterocyclic ring).

26. An optical recording-reproducing method according to claim 20, wherein polymethine compounds of said group (B) are represented by the formula (VII) or (VIII) shown below:

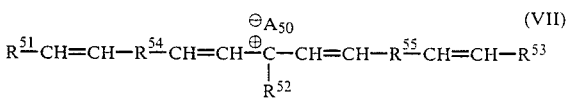

(VII)

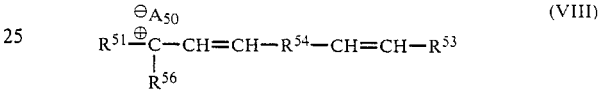

(VIII)

(wherein $R^{51}$, $R^{52}$ and $R^{53}$ each independently represent a substituted or unsubstituted aryl group; $R^{54}$ and $R^{55}$ represent a substituted or unsubstituted arylene group and form a conjugated double bond system together with the two —CH=CH— groups adjacent thereto; $R^{56}$ represents hydrogen or a substituted or unsubstituted aryl group; and $A_{50}$ represents anion radical).

27. An optical recording-reproducing method according to claim 22, wherein an IR-ray of 800–900 nm is used as said IR-ray.

28. An optical recording-reproducing method according to claim 22, wherein the reading light is a visible light of 500–750 nm.

29. An optical recording-reproducing method according to claim 20, wherein the recording layer has been produced using a Langmuir-Blodgett technique.

30. An optical recording-reproducing method according to claim 29, wherein said recording layer is a mixed monomolecular film or a built-up mixed monomolecular film of said polydiacetylene derivative compound and the compound selected from the group B.

31. An optical recording-reproducing method according to claim 30, wherein said mixed monomolecular film or built-up mixed monomolecular film has a film thickness of about 500 Å to 2 μm.

32. An optical recording-reproducing method according to claim 30, wherein the weight ratio of the polydiacetylene derivative compound to the compound of said group B in the recording layer of said mixed monomolecular film or built-up mixed monomolecular film is about 1/15 to 15/1.

33. An optical recording-reproducing method according to claim 20, wherein the recording layer comprises two layers of a layer comprising a monomolecular film of said polydiacetylene derivative compound or a built-up film thereof and a layer containing at least one compound selected from the group B.

34. An optical recording-reproducing method according to claim 33, wherein of the recording medium comprising said two layers, the monomolecular film of the polydiacetylene derivative compound or the built-up film has a film thickness of up to about 400 built-up layers, and the layer having the compound selected from the group B has a film thickness of up to about 200 built-up layers.

35. An optical recording-reproducing method according to claim 20, wherein the recording layer comprises one or more layer comprising a monomolecular film of said polydiacetylene derivative compound or a built-up film thereof and one or more layer comprising a monomolecular film containing a compound selected from the group B or a built-up films thereof laminated on one another.

36. An optical recording-reproducing method according to claim 35, wherein the total of the film thickness of the polydiacetylene derivatives compound layer and the film thickness of the layer of the compound selected from the group B of said laminate is that of about 200 built-up layers.

37. An optical recording-reproducing method according to claim 20, wherein the compound selected from said group B is arranged between organic molecules to form a monomolecular film or a built-up monomolecular film.

38. An optical recording-reproducing method according to claim 20, wherein said reading light with a shorter wavelength than said radiation is a visible light.

* * * * *

UNITED STATES PATENT AND TRADEMARK OFFICE
CERTIFICATE OF CORRECTION

PATENT NO. : 4,910,107

DATED : March 20, 1990

INVENTOR(S) : HARUKI KAWADA, ET AL.

It is certified that error appears in the above-identified patent and that said Letters Patent is hereby corrected as shown below:

Title Page:
[30] Foreign Application Priority Data:

"Japan ...... 60-676" should read
--Japan ...... 61-676--.
"Japan ...... 60-677" should read
--Japan ...... 61-677--.

COLUMN 3:

Line 46, "btween" should read --between--.
Line 57, "biphenyly," should read --biphynyl--.

COLUMN 19:

Line 11, "halogen aotms" should read --halogen atoms--.

UNITED STATES PATENT AND TRADEMARK OFFICE
CERTIFICATE OF CORRECTION

PATENT NO. 4,910,107

DATED : March 20, 1990

INVENTOR(S) : HARUKI KAWADA, ET AL.

It is certified that error appears in the above-identified patent and that said Letters Patent is hereby corrected as shown below:

COLUMN 25
Formula 3-1-19,

"    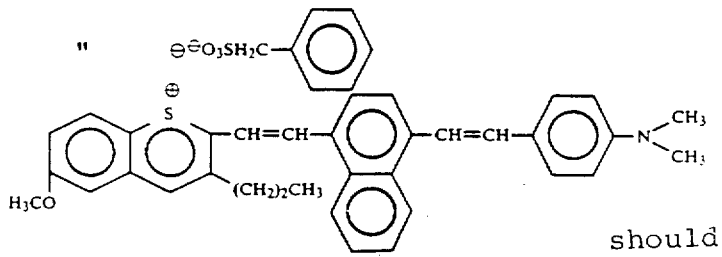    "

should read

-- 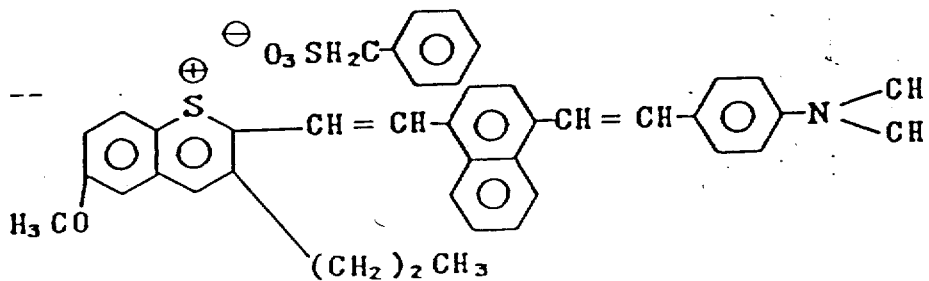 --

COLUMN 28
Line 51, "tyes," should read --dyes--.

UNITED STATES PATENT AND TRADEMARK OFFICE
CERTIFICATE OF CORRECTION

PATENT NO. : 4,910,107

DATED : March 20, 1990

INVENTOR(S) : HARUKI KAWADA, ET AL.

It is certified that error appears in the above-identified patent and that said Letters Patent is hereby corrected as shown below:

COLUMN 38
  Formula 4-1-40,

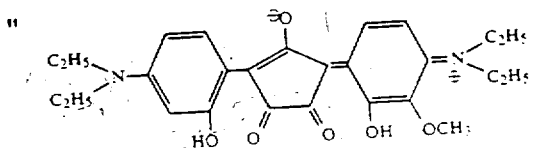

should read

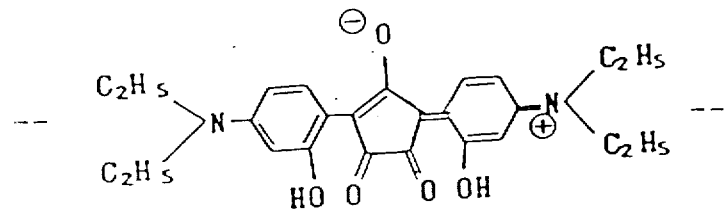

COLUMN 39
  Line 22, "amine," should read --amino--.

COLUMN 41

Formula 5-1-4,

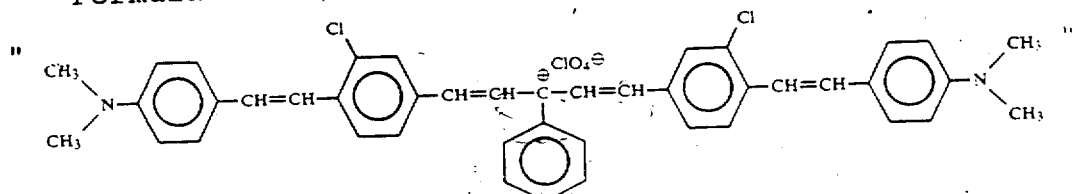

should read

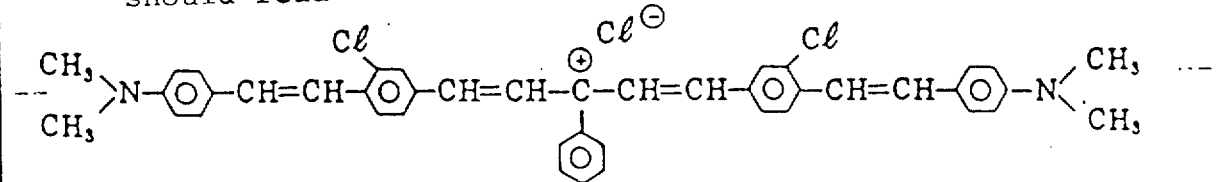

UNITED STATES PATENT AND TRADEMARK OFFICE
CERTIFICATE OF CORRECTION

PATENT NO. : 4,910,107

DATED : March 20, 1990

INVENTOR(S) : HARUKI KAWADA, ET AL.

It is certified that error appears in the above-identified patent and that said Letters Patent is hereby corrected as shown below:

COLUMN 52
    Line 51, "lest" should read --least--.

COLUMN 55
    Line 56, "mirror 5" should read --mirror 5,--.
    Line 63, "without" should read --with--.

COLUMN 64
    Line 51, "EXAMPLES 3-3" should read --EXAMPLE 3-3--.

COLUMN 76
    Line 6, "Imade" should read --Image--.

COLUMN 80:

Table 8-1, "comparative example 8-1" should read
    --Comparative example 8-1--.

COLUMN 83:

Line 21, EXAMPLE 9-5
    "$C_{H17}-C\equiv C-C\equiv C-C_2H_4-COOH$" should read --$C_2H_{17}-C\equiv C-C\equiv C-C_2H_4-COOH$--.

UNITED STATES PATENT AND TRADEMARK OFFICE
CERTIFICATE OF CORRECTION

PATENT NO. : 4,910,107
DATED : March 20, 1990
INVENTOR(S) : HARUKI KAWADA, ET AL.

It is certified that error appears in the above-identified patent and that said Letters Patent is hereby corrected as shown below:

<u>COLUMN 87</u>
    Line 61, "nium group" should read --nium group,--.

<u>COLUMN 88</u>
    Line 16, "bond." should read --bond).--.

<u>COLUMN 89</u>
    Line 29, "wherein" should read --(wherein--.
    Line 39, "reproducing-reproducing" should read --recording-reproducing--.

<u>COLUMN 90</u>
    Line 12, "layer" should read --layers--.
    Line 14, "layer" should read --layers--.
    Line 39, "irradiate" should read --irradiated--.
    Line 41, "recording" should read --reading the recorded--, and after "said" delete "reading the".
    Line 42, "recorded layer" should read --recording layer--.

<u>COLUMN 91</u>
    Line 33, "$R^{21}R^{22}$" should read --$R^{21}$, $R^{22}$--.
    Line 64, "represent" should read --represents--.

UNITED STATES PATENT AND TRADEMARK OFFICE
CERTIFICATE OF CORRECTION

PATENT NO. : 4,910,107

DATED : March 20, 1990

INVENTOR(S) : HARUKI KAWADA, ET AL.

It is certified that error appears in the above-identified patent and that said Letters Patent is hereby corrected as shown below:

COLUMN 93
Line 8, "layer" should read --layers--.
Line 10, "layer" should read --layers--.
Line 14, "films" should read --film--.

COLUMN 94
Line 3, "derivatives" should read --derivative--.

Signed and Sealed this

Fifth Day of January, 1993

Attest:

DOUGLAS B. COMER

*Attesting Officer*  *Acting Commissioner of Patents and Trademarks*